(12) United States Patent
Shabtay et al.

(10) Patent No.: US 11,310,405 B2
(45) Date of Patent: Apr. 19, 2022

(54) MULTI-APERTURE CAMERAS WITH AT LEAST ONE TWO STATE ZOOM CAMERA

(71) Applicant: Corephotonics Ltd., Tel-Aviv (IL)

(72) Inventors: Gal Shabtay, Tel Aviv (IL); Ephraim Goldenberg, Ashdod (IL); Emil Bronstein, Afula (IL); Itay Yedid, Karme Yosef (IL); Roy Rudnick, Tel Aviv (IL); Michael Dror, Nes Ziona (IL); Gil Bachar, Tel Aviv (IL); Yiftah Kowal, Rehovot (IL)

(73) Assignee: Corephotonics Ltd., Tel Aviv (IL)

( * ) Notice: Subject to any disclaimer, the term of this patent is extended or adjusted under 35 U.S.C. 154(b) by 0 days.

(21) Appl. No.: 17/293,914

(22) PCT Filed: Feb. 19, 2020

(86) PCT No.: PCT/IB2020/051405
§ 371 (c)(1),
(2) Date: May 14, 2021

(87) PCT Pub. No.: WO2020/174325
PCT Pub. Date: Sep. 3, 2020

(65) Prior Publication Data
US 2022/0046151 A1 Feb. 10, 2022

Related U.S. Application Data

(60) Provisional application No. 62/809,871, filed on Feb. 25, 2019.

(51) Int. Cl.
*G03B 17/17* (2021.01)
*H04N 5/225* (2006.01)
(Continued)

(52) U.S. Cl.
CPC ... *H04N 5/2254* (2013.01); *G02B 15/143103* (2019.08); *G03B 17/17* (2013.01);
(Continued)

(58) Field of Classification Search
CPC ....................................................... G03B 17/17
See application file for complete search history.

(56) References Cited

U.S. PATENT DOCUMENTS

| 2,106,752 A | 2/1938 | Land |
| 2,354,503 A | 7/1944 | Arthur |

(Continued)

FOREIGN PATENT DOCUMENTS

CN 103698876 A * 4/2014

OTHER PUBLICATIONS

International Search Report and Written Opinion in related PCT application PCT/IB2020/051405, dated Mar. 8, 2021.
(Continued)

*Primary Examiner* — Gary C Vieaux
(74) *Attorney, Agent, or Firm* — Nathan & Associates; Menachem Nathan

(57) ABSTRACT

Multi-cameras and in particular dual-cameras comprising a Wide camera comprising a Wide lens and a Wide image sensor, the Wide lens having a Wide effective focal length $EFL_W$ and a folded or non-folded Tele camera comprising a Tele lens with a first optical axis, a Tele image sensor and an OPFE, wherein the Tele lens includes, from an object side to an image side, a first lens element group G1, a second lens element group G2 and a third lens element group G3, wherein at least two of the lens element groups are movable relative to the image sensor along the first optical axis to bring the Tele lens to a Macro state or to two zoom states, wherein an effective focal length (EFL) of the Tele lens is changed from $EFL_{T,min}$ in one zoom state to $EFL_{T,max}$ in the
(Continued)

other zoom state, wherein $EFL_{Tmin} > 1.5 \times EFL_W$ and wherein $EFL_{Tmax} > 1.5 \times EFL_{Tmin}$. In the Macro state, the lens with $EFL_{T,min}$ allows for focusing on objects with short object-camera distances such as 5 cm. Actuators for enabling the movements are also disclosed.

18 Claims, 33 Drawing Sheets

(51) Int. Cl.
  G02B 15/14 (2006.01)
  H05K 1/18 (2006.01)
(52) U.S. Cl.
  CPC ........... *H04N 5/2253* (2013.01); *H05K 1/181* (2013.01); *H05K 2201/10227* (2013.01)

(56) References Cited

U.S. PATENT DOCUMENTS

| | | |
|---|---|---|
| 2,378,170 A | 6/1945 | Aklin |
| 2,441,093 A | 5/1948 | Aklin |
| 3,388,956 A | 6/1968 | Eggert et al. |
| 3,524,700 A | 8/1970 | Eggert et al. |
| 3,558,218 A | 1/1971 | Grey |
| 3,864,027 A | 2/1975 | Harada |
| 3,942,876 A | 3/1976 | Betensky |
| 4,134,645 A | 1/1979 | Sugiyama et al. |
| 4,338,001 A | 7/1982 | Matsui |
| 4,465,345 A | 8/1984 | Yazawa |
| 5,000,551 A | 3/1991 | Shibayama |
| 5,969,869 A | 10/1999 | Hirai et al. |
| 6,147,702 A | 11/2000 | Smith |
| 6,169,636 B1 | 1/2001 | Kreitzer |
| 6,654,180 B2 | 11/2003 | Ori |
| 7,187,504 B2 | 3/2007 | Horiuchi |
| 7,206,136 B2 | 4/2007 | Labaziewicz et al. |
| 7,515,351 B2 | 4/2009 | Chen et al. |
| 7,564,635 B1 | 7/2009 | Tang |
| 7,643,225 B1 | 1/2010 | Tsai |
| 7,660,049 B2 | 2/2010 | Tang |
| 7,684,128 B2 | 3/2010 | Tang |
| 7,688,523 B2 | 3/2010 | Sano |
| 7,692,877 B2 | 4/2010 | Tang et al. |
| 7,697,220 B2 | 4/2010 | Iyama |
| 7,738,186 B2 | 6/2010 | Chen et al. |
| 7,777,972 B1 | 8/2010 | Chen et al. |
| 7,813,057 B2 | 10/2010 | Lin |
| 7,821,724 B2 | 10/2010 | Tang et al. |
| 7,826,149 B2 | 11/2010 | Tang et al. |
| 7,826,151 B2 | 11/2010 | Tsai |
| 7,869,142 B2 | 1/2011 | Chen et al. |
| 7,898,747 B2 | 3/2011 | Tang |
| 7,916,401 B2 | 3/2011 | Chen et al. |
| 7,918,398 B2 | 4/2011 | Li et al. |
| 7,957,075 B2 | 6/2011 | Tang |
| 7,957,076 B2 | 6/2011 | Tang |
| 7,957,079 B2 | 6/2011 | Tang |
| 7,961,406 B2 | 6/2011 | Tang et al. |
| 8,000,031 B1 | 8/2011 | Tsai |
| 8,004,777 B2 | 8/2011 | Souma |
| 8,077,400 B2 | 12/2011 | Tang |
| 8,149,523 B2 | 4/2012 | Ozaki |
| 8,218,253 B2 | 7/2012 | Tang |
| 8,228,622 B2 | 7/2012 | Tang |
| 8,233,224 B2 | 7/2012 | Chen |
| 8,253,843 B2 | 8/2012 | Lin |
| 8,279,537 B2 | 10/2012 | Sato |
| 8,363,337 B2 | 1/2013 | Tang et al. |
| 8,395,851 B2 | 3/2013 | Tang et al. |
| 8,400,717 B2 | 3/2013 | Chen et al. |
| 8,451,549 B2 | 5/2013 | Yamanaka et al. |
| 8,503,107 B2 | 8/2013 | Chen et al. |
| 8,514,502 B2 | 8/2013 | Chen |
| 8,570,668 B2 | 10/2013 | Takakubo et al. |
| 8,718,458 B2 | 5/2014 | Okuda |
| 8,780,465 B2 | 7/2014 | Chae |
| 8,810,923 B2 | 8/2014 | Shinohara |
| 8,854,745 B1 | 10/2014 | Chen |
| 8,958,164 B2 | 2/2015 | Kwon et al. |
| 9,185,291 B1 | 11/2015 | Shabtay et al. |
| 9,229,194 B2 | 1/2016 | Yoneyama et al. |
| 9,235,036 B2 | 1/2016 | Kato et al. |
| 9,279,957 B2 | 3/2016 | Kanda et al. |
| 9,438,792 B2 | 9/2016 | Nakada et al. |
| 9,488,802 B2 | 11/2016 | Chen et al. |
| 9,568,712 B2 | 2/2017 | Dror et al. |
| 9,678,310 B2 | 6/2017 | Iwasaki et al. |
| 9,817,213 B2 | 11/2017 | Mercado |
| 2002/0118471 A1 | 8/2002 | Imoto |
| 2003/0048542 A1 | 3/2003 | Enomoto |
| 2005/0041300 A1 | 2/2005 | Oshima et al. |
| 2005/0062346 A1 | 3/2005 | Sasaki |
| 2005/0128604 A1 | 6/2005 | Kuba |
| 2005/0141103 A1 | 6/2005 | Nishina |
| 2005/0168840 A1 | 8/2005 | Kobayashi et al. |
| 2005/0270667 A1 | 12/2005 | Gurevich et al. |
| 2006/0275025 A1 | 12/2006 | Labaziewicz et al. |
| 2007/0229983 A1 | 10/2007 | Saori |
| 2007/0253689 A1 | 11/2007 | Nagai et al. |
| 2008/0056698 A1 | 3/2008 | Lee et al. |
| 2008/0304161 A1 | 12/2008 | Souma |
| 2009/0002839 A1 | 1/2009 | Sato |
| 2009/0122423 A1 | 5/2009 | Park et al. |
| 2009/0141365 A1 | 6/2009 | Jannard et al. |
| 2009/0225438 A1 | 9/2009 | Kubota |
| 2010/0060995 A1 | 3/2010 | Yumiki et al. |
| 2010/0165476 A1 | 7/2010 | Eguchi |
| 2010/0214664 A1 | 8/2010 | Chia |
| 2010/0277813 A1 | 11/2010 | Ito |
| 2011/0001838 A1 | 1/2011 | Lee |
| 2011/0115965 A1 | 5/2011 | Engelhardt et al. |
| 2011/0149119 A1 | 6/2011 | Matsui |
| 2011/0157430 A1 | 6/2011 | Hosoya et al. |
| 2011/0188121 A1 | 8/2011 | Goring et al. |
| 2012/0069455 A1 | 3/2012 | Lin et al. |
| 2012/0092777 A1 | 4/2012 | Tochigi et al. |
| 2012/0105708 A1 | 5/2012 | Hagiwara |
| 2012/0154929 A1 | 6/2012 | Tsai et al. |
| 2012/0229920 A1 | 9/2012 | Otsu et al. |
| 2012/0262806 A1 | 10/2012 | Lin et al. |
| 2013/0057971 A1 | 3/2013 | Zhao et al. |
| 2013/0088788 A1 | 4/2013 | You |
| 2013/0208178 A1 | 8/2013 | Park |
| 2013/0279032 A1 | 10/2013 | Suigetsu et al. |
| 2013/0286488 A1 | 10/2013 | Chae |
| 2014/0022436 A1 | 1/2014 | Kim et al. |
| 2014/0146216 A1 | 5/2014 | Okumura |
| 2014/0204480 A1 | 7/2014 | Jo et al. |
| 2014/0285907 A1 | 9/2014 | Tang et al. |
| 2014/0293453 A1 | 10/2014 | Ogino et al. |
| 2014/0362274 A1 | 12/2014 | Christie et al. |
| 2015/0116569 A1 | 4/2015 | Mercado |
| 2015/0253543 A1 | 9/2015 | Mercado |
| 2015/0253647 A1 | 9/2015 | Mercado |
| 2015/0373252 A1 | 12/2015 | Georgiev |
| 2015/0373263 A1 | 12/2015 | Georgiev et al. |
| 2016/0044250 A1 | 2/2016 | Shabtay et al. |
| 2016/0062084 A1 | 3/2016 | Chen et al. |
| 2016/0062136 A1 | 3/2016 | Nomura et al. |
| 2016/0070088 A1 | 3/2016 | Koguchi |
| 2016/0085089 A1 | 3/2016 | Mercado |
| 2016/0187631 A1 | 6/2016 | Choi et al. |
| 2016/0291295 A1 | 10/2016 | Shabtay et al. |
| 2016/0306161 A1 | 10/2016 | Harada et al. |
| 2016/0313537 A1 | 10/2016 | Mercado |
| 2016/0341931 A1 | 11/2016 | Liu et al. |
| 2016/0353008 A1 | 12/2016 | Osborne |
| 2017/0102522 A1 | 4/2017 | Jo |
| 2017/0115471 A1 | 4/2017 | Shinohara |
| 2017/0160511 A1 | 6/2017 | Kim et al. |
| 2018/0059365 A1 | 3/2018 | Bone et al. |
| 2018/0120674 A1 | 5/2018 | Avivi et al. |

(56) References Cited

U.S. PATENT DOCUMENTS

| | | |
|---|---|---|
| 2018/0217475 A1 | 8/2018 | Goldenberg et al. |
| 2018/0224630 A1 | 8/2018 | Lee et al. |
| 2019/0170965 A1 | 6/2019 | Shabtay |
| 2021/0271050 A1* | 9/2021 | Bodendorfer ............ G02B 7/08 |

OTHER PUBLICATIONS

A compact and cost effective design for cell phone zoom lens, Chang et al., Sep. 2007, 8 pages.
Consumer Electronic Optics: How small a lens can be? The case of panomorph lenses, Thibault et al., Sep. 2014, 7 pages.
Optical design of camera optics for mobile phones, Steinich et al., 2012, pp. 51-58 (8 pages).
The Optics of Miniature Digital Camera Modules, Bareau et al., 2006, 11 pages.
Modeling and measuring liquid crystal tunable lenses, Peter P. Clark, 2014, 7 pages.
Mobile Platform Optical Design, Peter P. Clark, 2014, 7 pages.
Boye et al., "Ultrathin Optics for Low-Profile Innocuous Imager", Sandia Report, 2009, pp. 56-56.
"Cheat sheet: how to understand f-stops", Internet article, Digital Camera World, 2017.
Office Action in related CN patent application 202080001266.1, dated May 26, 2021.
Office Action in related TW patent application 109105769, dated Jun. 30, 2021.

* cited by examiner

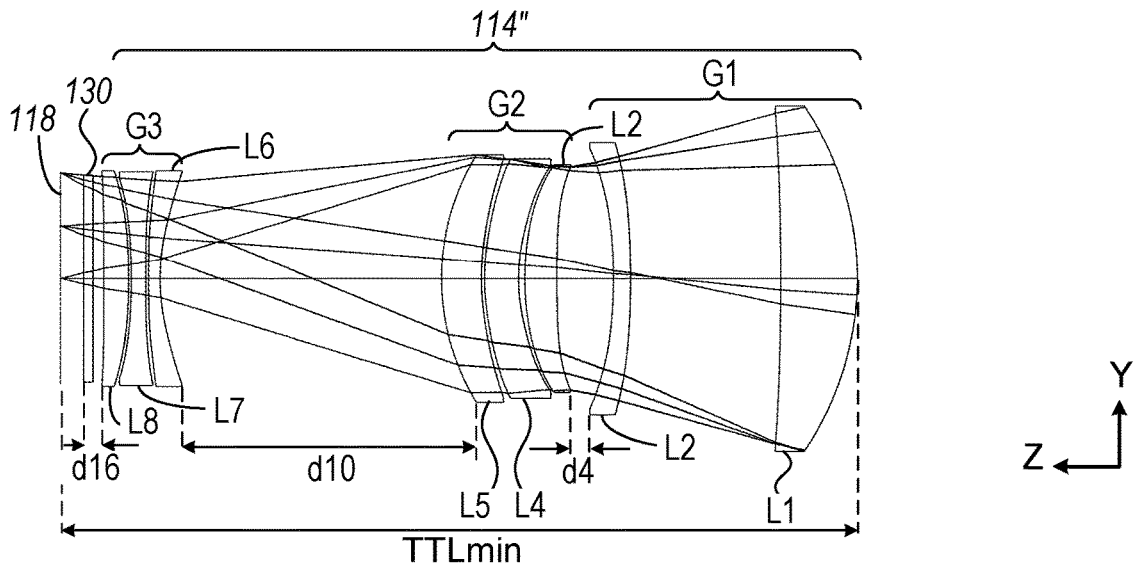
FIG. 3A
FIG. 3B
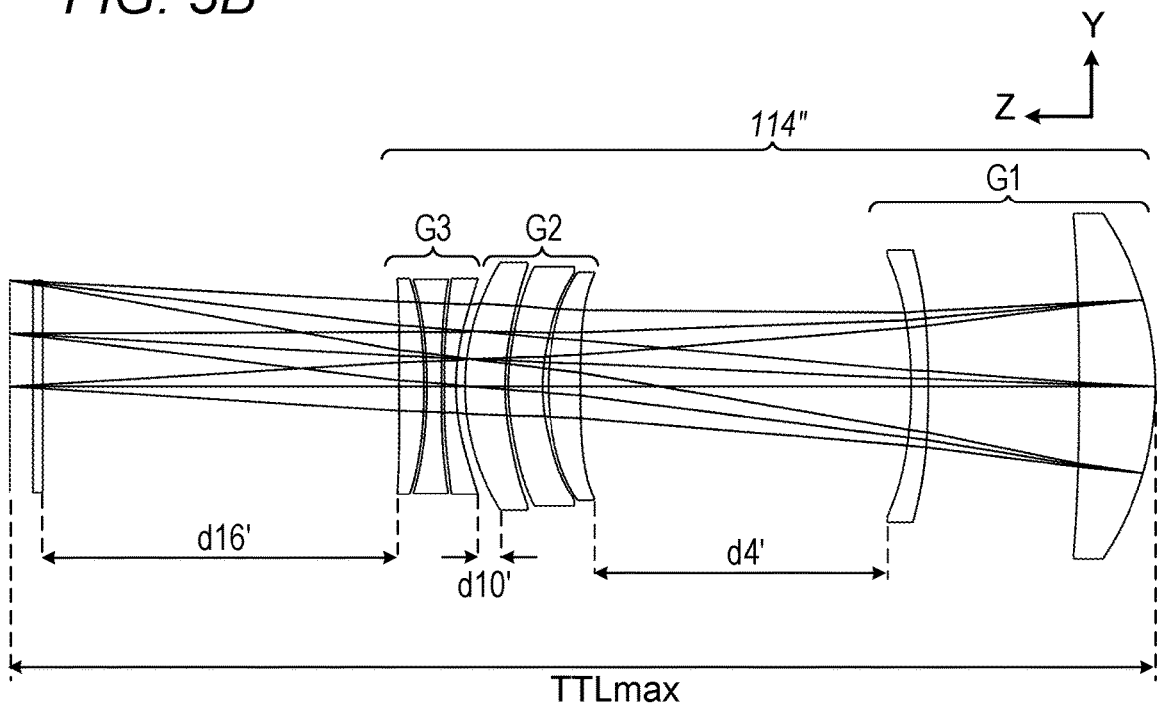

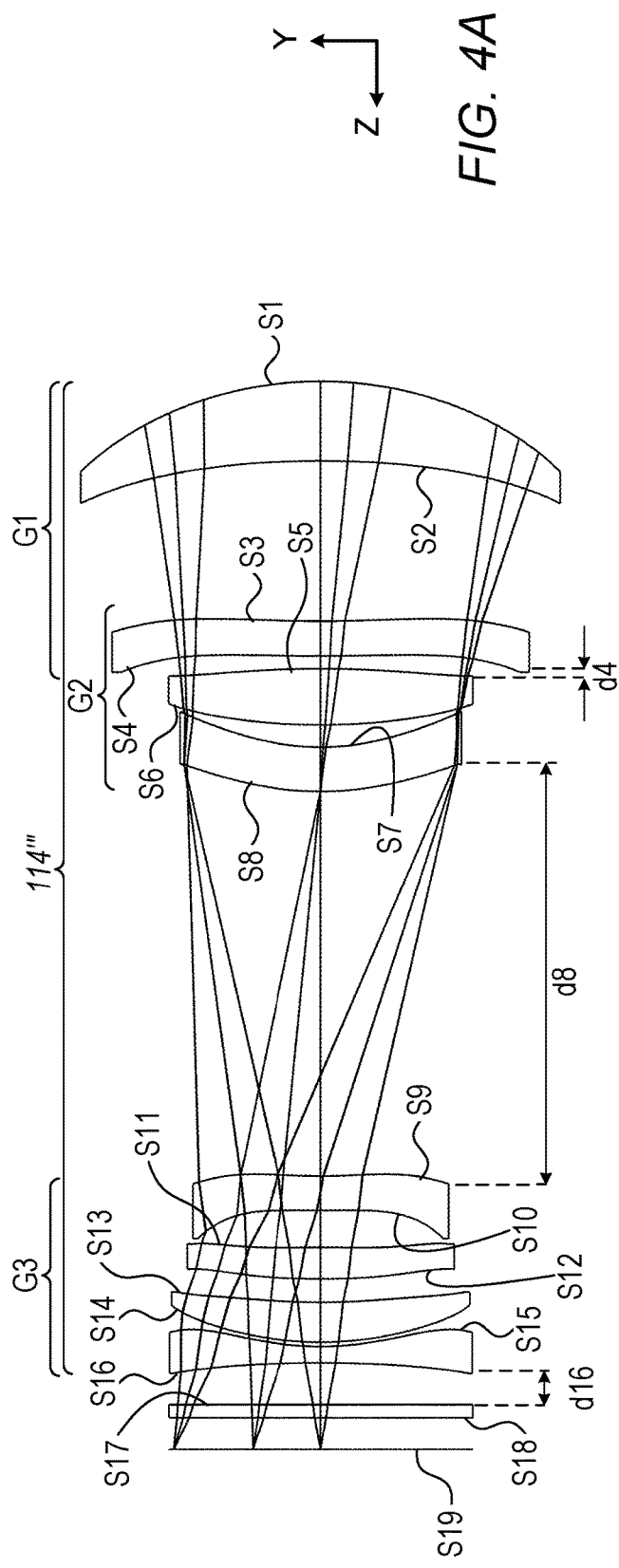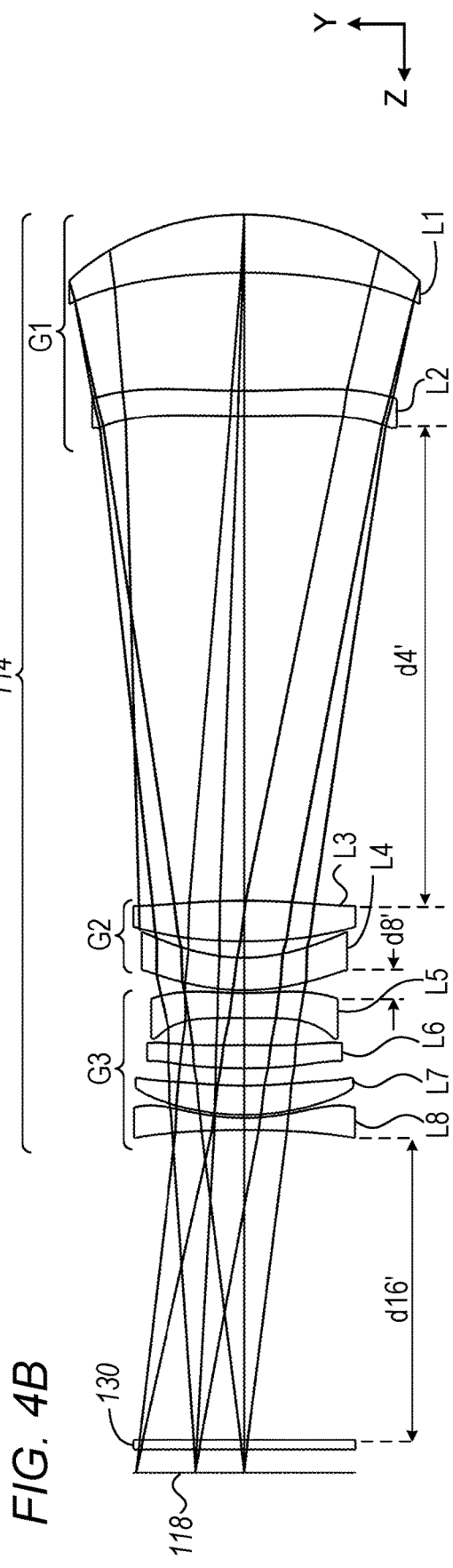

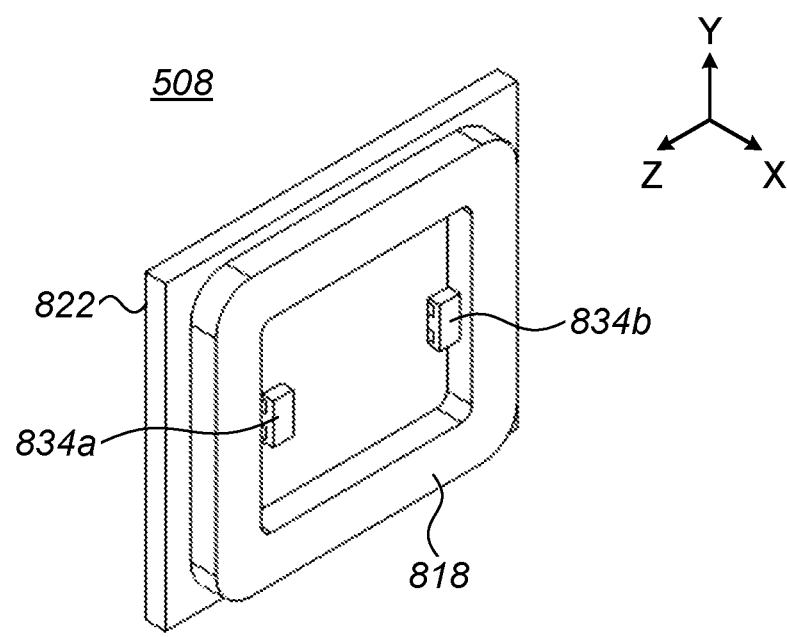
FIG. 8
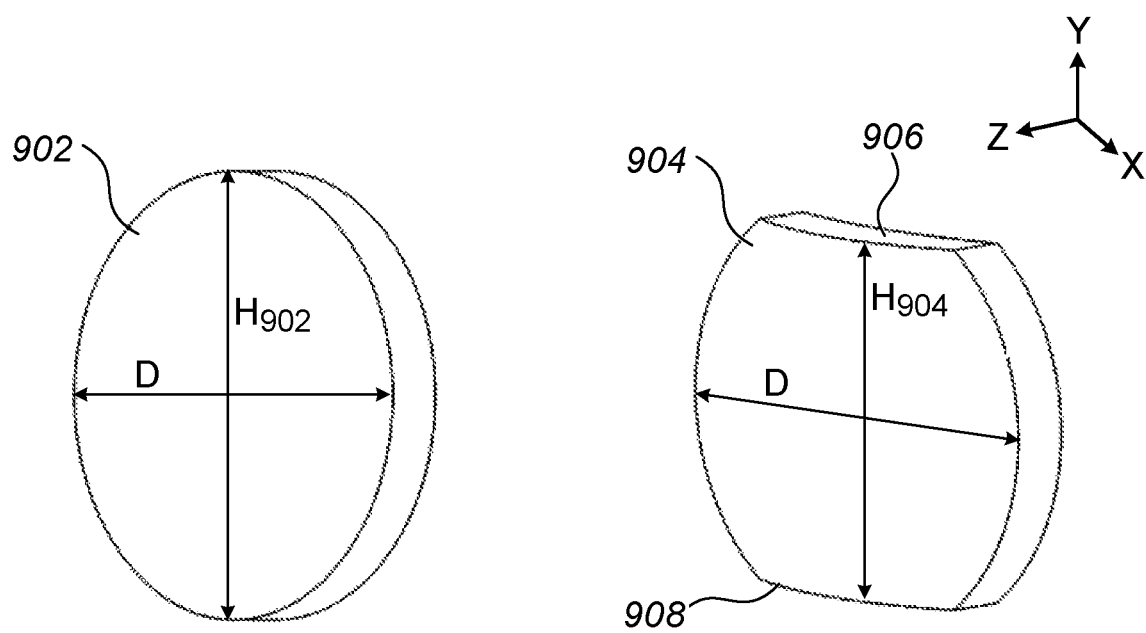
FIG. 9A
FIG. 9B

MULTI-APERTURE CAMERAS WITH AT LEAST ONE TWO STATE ZOOM CAMERA

CROSS REFERENCE TO RELATED APPLICATIONS

This is a 371 application from international patent application PCT/IB2020/051405 filed Feb. 19, 2020, and claims priority from U.S. Provisional Patent Application No. 62/809,871 filed Feb. 25, 2019, which is expressly incorporated herein by reference in its entirety.

FIELD

Embodiments disclosed herein relate in general to digital cameras, and more particularly, to dual-aperture zoom digital cameras with a folded zoom lens.

BACKGROUND

Compact multi-aperture and in particular dual-aperture (also referred to as "dual-lens" or "dual-camera") digital cameras are known. Miniaturization technologies allow incorporation of such cameras in compact portable electronic devices such as tablets and mobile phones (the latter referred to hereinafter generically as "smartphones"), where they provide advanced imaging capabilities such as zoom, see e.g. co-owned PCT patent applications No. PCT/IB2015/056004, which is incorporated herein by reference in its entirety. Such cameras and/or cameras disclosed herein are cameras with strict height limitation, normally of less than 1 cm, the thinner the better.

Dual-aperture zoom cameras in which one camera has a wide field of view FOV ("Wide camera") and the other has a narrow FOV ("Tele camera") are known. A Tele camera is required to have dimensions as small as possible in order to fit the thickness of the device in which the camera is installed (preferably without protruding from the device's casing), while being suitable to operate with commonly used image sensors. This problem is even more crucial when using a Tele lens with a long ("Tele") effective focal length (EFL) to obtain a relatively high zooming effect. As known, the term "EFL" as applied to a lens refers to the distance from a rear principal plane to a paraxial focal plane. The rear principal plane is calculated by tracing an on-axis parabasal ray from infinity and determined using the para-basal's image space marginal ray angle.

Dual-aperture zoom cameras comprising an upright Wide camera and a folded Tele camera are disclosed for example in co-owned U.S. Pat. No. 9,392,188. The Wide camera is an "upright" camera comprising a Wide image sensor and a Wide lens module that includes a Wide fixed focus lens assembly (or simply "lens") with a Wide lens symmetry axis. The folded Tele camera comprises a Tele image sensor and a Tele lens module that includes a Tele fixed focus lens with a Tele lens symmetry axis. The dual-aperture zoom camera further comprises a reflecting element (also referred to as optical path folding element or OPFE) that folds light arriving from an object or scene along a first optical path to a second optical path toward the Tele image sensor. The first and second optical paths are perpendicular to each other. The Wide lens symmetry axis is along (parallel to) the first optical path and the Tele lens symmetry axis is along the second optical path. The reflecting element has a reflecting element symmetry axis inclined substantially at 45 degrees to both the Wide lens symmetry axis and the Tele lens symmetry axis and is operative to provide a folded optical path between the object and the Tele image sensor.

The Wide lens has a Wide field of view ($FOV_W$) and the Tele lens has a Tele field of view ($FOV_T$) narrower than $FOV_W$. In an example, the Tele camera provides an ×5 zooming effect, compared to the Wide camera.

Compact folded cameras with lens assemblies that include a plurality of lens elements divided into two or more groups, with one or more ("group") of lens elements movable relative to another lens element or group of lens elements, are also known. Actuators (motors) used for the relative motion include step motors with screws or piezoelectric actuators. However, a general problem with such cameras is that their structure dictates a rather large F number (F #) of 3 and more, with F # increasing with the zoom factor. Their actuators are slow and noisy (piezoelectric) or bulky (stepper motors), have reliability problems and are expensive. Known optical designs also require a large lens assembly height for a given F # for the two extreme zoom states obtained in such cameras.

A "Macro-photography" mode is becoming a popular differentiator for smartphone cameras. "Macro-photography" refers to photographing objects that are very close to the camera, so that an image recorded on the image sensor is nearly as large as the actual object photographed. For example, "Macro photography" may refer to photography of very small subjects and living organisms like insects, in which the size of the subject in the photograph is greater than life size. Macro photography yields a "Macro image".

First smartphone models that provide Macro-photography capabilities by including a dedicated Macro camera with a Macro FOV have entered the consumer market. However, it would be beneficial to provide Macro-photography capabilities using types of camera already existing in many smartphones, without the need of additional dedicated hardware.

SUMMARY

In exemplary embodiments, there are provided folded cameras comprising: a lens that includes a lens element group G1, a lens element group G2 and a lens element group G3 along a lens optical axis, an image sensor, an OPFE, and an actuator for moving G1 and G3 together relative to the image sensor in a direction parallel to the lens optical axis to bring the lens to two zoom states, wherein G1 and G3 are fixedly attached to each other, wherein G2 is floating between two stops, and wherein the movement of G1 and G3 together enables attachment of G2 to G1 in one zoom state and to G3 in another zoom state.

In some embodiments, the fixed attachment between G1 and G3 is enabled by a plurality of rods connecting G1 and G3, and wherein G2 is guided by the plurality of rods and able to move along the direction parallel to the lens axis relative to the plurality of rods. The attachment of G2 to G1 or G3 may be by magnetic force.

In some embodiments, the movement of G1 and G3 together is over a stroke larger than 2 mm and smaller than 20 mm, and wherein a stroke of the movement of G2 between the two stops is smaller than half of the stroke of G1 and G3.

In some embodiments, the lens has an effective focal length EFL, wherein EFL is changed from a minimal value $EFL_{,min}$ in the first zoom state to a maximal value $EFL_{,max}$ in the second zoom state and wherein a ratio $EFL_{,max}/EFL_{,min}$ is >1.5.

In some embodiments, the actuator includes a shape memory alloy (SMA) actuator having a plurality of SMA springs and a plurality of mechanical springs.

In some embodiments, the plurality of SMA springs includes four springs and wherein the plurality of mechanical springs includes two springs.

In some embodiments, the camera further comprises a voice coil motor (VCM) mechanism for focusing the lens. In some embodiments, the focusing of the lens is performed by moving G1+G2+G3 together. In some embodiments, the lens is included in a lens and sensor module that also includes a G2 stop mechanism with a first G2 stop and a second G2 stop, and wherein one of the first or second G2 stops is removable to allow movement of G1+G2+G3 to be over a large stroke of not less than 2 mm for Macro-photography.

In some embodiments, the actuator includes at least three coils coupled to a plurality of respective magnets and or to magnet polarizations. In some embodiments, a position of the at least three coils relative to the magnets is measured by at least one Hall bar sensor for position sensing. In some embodiments, the at least three coils are driven by respective driving currents to provide movement relative to the magnets and wherein the driving currents depend on the position of the coils relative to the magnets.

In exemplary embodiments, there are provided folded cameras comprising: a lens that includes a lens element group G1, a lens element group G2 and a lens element group G3 along a lens optical axis, an image sensor, an OPFE, and a VCM mechanism for focusing the lens by moving G1+G2+G3 together in a direction parallel to the lens optical axis, and for moving G1 and G3 together relative to the image sensor for zoom in the direction parallel to the lens optical axis to bring the lens to two zoom states, wherein G1 and G3 are fixedly attached to each other, wherein G2 is floating between two stops, and wherein the movement of G1 and G3 together enables attachment of G2 to G1 in one zoom state and to G3 in another zoom state.

In some embodiments, a folded camera further includes a first G2 stop and a second G2 stop, wherein one of the first or second G2 stops is removable to allow movement of G1+G2+G3 to be over a large stroke of not less than 2 mm for Macro-photography.

In exemplary embodiments, there are provided dual-cameras comprising: a Wide camera comprising a Wide lens and a Wide image sensor, the Wide lens having a Wide effective focal length $EFL_W$; and a folded Tele camera comprising a Tele lens with a first optical axis, a Tele image sensor and an OPFE, wherein the Tele lens includes, from an object side to an image side, a first lens element group G1, a second lens element group G2 and a third lens element group G3, wherein at least two of the lens element groups are movable relative to the image sensor along the first optical axis to bring the Tele lens to two zoom states, wherein an effective focal length of the Tele lens is changed from $EFL_{T,min}$ in one zoom state to $EFL_{T,max}$ in the other zoom state, wherein $EFL_{Tmin} > 1.5 \times EFL_W$ and wherein $EFL_{Tmax} > 1.5 \times EFL_{Tmin}$. The Wide lens has a second optical axis, the second optical axis being perpendicular to the first optical axis.

In some embodiments (not shown), the folded Tele camera above may be replaced by a non-folded (upright) Tele camera having the same structure and properties, i.e. comprising a Tele lens that includes, from an object side to an image side, a first lens element group G1, a second lens element group G2 and a third lens element group G3, wherein at least two of the lens element groups are movable relative to the image sensor along the first optical axis to bring the Tele lens to two zoom states, wherein an effective focal length of the Tele lens is changed from $EFL_{T,min}$ in one zoom state to $EFL_{T,max}$ in the other zoom state, wherein $EFL_{Tmin} > 1.5 \times EFL_W$ and wherein $EFL_{Tmax} > 1.5 \times EFL_{Tmin}$.

In some exemplary embodiments, the Tele camera is configured to focus by lens element groups G1, G2 and G3 being shifted relative to each other, in both the first and the second zoom states.

In some exemplary embodiments, lens elements groups G1, G2 and G3 are arranged from an object side to the image side, wherein G1 has a positive refractive power, G2 has a positive refractive power and G3 has a negative refractive power.

In some exemplary embodiments, the at least two movable lens element groups include lens element groups G1 and G3, wherein G1 and G3 are movable relative to the image sensor and to G2, and wherein G2 is stationary relative to the image sensor. In some embodiments, G3 may further be movable for focus relative to the image sensor, G1 and G2. In some embodiments, G1 may further be movable for focus relative to the image sensor, G2 and G3.

In an exemplary embodiment, a first lens element L1 toward the object side has a clear aperture (CA) value (or simply "clear aperture") larger than clear apertures of all other lens elements in the Tele lens.

In an exemplary embodiment, the Tele lens has a total track length ($TTL_T$) and a maximum TTL ($TTL_{Tmax}$) fulfills the condition $TTL_{Tmax} < EFL_{Tmax}$.

In an exemplary embodiment, the Tele lens has a total track length ($TTL_T$) and a maximum TTL ($TTL_{Tmax}$) fulfills the condition $TTL_{Tmax} < 0.9 \times EFL_{Tmax}$.

In an exemplary embodiment, the Tele lens has a Tele lens f-number ($F\#_T$) and a minimal value of $F\#_T$ ($F\#T_{mm}$) fulfills the condition $F\#_{Tmin} < 1.5 \times F\#Tmax \times EFL_{Tmin}/EFL_{Tmax}$.

In an exemplary embodiment, the Tele lens has a Tele lens f-number ($F\#_T$) and a minimal value of $F\#T$ ($F\#_{Tmin}$) and a maximal value of $F\#T$ ($F\#Tmax$) fulfill the condition $F\#_{Tmin} < 1.8 \times F\#_{Tmax} \times EFL_{Tmin}/EFL_{Tmax}$.

In an exemplary embodiment, the Tele lens has a Tele lens f-number ($F\#_T$) and a minimal value of $F\#_T$ ($F\#_{Tmin}$) and a maximal value of $F\#_T$ ($F\#_{Tmax}$) fulfill the condition $F\#_{Tmin} < 1.2 \times F\#_{Tmax} \times EFL_{Tmin}/EFL_{Tmax}$.

In an exemplary embodiment, for any lens element group, the movement from the first zoom state to the second zoom state has a stroke smaller than $0.75 \times (EFL_{Tmax} - EFL_{Tmin})$.

In an exemplary embodiment, for any lens element group, the movement from the first zoom state to the second zoom state has a stroke smaller than $0.6 \times (EFL_{Tmax} - EFL_{Tmin})$. In an exemplary embodiment, first lens element L1 is a cut lens element.

In some exemplary embodiments, the at least two movable lens element groups include lens element groups G1, G2 and G3, wherein G1 and G3 are movable as one unit relative to the image sensor and to G2 in a given range $R_{1,3}$ and wherein G2 is movable relative to the image sensor in a range $R_2$ smaller than $R_{1,3}$. In an exemplary embodiment, G1, G2 and G3 are movable toward the image side. In some exemplary embodiments, G1, G2 and G3 are movable for focusing relative to the image sensor as one unit.

In some exemplary embodiments, $EFL_{Tmin} = 15$ mm and $EFL_{Tmax} = 30$ mm.

In some exemplary embodiments, $EFL_{Tmin} = 13$ mm and $EFL_{Tmax} = 26$ mm.

In some exemplary embodiments, at the two zoom states, wherein $R_{AF}$ is a maximal range of movement of G2 required for focus between infinity and 1 meter, $R_{AF} < 0.4 \times$ $R_2$. In some exemplary embodiments, at the two zoom states, wherein $R_{AF}$ is a maximal range of movement of G1 and G3 required for focus between infinity and 2 meter, $R_{AF}<0.4\times R_{1,3}$.

In some exemplary embodiments, actuation for the movement of G2 is performed in close loop control.

In some exemplary embodiments, actuation for the movement of G1 and G3 is performed in open loop control.

In some exemplary embodiments, the movement of G1, G2 and G3 is created using voice coil motor (VCM) mechanisms.

In some exemplary embodiments, the movement of G1, G2 and G3 is guided along the first optical axis by a ball guided mechanism that creates a linear rail. In some exemplary embodiments, the ball guided mechanism includes at least one groove on a G2 lens carrier, at least one groove on a G1+G3 lens carrier, and a plurality of balls between the grooves on the G2 lens carrier and the G1+G3 lens carrier.

In an exemplary embodiment, there is provided a dual-camera comprising: a Wide camera comprising a Wide lens and a Wide image sensor, the Wide lens having a Wide effective focal length $EFL_W$; and a folded Tele camera comprising a Tele lens with a first optical axis, a Tele image sensor and an OPFE, wherein the Tele lens includes, from an object side to an image side, a first lens element group G1, a second lens element group G2 and a third lens element group G3, wherein G1 and G3 are movable along the first optical axis as one unit relative to the image sensor and G2 in a given range $R_{1,3}$, wherein G2 is movable along the first optical axis relative to the image sensor in a range $R_2$ smaller than $R_{1,3}$, wherein the combined movements of G1, G2 and G3 bring the Tele lens to two zoom states, wherein an EFL of the Tele lens is changed from $EFL_{T,min}$ in one zoom state to $EFL_{T,max}$ in the other zoom state and wherein $EFL_{Tmin}>EFL_W$ and wherein $EFL_{Tmax}>1.5\times EFL_{Tmin}$.

In an exemplary embodiment, there is provided a folded camera comprising: a lens with a first optical axis, an image sensor and an OPFE, wherein the lens includes, from an object side to an image side, a first lens element group G1, a second lens element group G2 and a third lens element group G3, wherein G1 and G3 are movable along the first optical axis as one unit relative to the image sensor and G2 in a given range $R_{1,3}$, wherein G2 is movable along the first optical axis relative to the image sensor in a range $R_2$ smaller than $R_{1,3}$, wherein the combined movements of G1, G2 and G3 bring the Tele lens to two zoom states, wherein an EFL of the Tele lens is changed from $EFL_{min}$ in one zoom state to $EFL_{Tmax}$ in the other zoom state and wherein $EFL_{max}>1.5\times EFL_{min}$.

In an exemplary embodiment, there is provided a triple-camera, comprising: a Wide camera comprising a Wide lens and a Wide image sensor, the Wide lens having a Wide effective focal length $EFL_W$, an Ultra-Wide camera comprising an Ultra-Wide lens and an Ultra-Wide image sensor, the Ultra-Wide lens having an Ultra-Wide effective focal length $EFL_{UW}$, and a folded Tele camera comprising a Tele lens with a first optical axis, a Tele image sensor and an OPFE, wherein the Tele lens includes, from an object side to an image side, a first lens element group G1, a second lens element group G2 and a third lens element group G3, wherein at least two of the lens element groups are movable relative to the image sensor along the first optical axis to bring the Tele lens to two, first and second zoom states, wherein an EFL of the Tele lens is changed from $EFL_{T,min}$ in the first zoom state to $EFL_{T,max}$ in the second zoom state, wherein $EFL_{Tmin}>2\times EFL_{UW}$, wherein $EFL_{Tmin}>1.5\times EFL_W$ and wherein $EFL_{Tmax}>1.5\times EFL_{Tmin}$.

In an exemplary embodiment, there is provided a dual-camera comprising: a Wide camera module (or simply "Wide camera"), and a Tele camera module (or simply "Tele camera") comprising a lens module, a lens actuator for moving the lens module between a first and a second zoom state, and a memory for storing first and a second calibration data, wherein the first calibration data may comprise calibration data between the Wide camera module and the Tele camera module in a first zoom state, and wherein the second calibration data may comprise calibration data between the Wide camera module and the Tele camera module in a second zoom state.

In various exemplary embodiments, there is provided a system comprising: an application processor (AP), a Wide camera module for providing first image data, a Tele camera module for providing second image data, the Tele camera module comprising a lens module, and a lens actuator for moving a lens module between a first and a second zoom state, and a memory for storing first and a second calibration data, wherein the first calibration data may comprise calibration data between the Wide camera module and the Tele camera module in a first zoom state, and wherein the second calibration data between the Wide camera module and the Tele camera module in a second zoom state, and wherein the AP is configured to generate third image data by processing a first and a second image data and by using the first calibration data when the Tele camera module is in the first zoom state and the second calibration data when the Tele camera module is in the second zoom state.

In an embodiment of the system, the first calibration data is stored in the first camera module, and wherein the second calibration data is stored in the second camera module.

In an embodiment of the system, the first calibration data and the second calibration data are stored only in the Tele camera module.

In an embodiment of the system, the first calibration data and the second calibration data are stored only in the Wide camera module.

In an embodiment of the system, the first calibration data and the second calibration data are stored in a memory not located in the Wide camera module or in the Tele camera module.

In an embodiment of the system, a first portion of the first calibration data and a first portion of the second calibration data are stored on a memory located in the Wide camera module or in the Tele camera module, and wherein a second portion of the first calibration data and a second portion of the second calibration data are stored in a memory not located in the Wide camera module or in the Tele camera module.

BRIEF DESCRIPTION OF THE DRAWINGS

Non-limiting examples of embodiments disclosed herein are described below with reference to figures attached hereto that are listed following this paragraph. Identical structures, elements or parts that appear in more than one figure are generally labeled with a same numeral in all the figures in which they appear. If identical elements are shown but numbered in only one figure, it is assumed that they have the same number in all figures in which they appear. The drawings and descriptions are meant to illuminate and clarify embodiments disclosed herein and should not be considered limiting in any way. In the drawings:

FIG. 3A shows details of the lens elements of a second optical design in a first zoom state;

FIG. 3B shows details of the lens elements of the second optical design in a second zoom state;

FIG. 4A shows details of the lens elements of a third optical design in a first zoom state;

FIG. 4B shows details of the lens elements of the third optical design in a second zoom state;

FIG. 8 shows an electronic assembly in the Tele lens and sensor module of FIGS. 5A-5E;

FIG. 9A shows a lens element having axial symmetry;

FIG. 9B shows a cut lens element with two cuts;

DETAILED DESCRIPTION

Figure 1A:
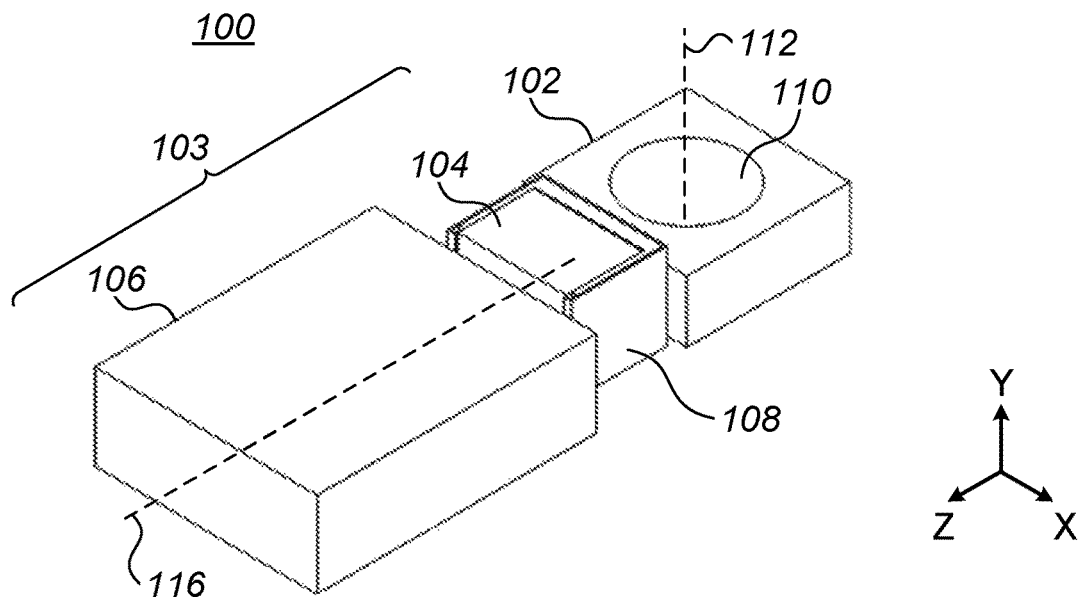
FIG. 1A shows schematically a general perspective view of a dual-camera, comprising an upright camera and a zoom folded camera.
Figure 1B:
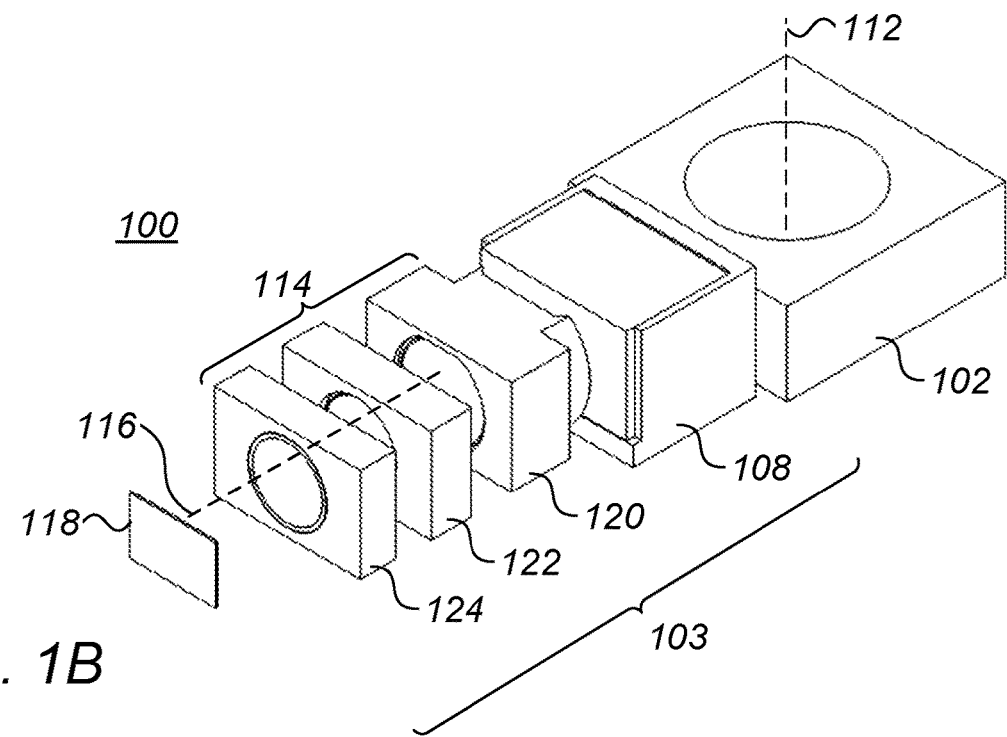
FIG. 1B shows the dual-camera of FIG. 1A in an exploded view.

FIG. 1A shows schematically a general perspective view of an embodiment of a dual-camera numbered 100, comprising an upright Wide camera 102, and a folded Tele camera 103 comprising an OPFE 104 (e.g. a prism), and a zoom folded Tele camera lens and sensor module (or simply "module") 106. Wide camera includes a Wide lens 110 with a fixed effective focal length $EFL_W$. For example, $EFL_W$ may be 2-5 mm. In Tele camera 103, OPFE 104 is held in a prism holder 108. Module 106 includes a shield 107. Shield 107 may cover some or all elements of module 106 or camera 103. FIG. 1B shows dual-camera 100 with shield 107 removed and with more details. Module 106 further includes a Tele lens 114 with a Tele lens optical axis 116, a Tele image sensor 118, and, optionally, a glass window 130 (see e.g. FIG. 2A). Glass window 130 may be used for filtering light at infra-red (IR) wavelengths, for mechanical protection of sensor 118 and/or for protection of sensor 118 from dust. For simplicity, the word "Tele" used with reference to the camera, lens or image sensor may be dropped henceforth. In some embodiments, the lens and image sensor modules are separated, such that the Tele image sensor has its own image sensor module, while other functionalities and parts described below (in particular the actuation of Tele lens and sensor module 500 of FIGS. 5A-E, actuator 1610 of FIGS. 16A-H and actuator 1710 of FIGS. 17A-J) remain in a Tele camera lens module only. The entire description below refers to such embodiments as well. In other embodiments, a system described herein may comprise one or mode additional cameras, forming e.g. a triple-camera system. Besides a Wide and a Tele camera, a triple-camera may include also an Ultra-Wide camera, wherein an Ultra-Wide camera EFL, $EFL_{UW} < 0.7 \times EFL_W$.

Dual-camera 100 further comprises, or is coupled to, a controller (not shown) that controls various camera functions, including the movement of lens groups and elements described below.

Lens 114 includes three groups of lens elements G1, G2 and G3, housed respectively in a first group (G1) lens housing (or "holder") 120, a second group (G2) lens housing 122 and a third group (G3) lens housing 124. Details of three different lens designs for lens element groups G1, G2 and G3 are provided below with reference to FIGS. 2-4. In various embodiments described in detail next, at least one lens element group moves relative to another lens element group along lens optical axis 116 to provide at least two Tele lens effective focal lengths $EFL_T$: a minimum $EFL_{Tmin}$ and a maximum $EFL_{Tmax}$. For example, $EFL_{Tmin}$ may be 10-20 mm and $EFL_{Tmax}$ may be 20-40 mm. This provides zoom capability between two large EFLs while keeping a small Tele lens f-number ($F\#_T$). In addition, $EFL_{Tmin}$ is larger than the $EFL_W$, for example by 2 times or more, such that optical zoom may be provided by dual-camera 100 between $EFL_W$ and $EFL_{Tmax}$. In addition for EFL, for each zoom state a Tele lens total track length ($TTL_T$) is defined as the distance along the optical axis from the first surface of the first lens element toward the object side ($S_1$, see below) to the image sensor surface, when the lens is focused at infinity, and including all lens elements and the glass window. $TTL_{Tmin}$ is defined for the first zoom state and $TTL_{Tmax}$ is defined for the second zoom state. $TTL_{Tmin}$ and $TTL_{Tmax}$ are marked for example in FIGS. 2C, 2D, 3A and 3B, but the definitions apply for all embodiments in this application.

Figure 2A:
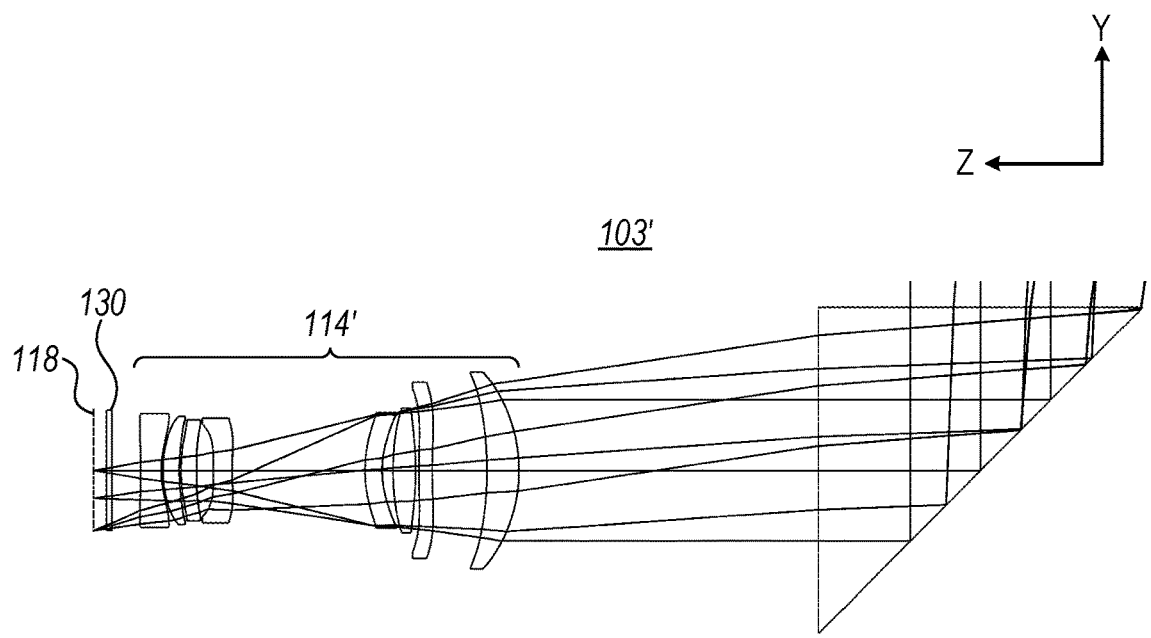
FIG. 2A shows a zoom folded camera as in FIGS. 1A and 1B with a first lens optical design in a first zoom state and with ray tracing.
Figure 2B:
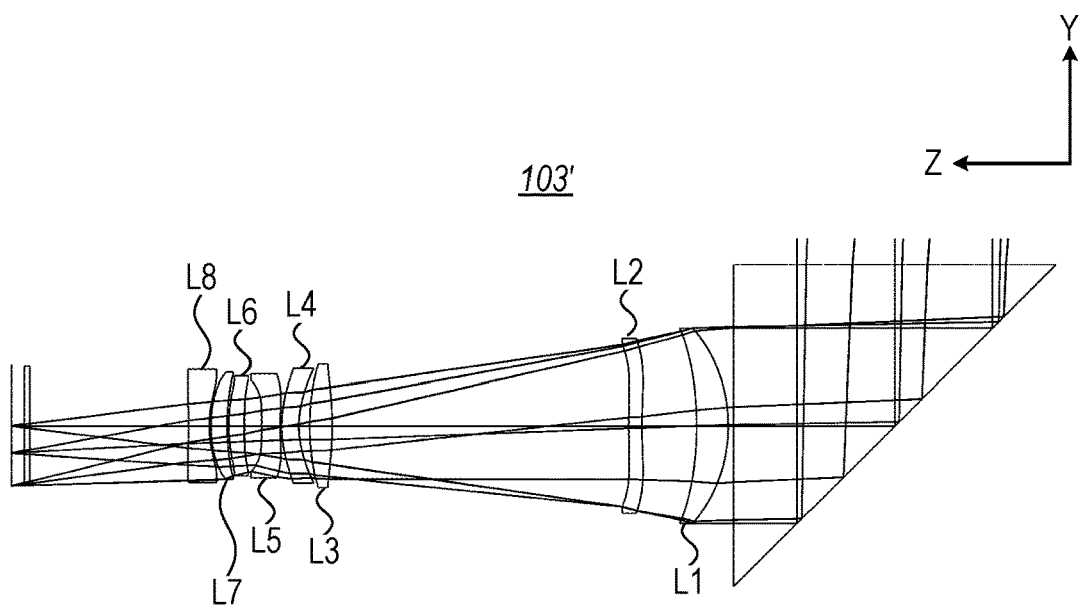
FIG. 2B shows a zoom folded camera as in FIGS. 1A and 1B with the first lens optical design in a second zoom state and with ray tracing.
Figure 2C:
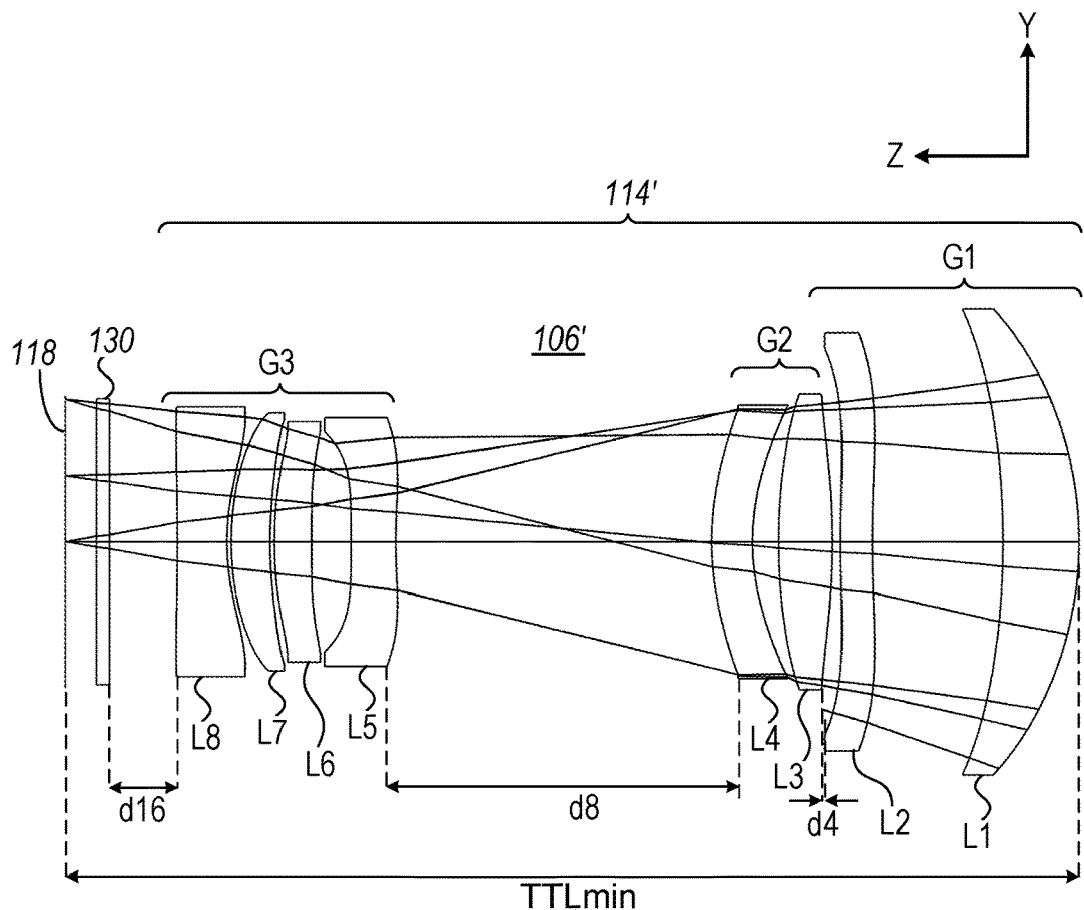
FIG. 2C shows details of the lens elements of the first optical design in the first zoom state.
Figure 2D:
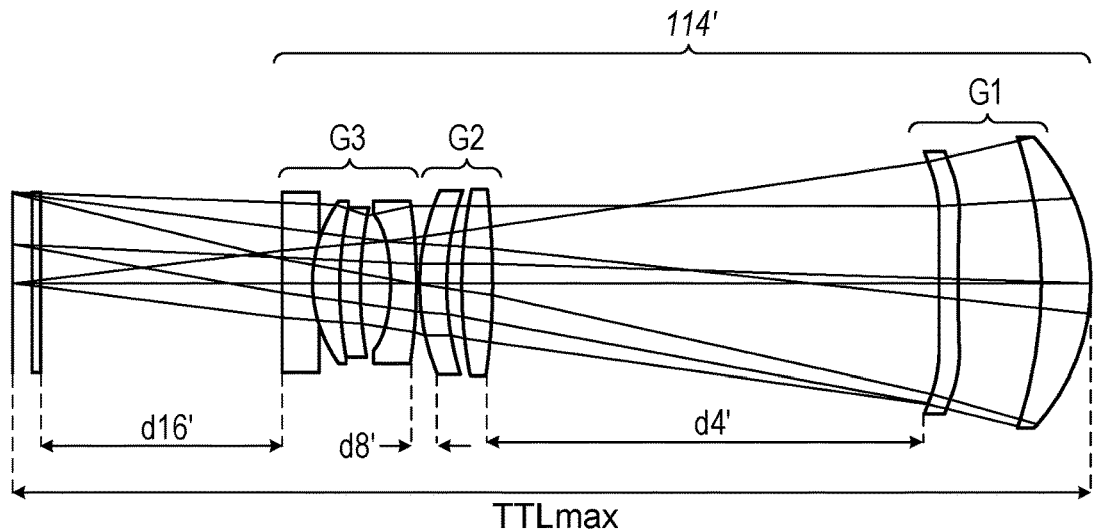
FIG. 2D shows details of the lens elements of the first optical design in the second zoom state.

FIG. 2A shows a zoom folded Tele camera 103' like camera 103 with OPFE 104 (e.g. prism), a lens 114' like lens 114, and image sensor 118 with a first exemplary optical design of a Tele lens 114' and with ray tracing, where the Tele lens is in a first zoom state, i.e. with $EFL=EFL_{Tmin}$. In addition, a glass window 130 may be positioned between all lens elements and image sensor 118. FIG. 2B shows folded Tele camera 103' in a second zoom state, i.e. with $EFL=EFL_{Tmax}$. FIG. 2C shows details of a lens 114' of the first optical design in the first zoom state, and FIG. 2D shows details of lens 114' in the second zoom state.

Lens 114' has a first exemplary optical design, represented by Tables 1-4 and includes eight lens elements marked L1-L8, starting with L1 on an object side facing the prism ("object side") and ending with L8 on an image side toward the image sensor. Table 1 provides optical data for each of the surfaces in the optical lens design. The optical data of the OPFE (prism or mirror) is omitted from Table 1, as many OPFE designs known in the art can be used between the object and $S_1$. Non-limiting examples of such OPFEs include: a prism made of glass or plastic, such that the refractive index of the prism may change (e.g. in a range of 1-3); an OPFE that limits stray light (e.g. as disclosed in co-owned international patent application PCT/IB2018/054928); a low profile prism (see e.g. co-owned U.S. provisional patent application 62/657,003); a scanning OPFE (see e.g. co-owned international patent applications PCT/IB2018/050885 and PCT/IB2017/); an OPFE with OIS mechanism (see e.g. co-owned U.S. Pat. No. 9,927,600); and a mirror.

Table 2 provides zoom data, which is additional data for distances between surfaces in Table 1, as well as changing parameters for various zoom positions. Table 3 provides aspheric data, which is additional optical data for surfaces in Table 1 that are not spherical. Table 4 provides lens elements and lens elements groups focal lengths in mm. Similar Tables exist for a second exemplary optical design (Tables 5-8), a third exemplary optical design (Tables 9-12) a fourth exemplary optical design (Tables 13-16) and a fifth exemplary optical design (Tables 17-20) below.

Lenses disclosed in various exemplary embodiments below comprise several lens groups (G1, G2, G3, etc.) of lens elements, each group including a plurality of lens elements marked Li. Each lens element Li has a respective front surface $S_{2i-1}$ and a respective rear surface $S_{2i}$ where "i" is an integer between 1 and N. As used herein, the term "front surface" of each lens element refers to the surface of a lens element located closer to the entrance of the camera (camera object side) and the term "rear surface" refers to the surface of a lens element located closer to the image sensor (camera image side). The front surface and/or the rear surface can be in some cases aspherical. The front surface and/or the rear surface can be in some cases spherical. These options are, however, not limiting. Lens elements L1 to LN may be made from various materials, for example plastic or glass. Some lens elements may be made of different materials than other lens elements. The notations "Gi", "Li", "$S_i$" are shown in several figures as an example (see FIGS. 2C, 2D for "Gi" notations, FIG. 2B for "Li" notations and FIG. 4A for "$S_i$" notations), however these notations apply for all embodiments in this application.

In this specification, "height" of a part, an element, or of a group of parts or elements is defined as a distance in the direction of the first optical axis (Y direction in an exemplary coordinate system) between the lowermost point of the part/element/group and the upper-most point of the part/element/group. The term "upper" or "top" refers to a section of any part/element/group that is closer to and facing an imaged (photographed) object along Y relative to other sections of the same part/element or group. The term "lower" or "bottom" refers to a section of any part/element/group that is farthest from and facing away from an imaged object along Y relative to other sections of the same part/element or group.

In Table 1 (as well as in Tables 5 and 9), R is the radius of curvature of a surface and T is the distance from the surface to the next surface parallel to an optical axis. Since the distance between some lens elements change with zooming and focusing, additional thickness data is given in Tables 2, 6 and 10 for various zoom and focus positions. Note that the $TTL_T$ is the sum of all T values starting from $S_1$ and to the image sensor, when additional data from Tables 2, 6 and 10 is used with the object set at infinity. D is the optical diameter of the surface. D/2 expresses a "semi-diameter" or half of the diameter. The units of R, T, and D are millimeters (mm). Nd and Vd are the refraction index and Abbe number of the lens element material residing between the surface and the next surface, respectively.

Surface types are defined in Tables 1, 5 and 9 and the coefficients for the surfaces are in Tables 3, 7 and 11:

Flat surfaces—have infinity radius of curvature;
Even-Aspherical (EVAS) surfaces, which are defined using Eq. 1 and their details given in Tables 3, 7 and 11:

$$EVAS = \frac{cr^2}{1 + \sqrt{1 - (1+k)c^2 r^2}} + \alpha_2 r^4 + \alpha_3 r^6 \quad \text{(Eq. 1)}$$

where r is the distance of a point in the optical surface from (and perpendicular to) the relevant optical axis (first or second), k is the conic coefficient, c=1/R, and a are coefficients given in Tables 3, 7 and 11. Note that, for any aspheric surface, the maximum value of r ("max r") is the semi-diameter (D/2) of the respective surface.

QT1 surfaces are defined using Eq. 2 and sub-equations below:

$$QT1 = \frac{cr^2}{1 + \sqrt{1 - (1+k)c^2 r^2}} + D_{con}(u) \quad \text{(Eq. 2)}$$

$$D_{con}(u) = u^4 \sum_{n=0}^{5} A_n Q_n^{con}(u^2)$$

$$u = \frac{r}{NR} \quad x = u^2$$

$$Q_0^{con}(x) = 1 \quad Q_1^{con} = -(5 - 6x) \quad Q_2^{con} = 15 - 14x(3 - 2x)$$

$$Q_3^{con} = -\{35 - 12x[14 - x(21 - 10x)]\}$$

$$Q_4^{con} = 70 - 3x\{168 - 5x[84 - 11x(8 - 3x)]\}$$

$$Q_5^{con} = -[126 - x(1260 - 11x\{420 - x[720 - 13x(45 - 14x)]\})]$$

where {z, r} are the standard cylindrical polar coordinates, c is the paraxial curvature of the surface, k is the conic parameter, NR is the norm radius, and $A_n$ are the polynomial coefficients shown in lens data tables.

A "stop surface" (Tables 2, 6, 10, 14, 18 and 22): in the embodiments disclosed herein, the position of a lens aperture stop surface may change when shifting from a first zoom state to a second zoom state. In this case, the stop determines the F # of the entire lens module. For example in some embodiments the amount of light reaching the image plane to form an image for center field in a first zoom state is determined by an aperture stop near the first lens from object side L1, whereas in a second zoom state the amount of light reaching the image plane to form an image for center field is determined by an aperture stop near another lens element, for example near lens element L4. In other embodiments, the position of a lens aperture stop surface may not change when shifting from a first zoom state to a second zoom state.

The diameter D of the image sensor as presented in the tables below refers to a possible size of the image sensor diagonal.

TABLE 1

| Group | Lens | Surface | Type | R [mm] | T [mm] | Nd | Vd | D [mm] |
|---|---|---|---|---|---|---|---|---|
| Object | | $S_0$ | Flat | Infinity | See Table 2 | | | |
| G1 | L1 | $S_1$ | EVAS | 5.997 | 1.224 | 1.4847 | 84.150 | 7.50 |
| G1 | L1 | $S_2$ | EVAS | 13.606 | 2.104 | | | 7.50 |
| G1 | L2 | $S_3$ | EVAS | −19.106 | 0.509 | 1.8446 | 23.750 | 6.73 |
| G1 | L2 | $S_4$ | EVAS | −25.364 | See Table 2 | | | 6.24 |
| G2 | L3 | $S_5$ | EVAS | 11.959 | 0.864 | 1.5348 | 55.660 | 4.76 |
| G2 | L3 | $S_6$ | EVAS | −9.715 | 0.422 | | | 4.76 |
| G2 | L4 | $S_7$ | EVAS | −3.692 | 0.656 | 1.6510 | 21.510 | 4.40 |
| G2 | L4 | $S_8$ | EVAS | −4.784 | See Table 2 | | | 4.27 |
| G3 | L5 | $S_9$ | EVAS | −8.017 | 0.719 | 1.6510 | 21.510 | 4.00 |
| G3 | L5 | $S_{10}$ | EVAS | −1293.029 | 0.635 | | | 3.55 |
| G3 | L6 | $S_{11}$ | EVAS | −670.457 | 0.598 | 1.6510 | 21.510 | 3.59 |
| G3 | L6 | $S_{12}$ | EVAS | −7.424 | 0.073 | | | 3.88 |
| G3 | L7 | $S_{13}$ | EVAS | −7.140 | 0.624 | 1.6510 | 21.510 | 3.93 |
| G3 | L7 | $S_{14}$ | EVAS | −4.715 | 0.068 | | | 4.16 |

TABLE 1-continued

| Group | Lens | Surface | Type | R [mm] | T [mm] | Nd | Vd | D [mm] |
|---|---|---|---|---|---|---|---|---|
| G3 | L8 | $S_{15}$ | EVAS | −3.913 | 0.798 | 1.5348 | 55.660 | 4.22 |
| G3 | L8 | $S_{16}$ | EVAS | 45.594 | See Table 2 | | | 4.35 |
| Glass | | $S_{17}$ | Flat | Infinity | 0.210 | 1.5168 | 64.170 | |
| window | | $S_{18}$ | Flat | Infinity | 0.500 | | | |
| Image sensor | | $S_{19}$ | Flat | Infinity | 0 | | | |

TABLE 2

| Object position | | First zoom state $EFL_T = 15$ mm | | Second zoom state $EFL_T = 30$ mm | |
|---|---|---|---|---|---|
| | | at infinity | at 1 meter | at infinity | at 1 meter |
| Stop surface | | S8 | | S1 | |
| T [mm] | $S_0$ | Infinity | 1000 | Infinity | 1000 |
| | $S_4$ | 0.131 | 0.131 | 11.403 | 11.403 |
| | $S_8$ | 5.080 | 5.364 | 0.060 | 0.434 |
| | $S_{16}$ | 1.094 | 0.810 | 6.114 | 5.740 |

TABLE 3

| Surface | Conic (k) | $\alpha_2$ | $\alpha_3$ |
|---|---|---|---|
| $S_1$ | 0.512 | −2.110E−04 | −3.814E−06 |
| $S_2$ | 0.273 | 3.572E−04 | 1.917E−05 |
| $S_3$ | 20.233 | 5.134E−03 | −4.188E−05 |
| $S_4$ | 37.580 | 5.156E−03 | −2.918E−06 |
| $S_5$ | −17.980 | 3.967E−04 | −2.603E−04 |
| $S_6$ | 4.558 | 9.386E−04 | −2.360E−04 |
| $S_7$ | −0.178 | 7.713E−03 | −3.679E−04 |
| $S_8$ | 0.700 | 5.789E−03 | −1.981E−04 |
| $S_9$ | −37.208 | 2.833E−02 | −2.126E−03 |
| $S_{10}$ | −2.729 | 3.813E−02 | 1.651E−03 |
| $S_{11}$ | −9.193 | −2.622E−02 | 4.029E−03 |
| $S_{12}$ | −5.072 | −1.207E−02 | 3.646E−03 |
| $S_{13}$ | 9.708 | 1.232E−02 | −6.426E−04 |
| $S_{14}$ | 3.593 | 2.145E−03 | 4.976E−04 |
| $S_{15}$ | 1.298 | 1.152E−02 | 2.260E−03 |
| $S_{16}$ | −8.975 | −1.222E−03 | −1.182E−04 |

TABLE 4

| Lens # | Lens or group focal length [mm] |
|---|---|
| L1 | 14.88 |
| L2 | −28.15 |
| L3 | 12.85 |
| L4 | −49.00 |
| L5 | 65.32 |
| L6 | −9.17 |
| L7 | −32.37 |
| L8 | 19.45 |
| G1 | 23.01 |
| G2 | 15.28 |
| G3 | −11.55 |

In a first example ("Example 1"), lens elements L1-L8 are grouped into three groups: a first group G1 comprising lens elements L1 and L2, a second group G2 comprising lens elements L3 and L4 and a third group comprising lens elements L5-L8. Note that the lens or group focal lengths listed in Table 4 have positive or negative values, which indicate respective positive or negative refractive powers of the associates lens elements or groups. Thus, in Table 4, L1, L3, L5 and L8 have positive refractive powers and L2, L4, L6 and L7 have negative refractive powers. Similarly, G1 and G2 have positive refractive powers and G3 has negative refractive power. This applies also to Tables 8 and 12.

In Example 1, the camera is brought into two zoom states by moving groups G1 and G3 relative to image sensor 118 while keeping group G2 stationary relative to image sensor 118. G3 is then further movable for focusing in each of the zoom states. Table 2 specifies the exact distances and relative positioning. In Example 1, G1 and G3 are moved relatively to G2 (and the image sensor) to bring the camera into a first zoom state shown in FIGS. 2A and 2C in which $EFL_T = EFL_{Tmin} = 15$ mm, F #=F #$_{Tmin}$=2.8 and $TTL_T = TTL_{Tmin} = 16.309$ mm, and into a second zoom state shown in FIGS. 2B and 2D in which $EFL_T = EFL_{Tmax} = 30$ mm, F #=F #$_{Tmax}$=4 and $TTL_T = TTL_{Tmin} = 27.581$ mm. The range of movement may be for example 5-10 mm. In the first state, G1 is separated from G2 by a distance d4 (the distance between $S_4$ and $S_5$ in Table 2 for a case of 15 mm EFL, i.e. 0.131 mm), G2 is separated from G3 by a distance d8 (the distance between $S_8$ and $S_9$ in Table 2 for a case of 15 mm EFL, i.e. 5.080-5.364 mm, depending on the focus distance) and G3 is separated from window 130 by a distance d16 (the distance between $S_{16}$ and $S_{17}$ in Table 2 for a case of 15 mm EFL, i.e. 1.094 to 0.810 mm, depending on the focus distance). In the second state, G1 is separated from G2 by a distance d4' (the distance between $S_4$ and $S_5$ in Table 2 for a case of 30 mm EFL, i.e. 11.403 mm), G2 is separated from G3 by a distance d8' (the distance between $S_8$ and $S_9$ in Table 2 for a case of 30 mm EFL, i.e. 0.060-0.434 mm, depending on the focus distance) and G3 is separated from window 130 by a distance d16' (the distance between $S_{16}$ and $S_{17}$ in Table 2 for a case of 30 mm EFL, i.e. 6.114 mm to 5.740 mm depending on the focus distance).

FIG. 3A shows details of the lens elements of a second embodiment of an exemplary optical design in a folded Tele camera such as camera 103 in a first zoom state, while FIG. 3B shows details of the lens elements of the second optical design in a second zoom state. The figures show a lens 114", image sensor 118 and optional window 130. The second optical design is represented by Tables 5-8 and includes eight lens elements marked L1-L8, starting with L1 on an object side facing the prism and ending with L8 on an image side toward the image sensor. Table 5 provides optical data, Table 6 provides zoom data, Table 7 provides aspheric data and Table 8 provides lens or group focal length in mm.

In a second example ("Example 2"), in lens 114", lens elements L1-L8 are grouped into three groups: a first group G1 comprising lens elements L1 and L2, a second group G2 comprising lens elements L3-L5, and a third group comprising lens elements L6-L8.

In Example 2, the camera is brought into two zoom states by moving groups G1 and G3 together relative to the image sensor in a given range $R_{1,3}$ while moving group G2 relative to the image sensor in a range $R_2$ smaller than $R_{1,3}$. In Example 2, $R_{1,3} = 7.509$ mm, while $R_2 = 1.574$ mm. G2 is further movable at any zoom state relative to the image sensor in a range $R_{AF}$ for changing the focal distance of camera 106 from infinity down to 1 meter. $R_{AF}$ may be up to 550 micrometers (um), depending on zoom state. FIG. 3A shows Example 2 in the first zoom state in which $EFL_T=EFL_{Tmin}=15$ mm, $F\#=F\#_{Tmin}=2$ and $TTL_T=TTL_{Tmin}=17.373$ mm, and FIG. 3B shows Example 2 in the second zoom state in which $EFL_T=EFL_{Tmax}=30$ mm, $F\#=F\#_{Tmax}=4$, and $TTL_T=TTL_{Tmax}=24.881$ mm.

In Example 2, the following conditions are fulfilled: $R_{1,3}$ and $R_2$ are smaller than $0.6\times(EFL_{Tmax}-EFL_{Tmin})$ and of course smaller than $0.75\times(EFL_{Tmax}-EFL_{Tmin})$. $F\#_{Tmin}$ is smaller than $1.0\times F\#_{Tmax}\times EFL_{Tmin}/EFL_{Tmax}$, smaller than $1.2\times F\#_{Tmax}\times EFL_{Tmin}/EFL_{Tmax}$, smaller than $1.5\times F\#_{Tmax}\times EFL_{Tmin}/EFL_{Tmax}$ and smaller than $1.8\times F\#_{Tmax}\times EFL_{Tmin}/EFL_{Tmax}$.

In the first state, G1 is separated from G2 by a distance d4 (the distance between $S_4$ and $S_5$ in Table 6 for a case of 15 mm EFL, i.e. 1.246 to 1.012 mm, depending on the focus distance), G2 is separated from G3 by a distance d10 (the distance between $S_{10}$ and $S_{11}$ in Table 6 for a case of 15 mm EFL, i.e. 6.136-6.370 mm, depending on the focus distance) and G3 is separated from window 130 by a distance d16 (the distance between $S_{16}$ and $S_{17}$ in Table 6 for a case of 15 mm EFL, i.e. 0.229 mm). In the second state, G1 is separated from G2 by a distance d4' (the distance between $S_4$ and $S_5$ in Table 6 for a case of 30 mm EFL, i.e. 7.181 to 6.658 mm, depending on the focus distance), G2 is separated from G3 by a distance d10' (the distance between $S_{10}$ and $S_{11}$ in Table 6 for a case of 30 mm EFL, i.e. 0.2 to 0.725 mm, depending on the focus distance) and G3 is separated from window 130 by a distance d16' (the distance between $S_{16}$ and $S_{17}$ in Table 6 for a case of 30 mm EFL, i.e. 7.738 mm).

TABLE 5

| Group | Lens | Surface | Type | R [mm] | T [mm] | Nd | Vd | D [mm] |
|---|---|---|---|---|---|---|---|---|
| Object | | $S_0$ | Flat | Infinity | See Table 6 | | | |
| G1 | L1 | $S_1$ | QT1 | 6.615 | 1.666 | 1.4847 | 84.150 | 7.50 |
| G1 | L1 | $S_2$ | QT1 | 71.898 | 3.268 | | | 7.30 |
| G1 | L2 | $S_3$ | QT1 | 21.616 | 0.373 | 1.8446 | 23.750 | 5.87 |
| G1 | L2 | $S_4$ | QT1 | 10.973 | See Table 6 | | | 5.62 |
| G2 | L3 | $S_5$ | QT1 | −37.902 | 0.700 | 1.5348 | 55.660 | 4.86 |
| G2 | L3 | $S_6$ | QT1 | −5.871 | 0.132 | | | 4.95 |
| G2 | L4 | $S_7$ | QT1 | −3.976 | 0.744 | 1.6510 | 21.510 | 4.93 |
| G2 | L4 | $S_8$ | QT1 | −4.874 | 0.067 | | | 5.20 |
| G2 | LS | $S_9$ | QT1 | −5.651 | 0.869 | 1.5348 | 55.660 | 5.38 |
| G2 | LS | $S_{10}$ | QT1 | −5.128 | See Table 6 | | | 5.38 |
| G3 | L6 | $S_{11}$ | QT1 | −4.749 | 0.250 | 1.5348 | 55.660 | 4.77 |
| G3 | L6 | $S_{12}$ | QT1 | −139.803 | 0.063 | | | 4.74 |
| G3 | L7 | $S_{13}$ | QT1 | −444.631 | 0.318 | 1.5348 | 55.660 | 4.73 |
| G3 | L7 | $S_{14}$ | QT1 | 18.077 | 0.060 | | | 4.75 |
| G3 | L8 | $S_{15}$ | QT1 | 15.930 | 0.542 | 1.6510 | 21.510 | 4.78 |
| G3 | L8 | $S_{16}$ | QT1 | −63.413 | See Table 6 | | | 4.77 |
| Glass | | $S_{17}$ | Flat | Infinity | 0.210 | 1.5168 | 64.170 | |
| window | | $S_{18}$ | Flat | Infinity | 0.500 | | | |
| Image sensor | | $S_{19}$ | Flat | Infinity | 0 | | | |

TABLE 6

| Object | | First zoom state $EFL_T$ = 15 mm | | Second zoom state $EFL_T$ = 30 mm | |
|---|---|---|---|---|---|
| position | | at infinity | at 1 meter | at infinity | at 1 meter |
| Stop surface | | S5 | | S1 | |
| T [mm] | $S_0$ | Infinity | 1000 | Infinity | 1000 |
| | $S_4$ | 1.246 | 1.012 | 7.181 | 6.658 |
| | $S_8$ | 6.136 | 6.370 | 0.200 | 0.725 |
| | $S_{16}$ | 0.229 | 0.229 | 7.738 | 7.738 |

TABLE 7

| Surface | Conic | NR | $A_0$ | $A_1$ | $A_2$ | $A_3$ | $A_4$ | $A_5$ |
|---|---|---|---|---|---|---|---|---|
| $S_1$ | 0 | 3.7 | −1.071E−02 | −7.810E−04 | 7.874E−05 | −9.666E−05 | 3.754E−06 | 2.463E−06 |
| $S_2$ | 0 | 3.7 | 3.115E−02 | −1.285E−03 | 1.465E−04 | −2.067E−04 | 4.660E−05 | −9.353E−07 |
| $S_3$ | 0 | 3.7 | 2.719E−01 | −4.051E−02 | 2.860E−02 | 5.289E−02 | 7.861E−02 | −8.761E−04 |
| $S_4$ | 0 | 3.7 | 3.639E−01 | −3.214E−02 | 6.330E−03 | 2.656E−03 | 9.124E−04 | −1.171E−03 |
| $S_5$ | 0 | 3.7 | −1.507E+00 | −1.910E−01 | −6.434E−02 | −1.200E−02 | 5.825E−04 | −5.555E−04 |
| $S_6$ | 0 | 3.7 | −8.373E−01 | −1.648E−01 | −4.615E−04 | −1.051E−02 | 2.529E−03 | 2.881E−03 |
| $S_7$ | 0 | 3.7 | 5.590E−01 | 1.990E−02 | 1.374E−01 | 8.401E−01 | 6.293E−03 | 6.466E−03 |
| $S_8$ | 0 | 3.7 | 4.388E−01 | −1.366E−01 | 5.125E−02 | −1.241E−02 | −2.885E−03 | 8.741E−04 |
| $S_9$ | 0 | 3.7 | 5.075E−01 | −1.496E−02 | 6.068E−02 | 1.246E−02 | −8.803E−04 | −4.615E−03 |
| $S_{10}$ | 0 | 3.7 | −8.004E−02 | −5.974E−02 | −2.987E−02 | −2.815E−03 | 7.390E−04 | −1.480E−03 |
| $S_{11}$ | 0 | 3.7 | 8.519E−01 | −5.488E−02 | −5.544E−02 | −7.854E−03 | 3.268E−03 | 6.359E−03 |
| $S_{12}$ | 0 | 3.7 | −1.077E−01 | 2.667E−01 | −4.035E−02 | −5.846E−03 | −2.225E−02 | 2.213E−03 |
| $S_{13}$ | 0 | 3.7 | −9.512E−01 | 3.384E−02 | 4.268E−02 | 5.478E−02 | −3.769E−03 | −2.779E−03 |
| $S_{14}$ | 0 | 3.7 | 1.676E−01 | −2.814E−01 | 2.307E−02 | 1.180E−02 | −3.634E−03 | −1.653E−02 |
| $S_{15}$ | 0 | 3.7 | 8.046E−01 | 6.039E−02 | 9.548E−02 | 1.891E−02 | 8.015E−03 | −7.180E−03 |
| $S_{16}$ | 0 | 3.7 | 3.581E−01 | −4.279E−02 | 1.900E−02 | 9.315E−03 | 1.405E−02 | 4.839E−03 |

TABLE 8

| Lens # | Lens or group focal length [mm] |
|---|---|
| L1 | 14.88 |
| L2 | -28.15 |
| L3 | 12.85 |
| L4 | -49.00 |
| L5 | 65.32 |
| L6 | -9.17 |
| L7 | -32.37 |
| L8 | 19.45 |
| G1 | 23.01 |
| G2 | 15.28 |
| G3 | -11.55 |

FIG. 4A shows details of the lens elements of a third embodiment of an exemplary optical design in a folded Tele camera such as camera 103 in a first zoom state, while FIG. 4B shows details of the lens elements of the third optical design in a second zoom state. The figures show a lens 114''', image sensor 118 and optional window 130. The second optical design is represented by Tables 9-12 and includes eight lens elements marked L1-L8, starting with L1 on an object side facing the prism and ending with L8 on an image side toward the image sensor. Table 9 provides optical data, Table 10 provides zoom data, Table 11 provides aspheric data and Table 12 provides lens or group focal length in mm.

In lens 114''', lens elements L1-L8 are grouped into three groups: a first group G1 comprising lens elements L1 and L2, a second group G2 comprising lens elements L3 and L4, and a third group comprising lens elements L5-L8.

In a third exemplary use ("Example 3"), the camera is brought into two zoom states by moving G1 and G3 relative to the image sensor in a given range while keeping G2 stationary. The range of movement may be for example 5-10 mm. G1 is further movable for focusing. In Example 3, G1 and G3 are moved relatively to G2 (and the image sensor) to bring the camera into a first zoom state shown in FIG. 4A in which $EFL_T=EFL_{Tmin}=15$ mm, $F\#_{Tmin}=2.74$ and $TIL_T=TTL_{Tmin}=16.78$ mm, and into a second zoom state shown in FIG. 4B in which $EFL_T=EFL_{Tmax}=30$ mm, $F\#=F\#_{Tmax}=4$ and $TTL_T=TTL_{Tmax}=26.958$ mm. In the first state, G1 is separated from G2 by a distance d4 (the distance between $S_4$ and $S_5$ in Table 10 for a case of 15 mm EFL, i.e. 0.199-0.870 mm, depending on the focus distance), G2 is separated from G3 by a distance d8 (the distance between $S_8$ and $S_9$ in Table 10 for a case of 15 mm EFL, i.e. 6.050 mm) and G3 is separated from window 130 by a distance d16 (the distance between $S_{16}$ and $S_{17}$ in Table 10 for a case of 15 mm EFL, i.e. 0.650 mm). In the second state, G1 is separated from G2 by a distance d4 (the distance between $S_4$ and $S_5$ in Table 10 for a case of 30 mm EFL, i.e. 10.377-11.031 mm, depending on the focus distance), G2 is separated from G3 by a distance d8 (the distance between $S_8$ and $S_9$ in Table 10 for a case of 30 mm EFL, i.e. 0.06 mm) and G3 is separated from window 130 by a distance d16 (the distance between $S_{16}$ and $S_{17}$ in Table 10 for a case of 30 mm EFL, i.e. 6.64 mm).

TABLE 9

| Group | Lens | Surface | Type | R [mm] | T [mm] | Nd | Vd | D [mm] |
|---|---|---|---|---|---|---|---|---|
| Object | | $S_0$ | Flat | Infinity | See Table 10 | | | |
| G1 | L1 | $S_1$ | EVAS | 5.965 | 1.246 | 1.4847 | 84.150 | 7.50 |
| G1 | L1 | $S_2$ | EVAS | 14.446 | 2.524 | | | 7.50 |
| G1 | L2 | $S_3$ | EVAS | -18.902 | 0.545 | 1.8446 | 23.750 | 6.52 |
| G1 | L2 | $S_4$ | EVAS | -27.153 | See Table 10 | | | 6.24 |
| G2 | L3 | $S_5$ | EVAS | 15.497 | 0.881 | 1.5348 | 55.660 | 4.76 |
| G2 | L3 | $S_6$ | EVAS | -9.815 | 0.351 | | | 4.76 |
| G2 | L4 | $S_7$ | EVAS | -3.714 | 0.694 | 1.6510 | 21.510 | 4.40 |
| G2 | L4 | $S_8$ | EVAS | -4.750 | See Table 10 | | | 4.27 |
| G3 | L5 | $S_9$ | EVAS | -8.318 | 0.535 | 1.6510 | 21.510 | 4.00 |
| G3 | L5 | $S_{10}$ | EVAS | -49.289 | 0.581 | | | 3.84 |
| G3 | L6 | $S_{11}$ | EVAS | 29.648 | 0.492 | 1.6510 | 21.510 | 4.01 |
| G3 | L6 | $S_{12}$ | EVAS | -15.803 | 0.371 | | | 4.17 |
| G3 | L7 | $S_{13}$ | EVAS | -8.902 | 0.625 | 1.6510 | 21.510 | 4.51 |
| G3 | L7 | $S_{14}$ | EVAS | -5.204 | 0.066 | | | 4.66 |
| G3 | L8 | $S_{15}$ | EVAS | -4.708 | 0.260 | 1.5348 | 55.660 | 4.73 |
| G3 | L8 | $S_{16}$ | EVAS | 21.740 | See Table 10 | | | 4.65 |
| Glass | | $S_{17}$ | Flat | Infinity | 0.210 | 1.5168 | 64.170 | |
| window | | $S_{18}$ | Flat | Infinity | 0.500 | | | |
| Image sensor | | $S_{19}$ | Flat | Infinity | 0 | | | |

TABLE 10

| Object position | First zoom state $EFL_T$ = 15 mm | | Second zoom state $EFL_T$ = 30 mm | |
|---|---|---|---|---|
| | at infinity | at 1 meter | at infinity | at 1 meter |
| Stop surface | S8 | | S1 | |
| T [mm] $S_0$ | Infinity | 1000 | Infinity | 1000 |
| $S_4$ | 0.199 | 0.870 | 10.377 | 11.031 |
| $S_8$ | 6.050 | 6.050 | 0.060 | 0.060 |
| $S_{16}$ | 0.650 | 0.650 | 6.640 | 6.640 |

TABLE 11

| Surface | Conic (k) | $\alpha_2$ | $\alpha_3$ |
|---|---|---|---|
| $S_1$ | 0.522 | -1.7367E-04 | 1.4347E-06 |
| $S_2$ | 1.931 | 4.4699E-04 | 2.3992E-05 |
| $S_3$ | 19.446 | 5.1529E-03 | -5.1705E-05 |
| $S_4$ | 42.199 | 5.0933E-03 | -1.1038E-05 |
| $S_5$ | -19.929 | -9.0502E-05 | -2.5378E-04 |
| $S_6$ | 5.537 | 1.3905E-03 | -2.6043E-04 |
| $S_7$ | -0.207 | 7.6849E-03 | -3.0619E-04 |
| $S_8$ | 0.535 | 5.5481E-03 | -1.4016E-04 |
| $S_9$ | -36.500 | 2.6433E-02 | -1.9343E-03 |
| $S_{10}$ | 10.019 | 3.3334E-02 | 5.6299E-04 |
| $S_{11}$ | -10.151 | -2.4156E-02 | 4.1713E-03 |
| $S_{12}$ | 10.679 | -1.3708E-02 | 3.1066E-03 |
| $S_{13}$ | 10.006 | 1.3443E-02 | -1.0812E-03 |
| $S_{14}$ | 3.232 | 5.2907E-03 | 7.9836E-05 |

TABLE 11-continued

| Surface | Conic (k) | $\alpha_2$ | $\alpha_3$ |
|---|---|---|---|
| $S_{15}$ | 1.099 | 6.4779E−03 | 1.6274E−03 |
| $S_{16}$ | 3.669 | 8.5666E−04 | 8.2964E−05 |

TABLE 17

| Lens # | Lens or group focal length [mm] |
|---|---|
| L1 | 19.95 |
| L2 | −75.22 |
| L3 | 11.33 |
| L4 | −35.23 |
| L5 | −15.29 |
| L6 | 15.73 |
| L7 | 17.84 |
| L8 | −7.18 |
| G1 | 25.67 |
| G2 | 17.78 |
| G3 | −11.14 |

Figure 4C:
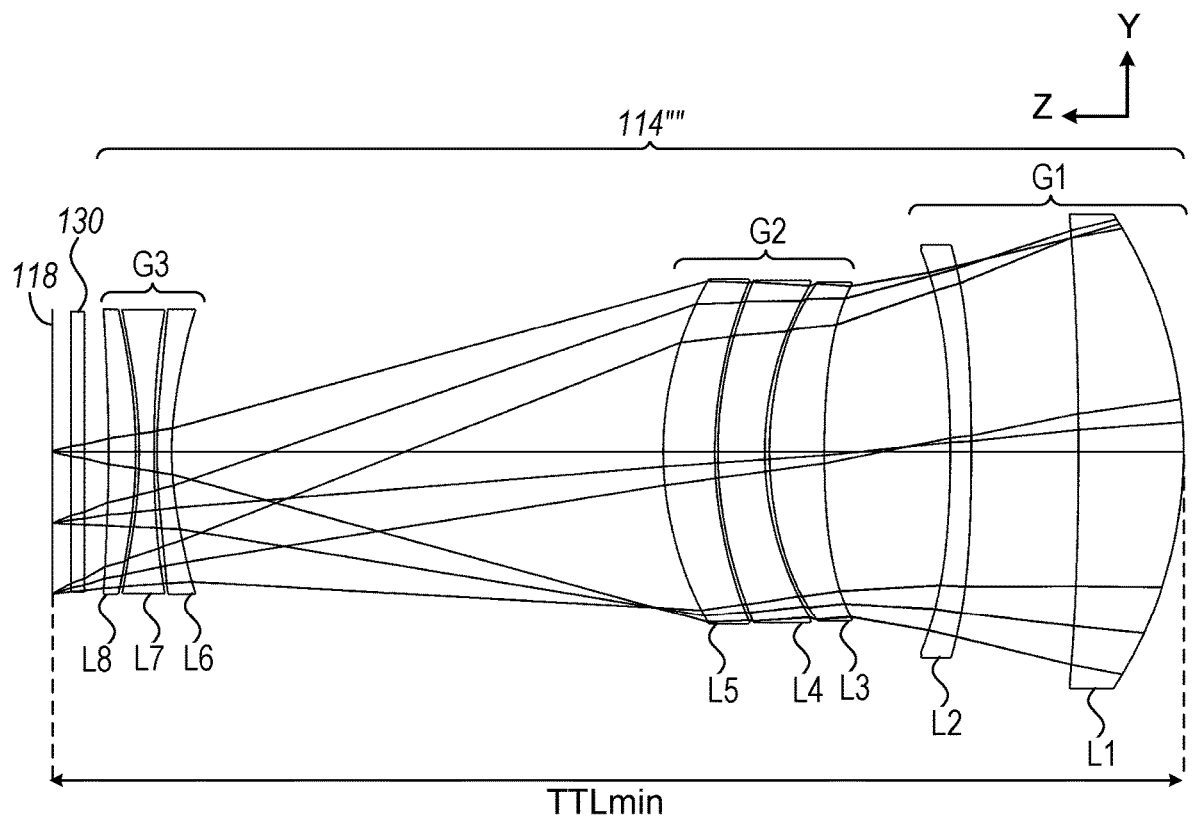
FIG. 4C shows details of the lens elements of a fourth optical design in a first zoom state.
Figure 4D:
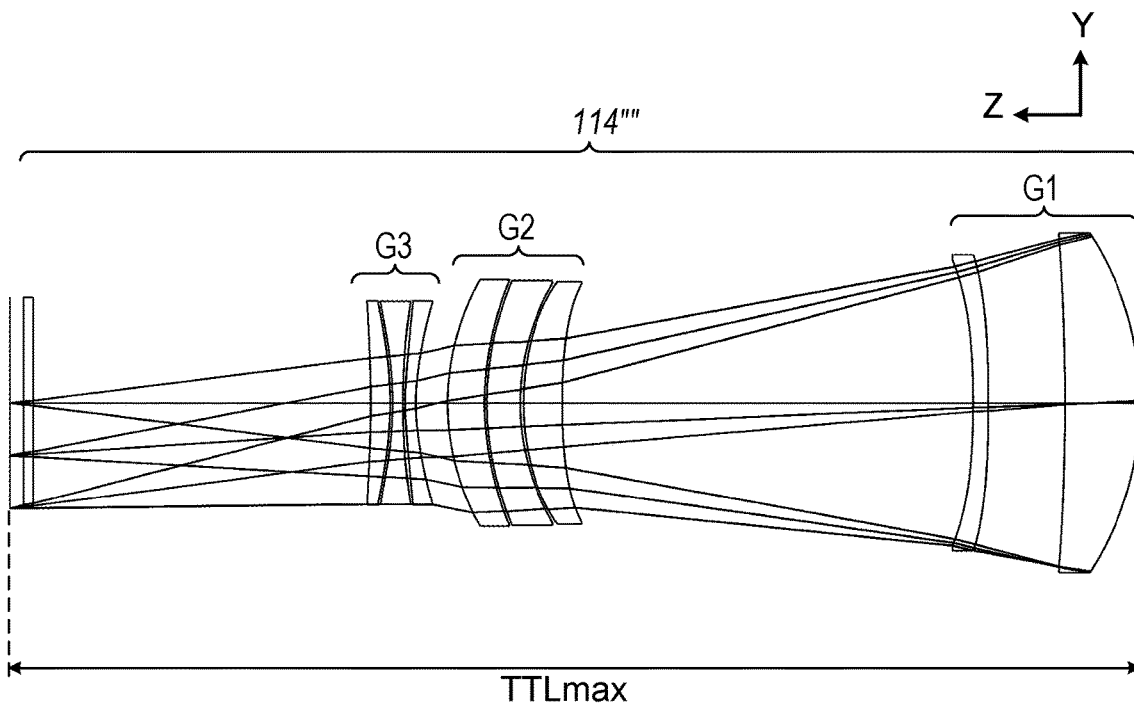
FIG. 4D shows details of the lens elements of the fourth optical design in a second zoom state.

FIG. 4C shows details of the lens elements of a fourth exemplary optical design in a folded Tele camera such as camera 103 in a first zoom state, while FIG. 4D shows details of the lens elements of the fourth optical design in a second zoom state. The figures show a lens 114'''', image sensor 118 and optional window 130. The second optical design is represented by Tables 13-16 and includes eight lens elements marked L1-L8, starting with L1 on an object side facing the prism and ending with L8 on an image side toward the image sensor. Table 13 provides optical data, Table 14 provides zoom data, Table 15 provides aspheric data and Table 16 provides lens or group focal length in mm.

In a fourth example ("Example 4"), in lens 114'''', lens elements L1-L8 are grouped into three groups: a first group G1 comprising lens elements L1 and L2, a second group G2 comprising lens elements L3-L5, and a third group comprising lens elements L6-L8.

In Example 4, the camera is brought into two zoom states by moving G1 and G3 together (as one unit) relative to the image sensor in a given range $R_{1,3}$ while G2 is stationary relative to the image sensor in the zoom process. In Example 5, $R_{1,3=7.065}$ mm. While group G2 does not move when changing zoom state, G2 is movable at any zoom state relative to the image sensor and G1 and G3 in a range $R_{AF}$ for changing the focal distance of camera 106 from infinity down to 1 meter. $R_{AF}$ may be up to 730 μm, depending on zoom state. FIG. 4C shows Example 4 in the first zoom state in which $EFL_T = EFL_{Tmin} = 15$ mm, $F\ \# = F\ \#_{Tmin} = 2$ and $TTL_T = TTL_{Tmin} = 17.865$ mm, and FIG. 4D shows Example 4 in the second zoom state in which $EFL_T = EFL_{Tmax} = 30$ mm, $F\ \# = F\ \#_{Tmax} = 4$, and $TTL_T = TTL_{Tmax} = 24.93$ mm.

In the first state, G1 is separated from G2 by a distance d4 (the distance between $S_4$ and $S_5$ in Table 14 for a case of 15 mm EFL), G2 is separated from G3 by a distance d10 (the distance between $S_{10}$ and $S_{11}$ in Table 14 for a case of 15 mm EFL, and G3 is separated from window 130 by a distance d16 (the distance between $S_{16}$ and $S_{17}$ in Table 14 for a case of 15 mm EFL. In the second state, G1 is separated from G2 by a distance d4' (the distance between $S_4$ and $S_5$ in Table 14 for a case of 30 mm EFL), G2 is separated from G3 by a distance d10' (the distance between $S_{10}$ and $S_{11}$ in Table 14 for a case of 30 mm EFL) and G3 is separated from window 130 by a distance d16' (the distance between $S_{16}$ and $S_{17}$ in Table 14 for a case of 30 mm EFL).

TABLE 13

| Group | Lens | Surface | Type | R [mm] | T [mm] | Nd | Vd | D [mm] |
|---|---|---|---|---|---|---|---|---|
| Object | | $S_0$ | Flat | Infinity | See Table 14 | | | |
| G1 | L1 | $S_1$ | QT1 | 6.795 | 1.665 | 1.4847 | 84.150 | 7.50 |
| G1 | L1 | $S_2$ | QT1 | 55.652 | 1.690 | | | 7.28 |
| G1 | L2 | $S_3$ | QT1 | 38.079 | 0.330 | 1.7978 | 22.463 | 6.53 |
| G1 | L2 | $S_4$ | QT1 | 18.832 | See Table 14 | | | 6.32 |
| G2 | L3 | $S_5$ | QT1 | −14.657 | 0.862 | 1.5348 | 55.660 | 5.43 |
| G2 | L3 | $S_6$ | QT1 | −5.687 | 0.076 | | | 5.50 |
| G2 | L4 | $S_7$ | QT1 | −5.011 | 0.735 | 1.6510 | 21.510 | 5.41 |
| G2 | L4 | $S_8$ | QT1 | −6.654 | 0.052 | | | 5.50 |
| G2 | L5 | $S_9$ | QT1 | −6.344 | 0.813 | 1.5348 | 55.660 | 5.47 |
| G2 | L5 | $S_{10}$ | QT1 | −5.302 | See Table 14 | | | 5.51 |
| G3 | L6 | $S_{11}$ | QT1 | −4.891 | 0.230 | 1.5348 | 55.660 | 4.54 |
| G3 | L6 | $S_{12}$ | QT1 | −7.762 | 0.050 | | | 4.54 |
| G3 | L7 | $S_{13}$ | QT1 | −17.929 | 0.230 | 1.5348 | 55.660 | 4.53 |
| G3 | L7 | $S_{14}$ | QT1 | 7.959 | 0.057 | | | 4.60 |
| G3 | L8 | $S_{15}$ | QT1 | 8.309 | 0.425 | 1.6510 | 21.510 | 4.63 |
| G3 | L8 | $S_{16}$ | QT1 | 21.747 | See Table 14 | | | 4.65 |
| Glass | | $S_{17}$ | Flat | Infinity | 0.210 | 1.5168 | 64.170 | |
| window | | $S_{18}$ | Flat | Infinity | 0.300 | | | |
| Image sensor | | $S_{19}$ | Flat | Infinity | 0 | | | |

TABLE 14

| Object | First zoom state $EFL_T$ = 15 mm | | Second zoom state $EFL_T$ = 30 mm | |
|---|---|---|---|---|
| position | at infinity | at 1 meter | at infinity | at 1 meter |
| Stop surface | S1 | | S1 | |
| T [mm] $S_0$ | Infinity | 1000 | Infinity | 1000 |
| $S_4$ | 1.996 | 1.717 | 9.060 | 8.337 |
| $S_{10}$ | 7.764 | 8.043 | 0.700 | 1.423 |
| $S_{16}$ | 0.380 | 0.380 | 7.445 | 7.445 |

TABLE 15

| Surface | Conic | NR | $A_0$ | $A_1$ | $A_2$ | $A_3$ | $A_4$ | $A_5$ |
|---|---|---|---|---|---|---|---|---|
| $S_1$ | 0 | 3.7 | −1.185E−02 | −4.312E−04 | −7.102E−05 | 0.000E+00 | 0.000E+00 | 0.000E+00 |
| $S_2$ | 0 | 3.7 | 1.691E−02 | 4.449E−04 | −2.627E−04 | 0.000E+00 | 0.000E+00 | 0.000E+00 |
| $S_3$ | 0 | 3.7 | 2.920E−01 | −1.206E−02 | −1.439E−03 | 0.000E+00 | 0.000E+00 | 0.000E+00 |
| $S_4$ | 0 | 3.7 | 3.521E−01 | −7.983E−03 | −1.529E−03 | 0.000E+00 | 0.000E+00 | 0.000E+00 |
| $S_5$ | 0 | 3.7 | −9.944E−01 | −1.351E−01 | −1.582E−02 | 0.000E+00 | 0.000E+00 | 0.000E+00 |
| $S_6$ | 0 | 3.7 | −3.506E−01 | −8.796E−03 | 3.480E−01 | 0.000E+00 | 0.000E+00 | 0.000E+00 |
| $S_7$ | 0 | 3.7 | 2.435E−01 | 7.231E−02 | 3.347E−02 | 0.000E+00 | 0.000E+00 | 0.000E+00 |
| $S_8$ | 0 | 3.7 | 7.927E−02 | 9.735E−03 | 2.347E−04 | 0.000E+00 | 0.000E+00 | 0.000E+00 |
| $S_9$ | 0 | 3.7 | 1.102E−01 | −4.921E−02 | 3.957E−03 | 0.000E+00 | 0.000E+00 | 0.000E+00 |
| $S_{10}$ | 0 | 3.7 | 3.430E−02 | −4.824E−02 | 1.267E−04 | 0.000E+00 | 0.000E+00 | 0.000E+00 |
| $S_{11}$ | 0 | 3.7 | 9.549E−01 | 3.565E−02 | 1.185E−01 | 0.000E+00 | 0.000E+00 | 0.000E+00 |
| $S_{12}$ | 0 | 3.7 | 7.134E−01 | −4.530E−02 | 1.012E−01 | 0.000E+00 | 0.000E+00 | 0.000E+00 |
| $S_{13}$ | 0 | 3.7 | 6.795E−02 | 1.289E−01 | 2.055E−02 | 0.000E+00 | 0.000E+00 | 0.000E+00 |
| $S_{14}$ | 0 | 3.7 | 4.103E−02 | 2.657E−01 | 9.470E−02 | 0.000E+00 | 0.000E+00 | 0.000E+00 |
| $S_{15}$ | 0 | 3.7 | 2.845E−01 | 3.100E−01 | 8.796E−02 | 0.000E+00 | 0.000E+00 | 0.000E+00 |
| $S_{16}$ | 0 | 3.7 | 2.795E−01 | 2.231E−01 | 3.147E−02 | 0.000E+00 | 0.000E+00 | 0.000E+00 |

TABLE 16

| Lens # | Lens or group focal length [mm] |
|---|---|
| L1 | 15.76 |
| L2 | −46.69 |
| L3 | 16.75 |
| L4 | −37.57 |
| L5 | 47.27 |
| L6 | −25.34 |
| L7 | −10.23 |
| L8 | 20.23 |
| G1 | 21.49 |
| G2 | 19.76 |
| G3 | −11.20 |

Figure 4E:
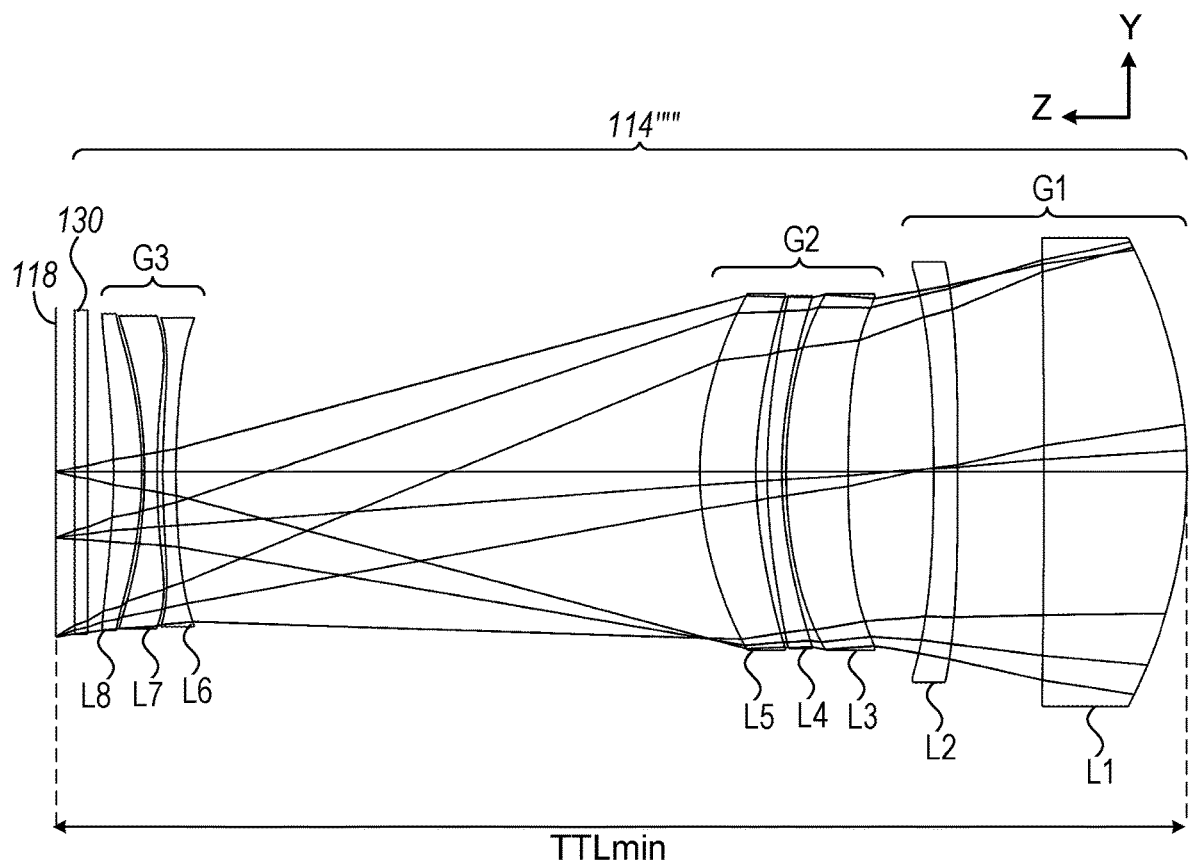
FIG. 4E shows details of the lens elements of a fifth optical design in a first zoom state.
Figure 4F:
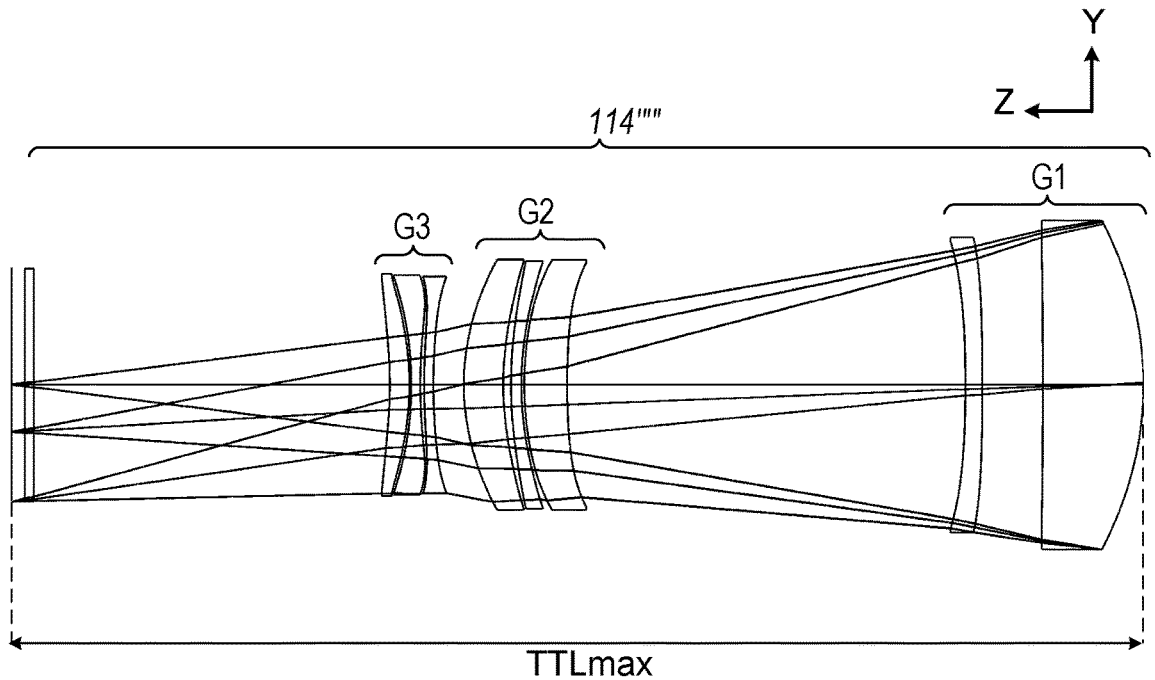
FIG. 4F shows details of the lens elements of the fifth optical design in a second zoom state.

FIG. 4E shows details of the lens elements of a fifth exemplary optical design in a folded Tele camera such as camera 103 in a first zoom state, while FIG. 4F shows details of the lens elements of the fifth optical design in a second zoom state. The figures show a lens 114'''', image sensor 118 and optional window 130. The second optical design is represented by Tables 17-20 and includes eight lens elements marked L1-L8, starting with L1 on an object side facing the prism and ending with L8 on an image side toward the image sensor. Table 17 provides optical data, Table 18 provides zoom data, Table 19 provides aspheric data and Table 20 provides lens or group focal length in mm.

In the fifth example ("Example 5"), in lens 114'''', lens elements L1-L8 are grouped into three groups: a first group G1 comprising lens elements L1 and L2, a second group G2 comprising lens elements L3-L5, and a third group comprising lens elements L6-L8.

In Example 5, the camera is brought into two zoom states by moving lens groups G1 and G3 together (as one unit also referred to as "G1G3 assembly") relative to the image sensor in a given range $R_{1,3}$ while G2 is stationary relative to the image sensor. In Example 5, $R_{1,3}$=7.697 mm, the G1G3 assembly is further movable together at any zoom state relative to the image sensor and G2 in a range $R_{AF}$ for changing the focal distance of camera 106 from infinity down to 2 meter. $R_{AF}$ may be up to 1.8 mm, depending on zoom state. FIG. 4E shows Example 5 in the first zoom state in which $EFL_T=EFL_{Tmin}$=15 mm, F #=F $\#_{Tmin}$=2 and $TTL_T=TTL_{Tmin}$=18.1 mm, and FIG. 4F shows Example 5 in the second zoom state in which $EFL_T=EFL_{Tmax}$=30 mm, F #=F $\#_{Tmax}$=4, and $TTL_T=TTL_{Tmax}$=25.8 mm.

In the first state, G1 is separated from G2 by a distance d4 (the distance between $S_4$ and $S_5$ in Table 18 for a case of 15 mm EFL), G2 is separated from G3 by a distance d10 (the distance between $S_{10}$ and $S_{11}$ in Table 18 for a case of 15 mm EFL) and G3 is separated from window 130 by a distance d16 (the distance between $S_{16}$ and $S_{17}$ in Table 18 for a case of 15 mm EFL). In the second state, G1 is separated from G2 by a distance d4' (the distance between $S_4$ and $S_5$ in Table 18 for a case of 30 mm EFL), G2 is separated from G3 by a distance d10' (the distance between $S_{10}$ and $S_{11}$ in Table 18 for a case of 30 mm EFL), and G3 is separated from window 130 by a distance d16' (the distance between $S_{16}$ and $S_{17}$ in Table 17 for a case of 30 mm EFL).

TABLE 17

| Group | Lens | Surface | Type | R [mm] | T [mm] | Nd | Vd | D [mm] |
|---|---|---|---|---|---|---|---|---|
| Object | | $S_0$ | Flat | Infinity | See Table 18 | | | |
| G1 | L1 | $S_1$ | QT1 | 7.595 | 2.293 | 1.4847 | 84.150 | 7.50 |
| G1 | L1 | $S_2$ | QT1 | 166.728 | 1.379 | | | 7.20 |
| G1 | L2 | $S_3$ | QT1 | 169.765 | 0.381 | 1.7978 | 22.463 | 6.73 |
| G1 | L2 | $S_4$ | QT1 | 30.296 | See Table 18 | | | 6.55 |
| G2 | L3 | $S_5$ | QT1 | −19.262 | 0.991 | 1.5348 | 55.660 | 5.61 |
| G2 | L3 | $S_6$ | QT1 | −7.798 | 0.067 | | | 5.71 |
| G2 | L4 | $S_7$ | QT1 | −7.423 | 0.235 | 1.6510 | 21.510 | 5.62 |
| G2 | L4 | $S_8$ | QT1 | −10.037 | 0.178 | | | 5.63 |
| G2 | L5 | $S_9$ | QT1 | −6.776 | 0.896 | 1.5348 | 55.660 | 5.62 |
| G2 | L5 | $S_{10}$ | QT1 | −5.279 | See Table 18 | | | 5.69 |
| G3 | L6 | $S_{11}$ | QT1 | −11.648 | 0.207 | 1.5348 | 55.660 | 4.95 |
| G3 | L6 | $S_{12}$ | QT1 | −16.086 | 0.091 | | | 4.95 |
| G3 | L7 | $S_{13}$ | QT1 | −14.227 | 0.203 | 1.5348 | 55.660 | 4.98 |
| G3 | L7 | $S_{14}$ | QT1 | 8.126 | 0.041 | | | 5.01 |

TABLE 17-continued

| Group | Lens | Surface | Type | R [mm] | T [mm] | Nd | Vd | D [mm] |
|---|---|---|---|---|---|---|---|---|
| G3 | L8 | $S_{15}$ | QT1 | 5.960 | 0.448 | 1.6510 | 21.510 | 5.03 |
| G3 | L8 | $S_{16}$ | QT1 | 8.873 | See Table 18 | | | 5.07 |
| Glass | | $S_{17}$ | Flat | Infinity | 0.210 | 1.5168 | 64.170 | |
| window | | $S_{18}$ | Flat | Infinity | 0.300 | | | |
| Image sensor | | $S_{19}$ | Flat | Infinity | 0 | | | |

TABLE 18

| Object position | First zoom state $EFL_T$ = 15 mm | | Second zoom state $EFL_T$ = 30 mm | |
|---|---|---|---|---|
| | at infinity | at 2 meter | at infinity | at 2 meter |
| Stop surface | S1 | | S1 | |
| T [mm] $S_0$ | Infinity | 1000 | Infinity | 1000 |
| $S_4$ | 1.377 | 1.853 | 9.074 | 7.308 |
| $S_{10}$ | 8.388 | 7.913 | 0.691 | 2.458 |
| $S_{16}$ | 0.415 | 0.890 | 8.112 | 6.345 |

TABLE 19

| Surface | Conic | NR | $A_0$ | $A_1$ | $A_2$ | $A_3$ | $A_4$ | $A_5$ |
|---|---|---|---|---|---|---|---|---|
| $S_1$ | 0 | 3.7 | −3.810E−02 | −2.313E−03 | −1.826E−04 | 0.000E+00 | 0.000E+00 | 0.000E+00 |
| $S_2$ | 0 | 3.7 | −1.050E−02 | 6.271E−04 | −4.206E−05 | 0.000E+00 | 0.000E+00 | 0.000E+00 |
| $S_3$ | 0 | 3.7 | 2.425E−01 | −4.719E−03 | 1.605E−03 | 0.000E+00 | 0.000E+00 | 0.000E+00 |
| $S_4$ | 0 | 3.7 | 2.621E−01 | −4.538E−03 | 1.794E−03 | 0.000E+00 | 0.000E+00 | 0.000E+00 |
| $S_5$ | 0 | 3.7 | −7.571E−01 | −2.386E−02 | 1.173E−02 | 0.000E+00 | 0.000E+00 | 0.000E+00 |
| $S_6$ | 0 | 3.7 | −3.239E−01 | −4.277E−02 | 1.470E−02 | 0.000E+00 | 0.000E+00 | 0.000E+00 |
| $S_7$ | 0 | 3.7 | 8.636E−02 | −6.570E−02 | −2.140E−02 | 0.000E+00 | 0.000E+00 | 0.000E+00 |
| $S_8$ | 0 | 3.7 | 1.137E−01 | −5.791E−02 | −2.009E−02 | 0.000E+00 | 0.000E+00 | 0.000E+00 |
| $S_9$ | 0 | 3.7 | 2.911E−01 | −9.503E−02 | 2.344E−04 | 0.000E+00 | 0.000E+00 | 0.000E+00 |
| $S_{10}$ | 0 | 3.7 | 1.470E−01 | −4.954E−02 | −3.365E−03 | 0.000E+00 | 0.000E+00 | 0.000E+00 |
| $S_{11}$ | 0 | 3.7 | 3.957E−01 | 3.980E−01 | 2.043E−01 | 0.000E+00 | 0.000E+00 | 0.000E+00 |
| $S_{12}$ | 0 | 3.7 | 1.263E+00 | 5.363E−03 | −8.070E−02 | 0.000E+00 | 0.000E+00 | 0.000E+00 |
| $S_{13}$ | 0 | 3.7 | 9.897E−01 | −2.343E−01 | −2.471E−01 | 0.000E+00 | 0.000E+00 | 0.000E+00 |
| $S_{14}$ | 0 | 3.7 | −3.191E−01 | −1.890E−01 | −3.206E−02 | 0.000E+00 | 0.000E+00 | 0.000E+00 |
| $S_{15}$ | 0 | 3.7 | −1.999E+00 | −7.518E−01 | −2.345E−01 | 0.000E+00 | 0.000E+00 | 0.000E+00 |
| $S_{16}$ | 0 | 3.7 | −1.561E+00 | −4.492E−01 | −1.770E−01 | 0.000E+00 | 0.000E+00 | 0.000E+00 |

TABLE 20

| Lens # | Lens or group focal length [mm] |
|---|---|
| L1 | 16.31 |
| L2 | −45.91 |
| L3 | 23.68 |
| L4 | −45.03 |
| L5 | 36.78 |
| L6 | −79.93 |
| L7 | −9.60 |
| L8 | 26.08 |
| G1 | 22.79 |
| G2 | 21.82 |
| G3 | −12.37 |

Figure 4G:
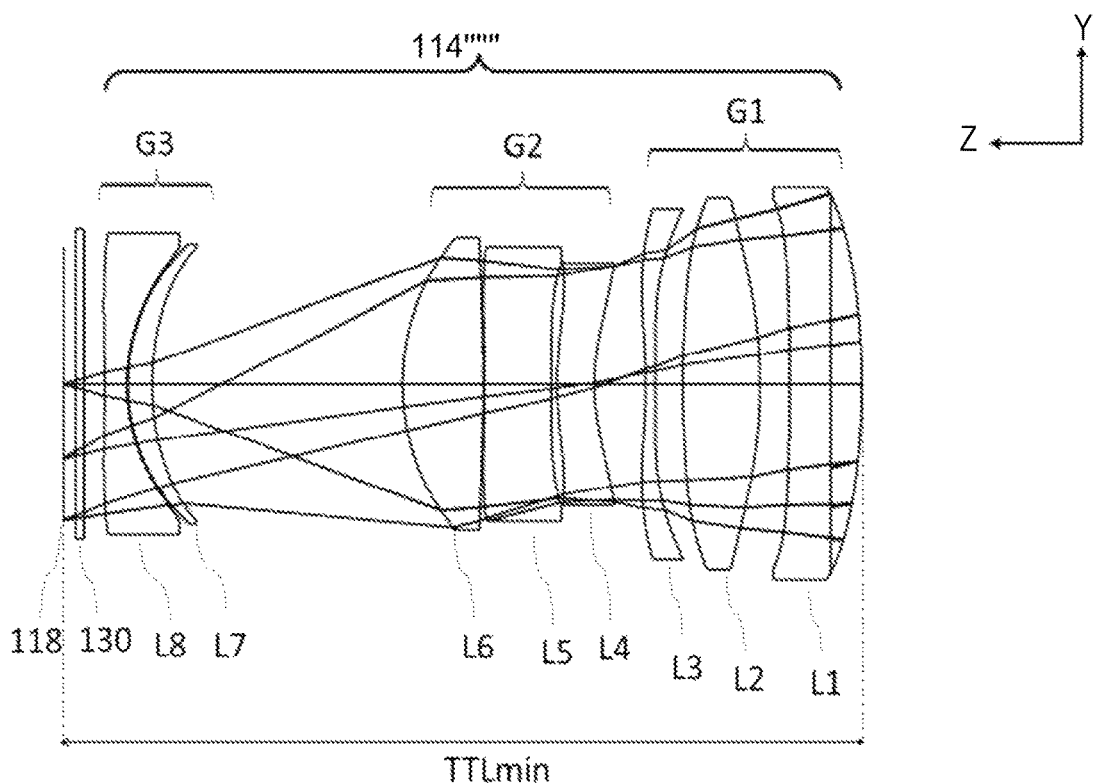
FIG. 4G shows details of the lens elements of a sixth optical design in a first zoom state.
Figure 4H:
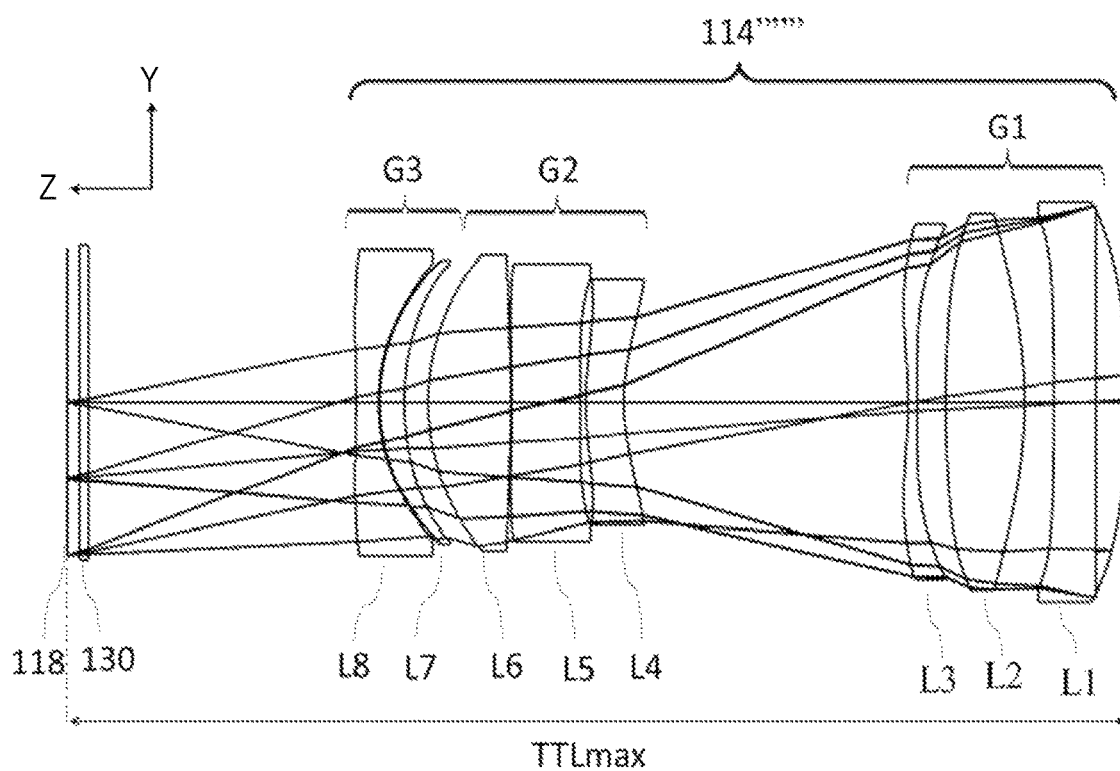
FIG. 4H shows details of the lens elements of the sixth optical design in a second zoom state.

FIG. 4G shows details of the lens elements of a sixth embodiment of an exemplary optical design in a folded Tele camera such as camera 103 in a first zoom state, while FIG. 4H shows details of the lens elements of the sixth optical design in a second zoom state. The figures show a lens 114''''', image sensor 118 and optional window 130. The sixth optical design is represented by Tables 21-24 and includes eight lens elements marked L1-L8, starting with L1 on an object side facing the prism and ending with L8 on an image side toward the image sensor. Table 21 provides optical data, Table 22 provides zoom data, Table 23 provides aspheric data and Table 24 provides lens or group focal length in mm.

In lens 114''''' lens elements L1-L8 are grouped into three groups: a first group G1 comprising lens elements L1, L2 and L3, a second group G2 comprising lens elements L4, L5 and L6, and a third group comprising lens elements L7 and L8.

In Example 6, the camera is brought into two zoom states by moving G1 and G3 together (as one unit) relative to the image sensor in a given range $R_{1,3}$ while G2 moves in a range $R_2$ relative to the image sensor, whereas $R_2 < R_{1,3}$. In Example 6, $R_{1,3=5.641}$ mm and $R_{2=0.718}$. G1+G2+G3 is further movable together at any zoom state relative to the image sensor and in a range $R_{AF}$ for changing the focal distance of camera 106 from infinity down to 1 meter or down to 2 meter. $R_{AF}$ may be up to 0.4 mm, depending on zoom state.

FIG. 4G shows Example 6 in the first zoom state in which $EFL_T=EFL_{Tmin}=13$ mm, F #=F #$_{Tmin}$=1.8 and $TTL_T=TTL_{Tmin}=19.84$ mm, and FIG. 4H shows Example 6 in the second zoom state in which $EFL_T=EFL_{Tmax}=26$ mm, F #=F # Tmax=2.88, and $TTL_T=TTL_{Tmax}=25.85$ mm.

In the first state, G1 is separated from G2 by a distance d7 (the distance between $S_7$ and $S_8$ in Table 22 for a case of 13 mm EFL), G2 is separated from G3 by a distance d13 (the distance between $S_{13}$ and $S_{14}$ in Table 22 for a case of 13 mm EFL) and G3 is separated from window 130 by a distance d17 (the distance between $S_{17}$ and $S_{18}$ in Table 22 for a case of 13 mm EFL). In the second state, G1 is separated from G2 by a distance d7' (the distance between $S_7$ and $S_8$ in Table 22 for a case of 26 mm EFL), G2 is separated from G3 by a distance d13' (the distance between $S_{13}$ and $S_{14}$ in Table 22 for a case of 26 mm EFL), and G3 is separated from window 130 by a distance d17' (the distance between $S_{17}$ and $S_{18}$ in Table 21 for a case of 26 mm EFL).

TABLE 21

| Group | Lens | Surface | Type | R [mm] | T [mm] | Nd | Vd | D [mm] |
|---|---|---|---|---|---|---|---|---|
| Object | | $S_0$ | Flat | Infinity | See Table 2 | | | 9.000 |
| Stop | | $S_1$ | Flat | Infinity | −0.775 | | | |
| G1 | L1 | $S_2$ | QFORB type 1 | 17.302 | 1.786 | 1.5661 | 37.43 | 8.577 |
| G1 | L1 | $S_3$ | QFORB type 1 | 62.771 | 0.725 | | | 8.652 |
| G1 | L2 | $S_4$ | QFORB type 1 | 10.090 | 1.928 | 1.5449 | 55.91 | 8.557 |
| G1 | L2 | $S_5$ | QFORB type 1 | −23.147 | 0.689 | | | 8.086 |
| G1 | L3 | $S_6$ | QFORB type 1 | 80.507 | 0.232 | 1.6991 | 19.44 | 8.073 |
| G1 | L3 | $S_7$ | QFORB type 1 | 10.360 | See Table 2 | | | 5.509 |
| G2 | L4 | $S_8$ | QFORB type 1 | −4.430 | 0.928 | 1.5449 | 55.91 | 5.543 |
| G2 | L4 | $S_9$ | QFORB type 1 | −7.104 | 0.144 | | | 5.555 |
| G2 | L5 | $S_{10}$ | QFORB type 1 | 440.072 | 1.646 | 1.6991 | 19.44 | 6.397 |
| G2 | L5 | $S_{11}$ | QFORB type 1 | 28.935 | 0.033 | | | 6.494 |
| G2 | L6 | $S_{12}$ | QFORB type 1 | 39.391 | 2.010 | 1.5449 | 55.91 | 6.726 |
| G2 | L6 | $S_{13}$ | QFORB type 1 | −5.075 | See Table 2 | | | 6.322 |
| G3 | L7 | $S_{14}$ | QFORB type 1 | −6.250 | 0.601 | 1.6991 | 19.44 | 6.435 |
| G3 | L7 | $S_{15}$ | QFORB type 1 | −4.314 | 0.033 | | | 6.292 |
| G3 | L8 | $S_{16}$ | QFORB type 1 | −4.226 | 0.553 | 1.5449 | 55.91 | 6.944 |
| G3 | L8 | $S_{17}$ | QFORB type 1 | 45.368 | See Table 2 | | | 7.179 |
| Glass window | | $S_{18}$ | Flat | Infinity | 0.21 | 1.5168 | 64.17 | 7.235 |
| | | $S_{19}$ | Flat | Infinity | 0.3 | | | 7.000 |
| Image sensor | | $S_{20}$ | Flat | Infinity | 0 | | | 7.000 |

TABLE 22

| Object | First zoom state $EFL_T$ = 13 mm | | Second zoom state $EFL_T$ = 26 mm | |
|---|---|---|---|---|
| position | at infinity | at 1 meter | at infinity | at 2 meter |
| Stop surface | S8 | | S1 | |
| T [mm] $S_0$ | Infinity | 1000 | Infinity | 1000 |
| $S_7$ | 1.287 | 1.287 | 6.928 | 6.928 |
| $S_{13}$ | 6.224 | 6.224 | 0.584 | 0.584 |
| $S_{17}$ | 0.510 | 0.680 | 6.527 | 6.869 |

TABLE 23

| Surface | Conic (k) | NR | $A_2$ | $A_2$ | $A_3$ | $A_4$ |
|---|---|---|---|---|---|---|
| $S_2$ | 0 | 4.500 | 1.937E−01 | 3.246E−02 | 1.318E−03 | 2.280E−04 |
| $S_3$ | 0 | 4.500 | 2.594E−01 | 8.795E−02 | 5.484E−03 | 3.649E−03 |
| $S_4$ | 0 | 4.000 | −1.694E−01 | 7.487E−04 | −3.651E−03 | 1.653E−03 |
| $S_5$ | 0 | 4.000 | −8.607E−02 | −4.556E−02 | 9.328E−03 | −1.115E−04 |
| $S_6$ | 0 | 4.000 | −8.318E−01 | 8.107E−02 | −3.312E−03 | 1.627E−04 |
| $S_7$ | 0 | 3.600 | −7.475E−01 | 6.703E−02 | −6.921E−03 | 5.168E−04 |
| $S_8$ | 0 | 3.540 | 1.184E+00 | −7.816E−02 | 6.294E−03 | −5.495E−03 |
| $S_9$ | 0 | 3.540 | 1.068E+00 | −3.634E−02 | 4.046E−03 | −3.309E−03 |
| $S_{10}$ | 0 | 3.540 | −7.538E−01 | −8.548E−02 | −3.579E−02 | −4.211E−03 |
| $S_{11}$ | 0 | 3.540 | −3.354E−01 | 5.277E−03 | −9.014E−03 | −8.400E−04 |
| $S_{12}$ | 0 | 3.540 | −6.434E−02 | −5.113E−04 | 3.479E−04 | −1.573E−03 |
| $S_{13}$ | 0 | 3.540 | 5.865E−03 | 1.176E−03 | 3.052E−03 | 5.638E−04 |
| $S_{14}$ | 0 | 3.540 | −3.496E−01 | −4.291E−02 | −1.806E−02 | −1.974E−03 |
| $S_{15}$ | 0 | 3.540 | −9.519E−03 | 2.425E−02 | −8.039E−03 | −5.814E−03 |
| $S_{16}$ | 0 | 3.540 | 2.311E−01 | 7.899E−02 | 9.116E−03 | −5.414E−03 |
| $S_{17}$ | 0 | 3.540 | −2.319E−01 | 8.502E−03 | −2.231E−04 | −1.988E−04 |

TABLE 24

| Lens # | Lens or group focal length [mm] |
|---|---|
| L1 | 41.40 |
| L2 | 13.12 |
| L3 | −17.63 |
| L4 | −24.54 |
| L5 | −45.94 |
| L6 | 8.36 |
| L7 | 18.33 |
| L8 | −7.04 |
| G1 | 19.31 |

TABLE 24-continued

| Lens # | Lens or group focal length [mm] |
|---|---|
| G2 | 12.82 |
| G3 | −10.82 |

Figure 5A:
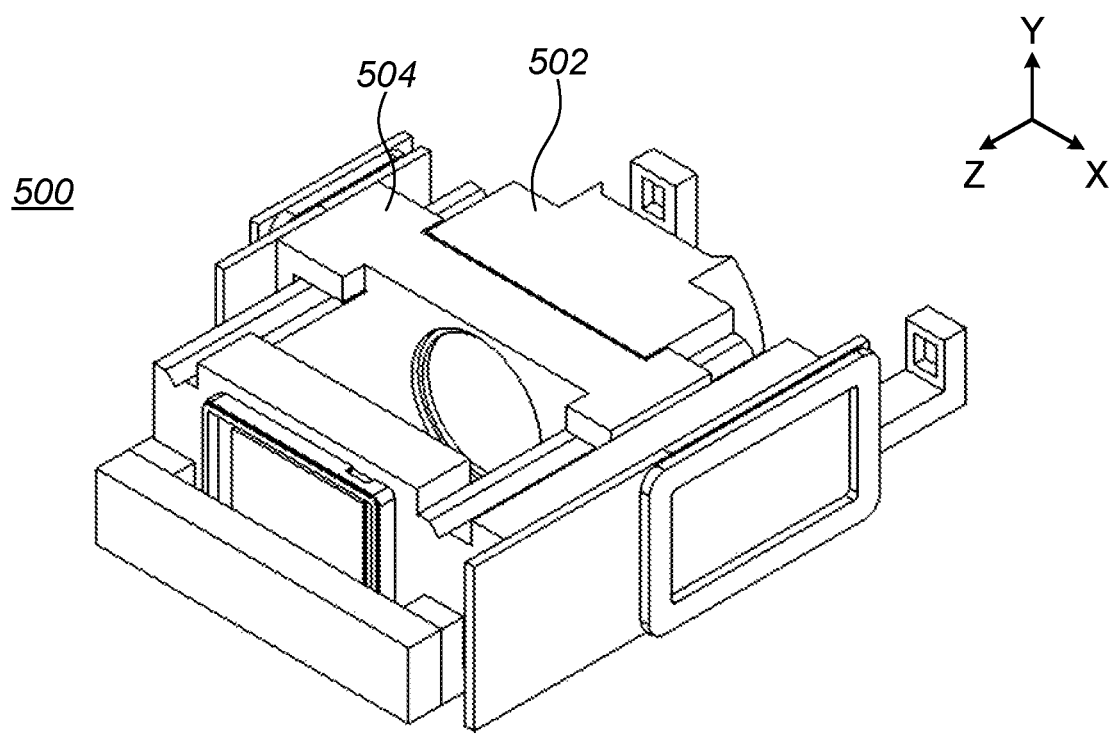
FIG. 5A shows schematically a first embodiment of a Tele lens and sensor module in an $EFL_{Tmin}$ state from a top perspective view.
Figure 5B:
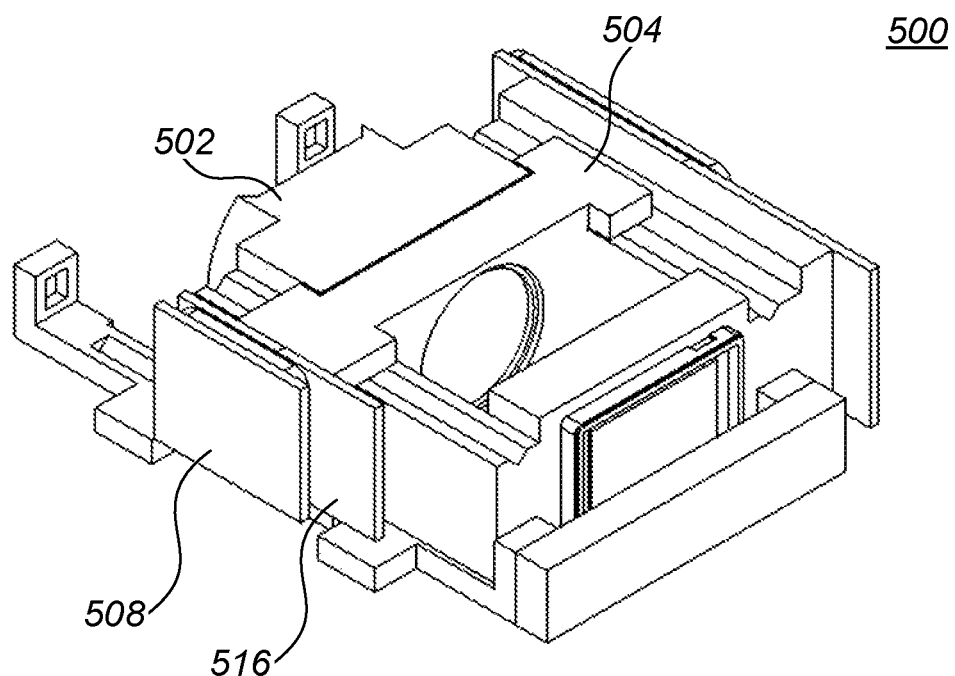
FIG. 5B shows schematically the Tele lens and sensor module of FIG. 5A from another top perspective view.
Figure 5C:
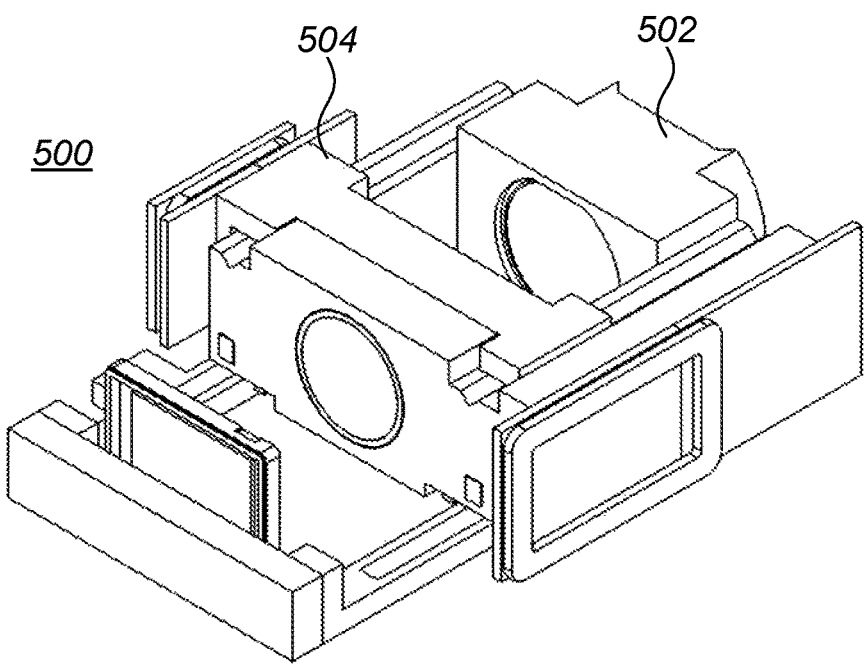
FIG. 5C shows schematically the Tele lens and sensor module in an $EFL_{Tmax}$ state from one top perspective view.
Figure 5D:
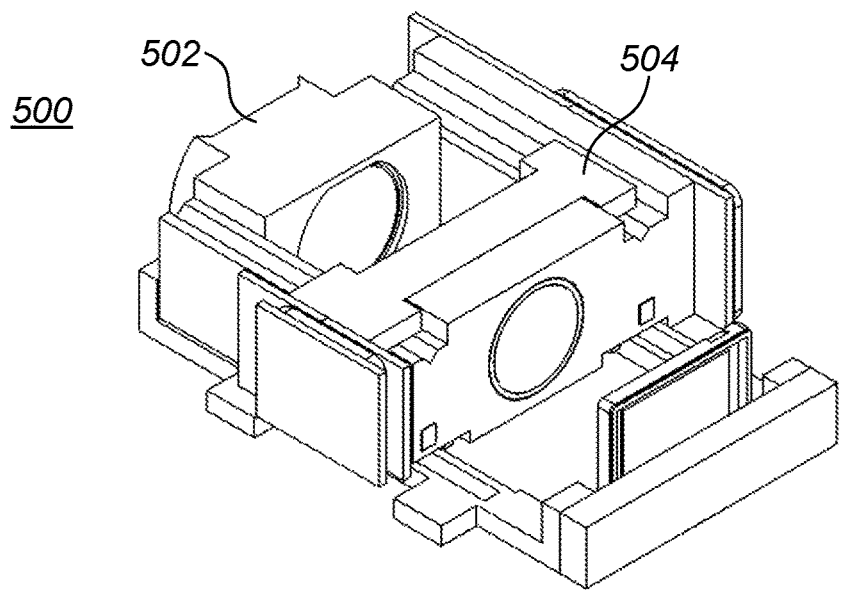
FIG. 5D shows schematically the Tele lens and sensor module of FIG. 5C from another top perspective view.
Figure 5E:
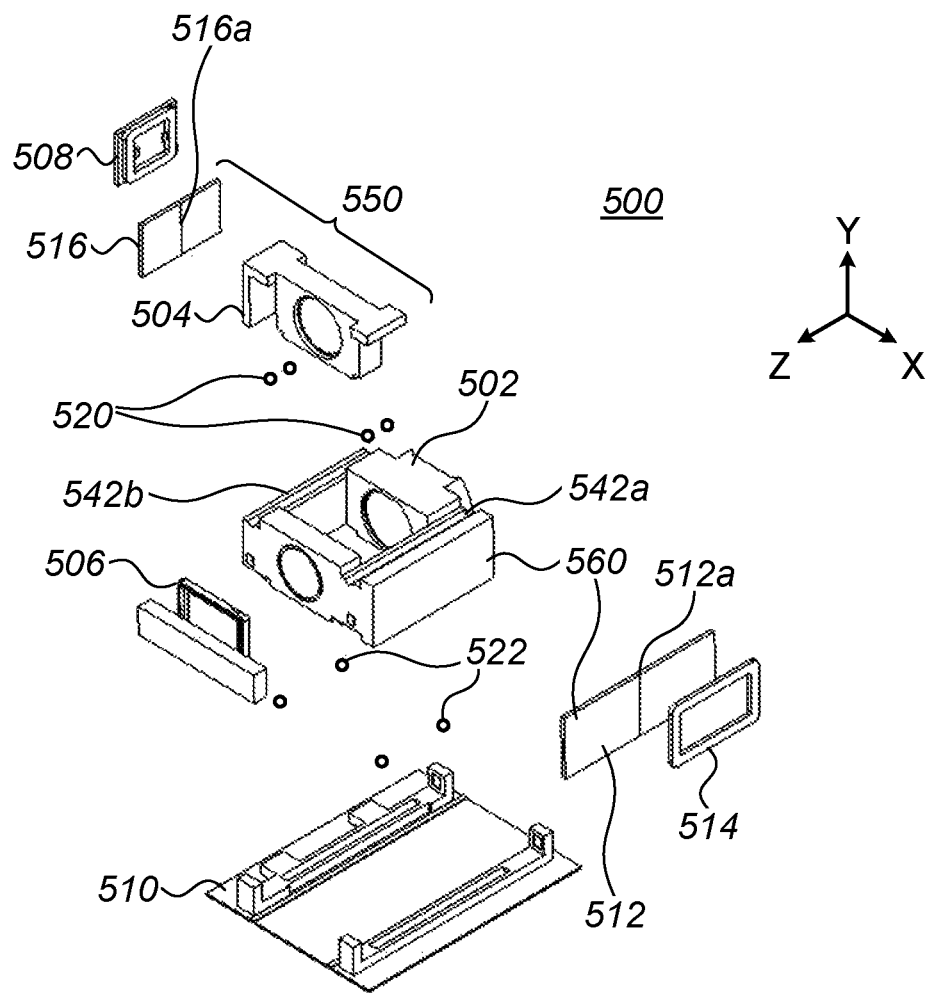
FIG. 5E shows an exploded view of the Tele lens and sensor module of FIGS. 5A-5D.

FIGS. 5A-E show schematically a first embodiment of a Tele lens and sensor module (or simply "module") numbered 500. The description of the figures continues with reference to a coordinate system XYZ shown in FIGS. 5A-E as well as in a number of other figures. In an example, module 500 has the optical design of the second example. Module 500 includes a VCM based actuation mechanism for changing between zoom states and focus states of lenses 114', 114'', 114''', 114'''', 114''''' and 114''''''. FIG. 5A shows schematically module 500 in an $EFL_{Tmin}$ state from a top perspective view, and FIG. 5B shows schematically module 500 in the $EFL_{Tmin}$ state from another top perspective view. FIG. 5C shows schematically module 500 in an $EFL_{Tmax}$ state from one top perspective view, and FIG. 5D shows schematically module 500 in the $EFL_{Tmax}$ state from another top perspective view. FIG. 5E shows an exploded view of module 500. Module 500 comprises a lens assembly 502

("G1G3 assembly"), a G2 lens assembly 504 ("G2 assembly"), a sensor assembly 506, an electro-magnetic (EM) assembly 508, a base assembly 510, a first magnet 512, a first coil 514, a second magnet 516, a first set of (exemplarily 4) balls 520 and a second set of (exemplarily 4) balls 522. Lens assemblies 502 and 504 share lens optical axis 116.

First coil 514 is positioned next to first magnet 512 and is rigidly coupled to (not moving relative to) base assembly 510. First coil 514 may be soldered to a PCB such as PCB 822 (FIG. 8), or routed to external circuitry (not shown) which allows sending input and output currents to first coil 514, the currents carrying both power and electronic signals required for operation. Coil 514 has exemplarily a rectangular shape and typically includes a few tens of coil windings (i.e. in a non-limiting range of 50-250), with a typical resistance of 10-30 ohm. First magnet 512 is a split magnet, such that a split line 512a in the middle separates it into two sides: in one side of split line 512a, magnet 512 has a north magnetic pole facing the positive X direction, and in the other side of split line 512a, magnet 512 has a south magnetic pole facing the positive X direction. Upon driving a current in first coil 514, a first Lorentz force is created on first magnet 512. In an example, a current flow through first coil 514 in a clockwise direction will induce a first Lorentz force in the positive Z direction on first magnet 512, while a current flow through first coil 512 in a counter clockwise direction will induce a Lorentz force in the negative Z direction on first magnet 512. In an example, first Lorentz force may be used to move bottom actuated assembly 560 from the first zoom state to the second zoom state and vice-versa in an open loop control, i.e. actuate bottom actuated assembly 560 between stops 720a-b and 722a-b (see below).

Figure 6A:
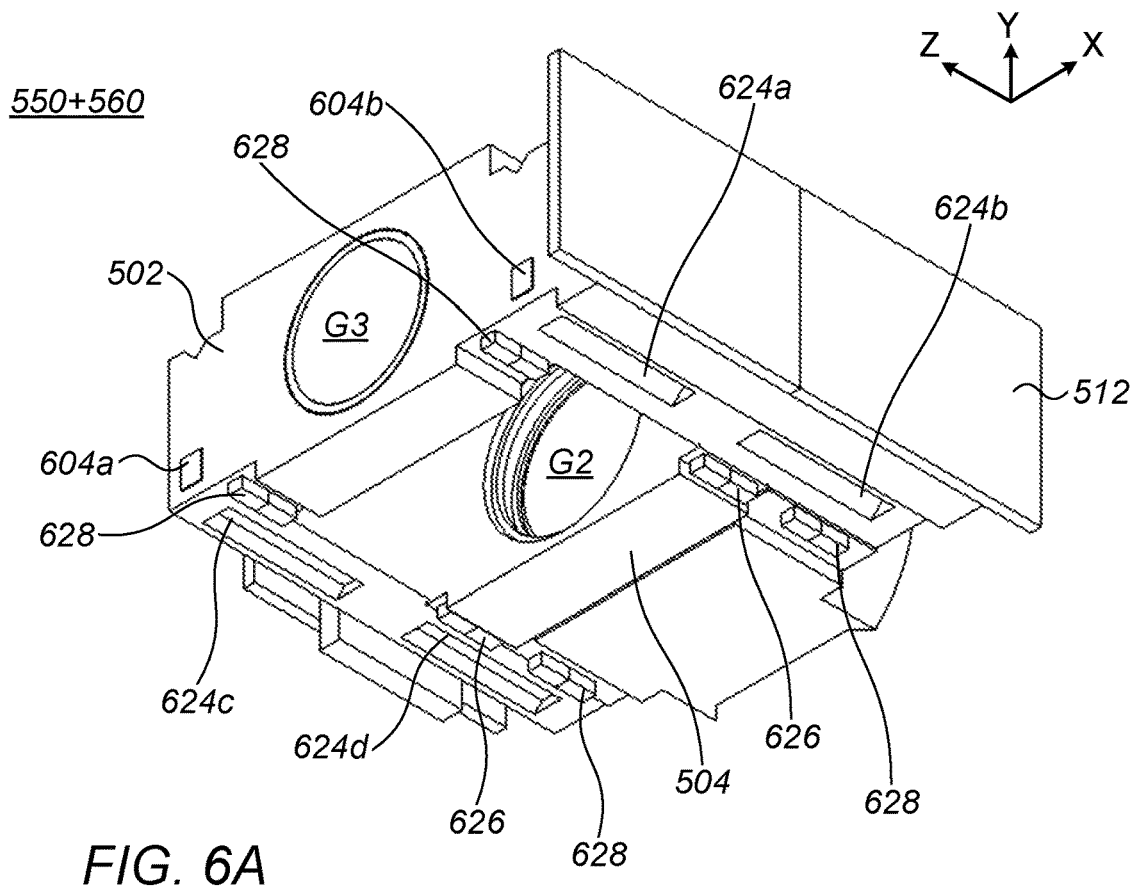
FIG. 6A shows a bottom view of the top and bottom actuated assemblies of the Tele lens and sensor module in the $EFL_{Tmin}$ state like in FIGS. 5A and 5B from one perspective.
Figure 6B:
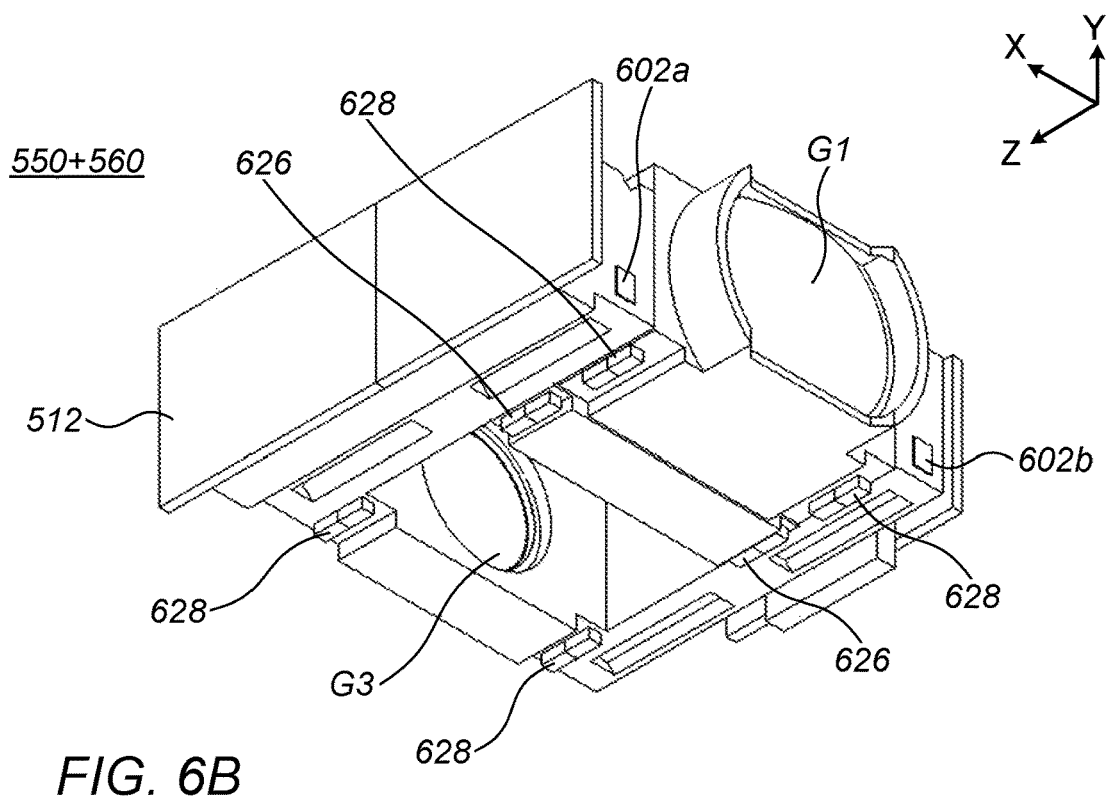
FIG. 6B shows a bottom view of the top and bottom actuated assemblies of the Tele lens and sensor module in the $EFL_{Tmax}$ state like in FIGS. 5C and 5D from another perspective.
Figure 6C:
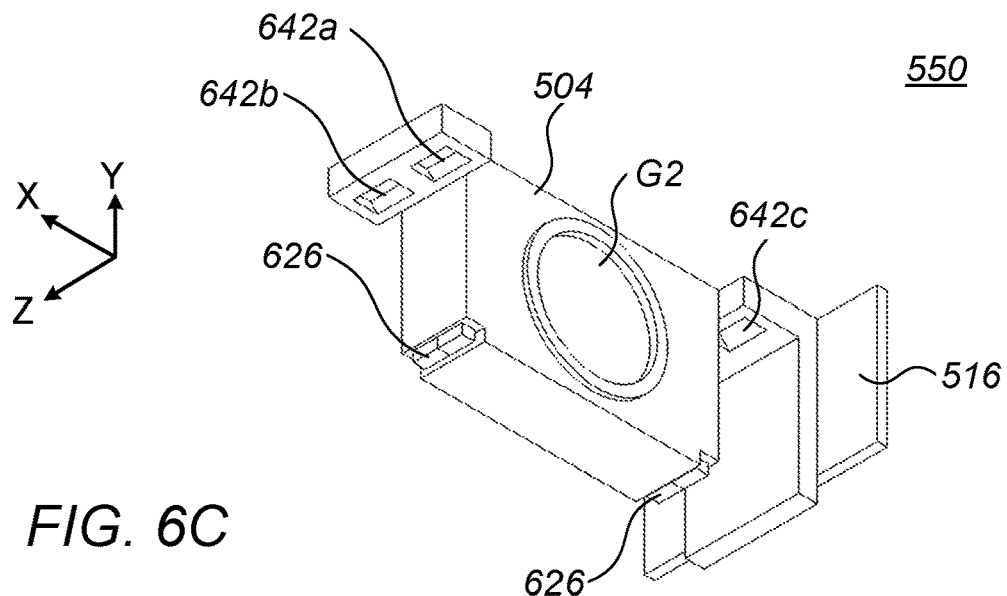
FIG. 6C shows the top actuated assembly from a bottom view.
Figure 7:
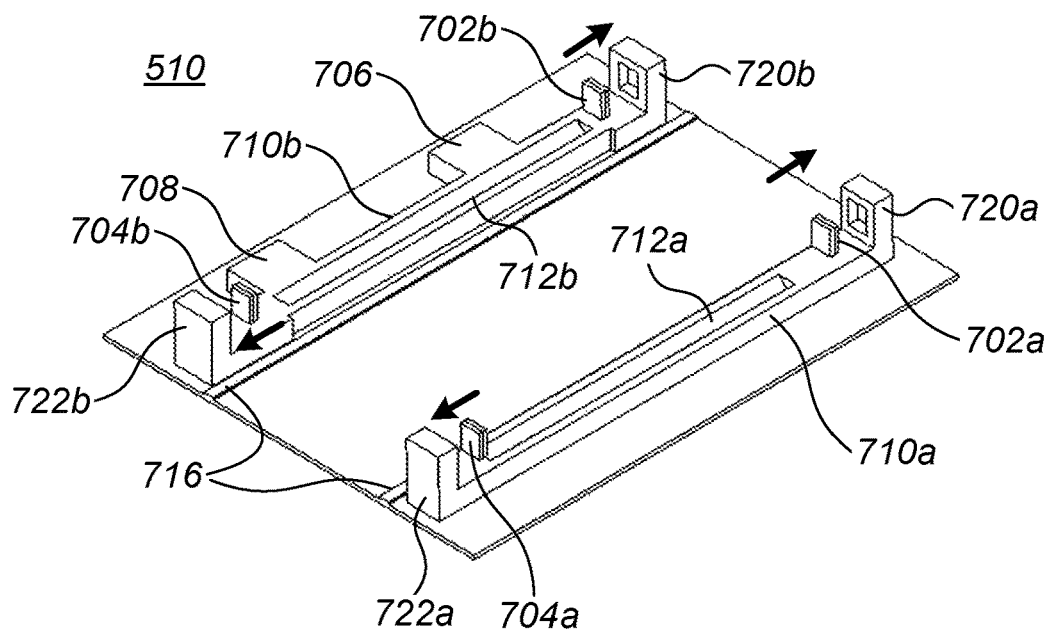
FIG. 7 shows details of stationary rails in the Tele lens and sensor module of FIGS. 5A-5E.

FIGS. 6A and 6B provide two bottom perspective views of actuated parts of module 500, showing a top actuated assembly 550 and a bottom actuated assembly 560 in the $EFL_{Tmin}$ state. FIG. 6C shows top actuated assembly 550 from a bottom perspective view. Top actuated assembly 550 comprises G2 assembly 504, second magnet 516 and a plurality of stepping magnets 626. Bottom actuated assembly 560 comprises G1G3 assembly 502, first magnet 512, stepping magnets 628 and four yokes 602a-b (FIG. 6B) and 604a-b (FIG. 6A). FIG. 7 shows details of base assembly 510, which comprises guiding rails 710a and 710b and pull-stop magnets 702a-b and 704a-b. Note that in FIG. 7, pull-stop magnets 702a-b and 704a-b are separated from stops 720a-b and 722a-b for illustration purposes. Arrows show the gluing position of pull-stop magnets 702a-b and 704a-b in stops 720a-b and 722a-b. Yokes 602a-b are pulled against pull-stop magnets 702a-b and yokes 604a-b are pulled against pull-stop magnets 704a-b. Each of guiding rails 710a-b comprises a respective groove 712a-b. Base assembly 510 further comprises two mechanical stops 706 and 708, which are exemplarily connected to guiding rail 710b. Mechanical stops 706 and 708 limit the stroke of top actuated assembly 550. FIG. 8 shows details of EM assembly 508 on PCB 822.

In an example, module 500 enables a relative motion of lens assemblies 502 and 504 in a direction along lens optical axis 116. Module 500 has exemplary length/width/height dimensions in the range of 3-40 mm, i.e. module 500 can be contained in a box with dimension of 3×3×3 mm³ to 40×40×40 mm³. In an example, module 500 has a height (along Y axis) which is limited by the maximal clear apertures of lens elements L1 ... LN plus the plastic thickness of respective lens assemblies 502 and 504 (the plastic thickness is for example in the range 0.5-1.5 mm), plus the thickness of shield 107 (the shield thickness is for example in the range 0.1-0.3 mm), plus the thickness of two air gaps between respective lens assemblies 502 and 504 and shield 107 (each air gap thickness is for example in the range of 0.05-0.15 mm). The clear aperture of lens elements L1 ... LN may be a circular or cut-lens clear aperture, as described below.

In module 500, the three lens groups (G1, G2 and G3) are held in two lens sub-assemblies: the G1G3 assembly (502) and the G2 lens assembly (504). Lens assemblies 502 and 504 are typically made of plastic. In some embodiments, lens assembly 502 and G1+G3 may be manufactured a single part (and similarly lens assembly 504 and G2 may be manufactured as a single part). In some embodiments, they may be separate parts. Lens assemblies 502 and 504 may be made, for example, by plastic molding, or alternatively by other methods. First and second magnets 512 and 516 are fixedly attached (e.g. glued) to lens assemblies 502 and 504, respectively, from two opposite sides across lens optical axis 116 (X direction).

Lens assembly 502 includes several grooves, defining a mechanical ball-guided mechanism, allowing actuation in a linear rail for the zoom needs. In this example, six grooves are described, but another number of grooves may be used: two grooves 542a-b (FIG. 5E) on a top surface of lens assembly 502 along the Z direction, and four grooves 624a-d (FIG. 6A) on a bottom surface of lens assembly 502, along the Z direction as well. Lens assembly 504 includes several groves, mating with some of the grooves of lens assembly 502. In the embodiment shown, lens assembly 504 includes four grooves 642a-d, only three of which are seen in FIG. 6C. Grooves 642a-d are parallel to each other, are along the Z-axis (optical axis), and are used to guide top actuated assembly 550 along the Z direction.

Top actuated assembly 550 is positioned on top of bottom actuated assembly 560 such that grooves 642a-b (642c-d) are right above and parallel to grooves 542a (542b).

In the embodiment shown, four balls 520 are positioned on top of grooves 542a-b (two balls on top of each groove) and below grooves 642a-d (FIG. 6C), such that balls 520 separate lens assembly 502 and lens assembly 504 and prevent the two parts from touching each other. In other embodiments, module 500 may have more than four balls between lens assemblies 502 and 504, for example up to 7 balls per side or up to 14 balls in total. Balls 520 may be made from aluminum oxide or another ceramic material, from a metal or from a plastic material. Typical ball diameters may be in a non-limiting range of 0.3-1 mm. Other ball sizes and positioning considerations may be, as in co-owned international PCT patent application PCT/IB2017/052383 titled "Rotational Ball Guided Voice Coil Motor".

Since lens assemblies 502 and 504 are exemplarily plastic molded, there is some tolerance allowed in part dimensions, typically a few tens of microns or less for each dimension. This tolerance may lead to positional misalignment between adjacent (facing) grooves 542a-b and 642a-d. To better align the grooves, some grooves (e.g. 542a-b and 642c-d) may be V-shaped, i.e. have a V cross section shape to ensure ball positioning, while grooves 642a-b may have a wider, trapezoid cross-section. Grooves 542b and 642c-d are aligned during assembly, while the alignment of grooves 542a and 642a-b have a small clearance due to the trapezoid cross section of the latter grooves. The trapezoid groove cross sections are just exemplary, and other groove cross section shapes may be used (e.g. rectangular, flat, etc.), such that one pair of grooves is well aligned by the groove shape and the other pair of grooves has clearance of alignment.

The design presented herein may allow accurate alignment of the three lens element groups. G1 and G3 are well aligned to each other since they are mechanically fixed to the same part and may maintain alignment during product lifecycle. In some embodiments, lens assembly 504 is molded as one part and the alignment of G1 to G3 is based on the plastic molding tolerances. In some embodiments lens assembly 504 is molded as several parts which are glued in the factory using active or passive alignment procedures. G2 is aligned to G1 and G3 using a single groove pair (542b and 642c and/or 642d), i.e. lens assemblies 502 and 504 are aligned to each other without intermediate parts.

Four balls 522 are positioned on top of grooves 712a-b (two balls on top of each groove) and below grooves 624a-d such that balls 522 separate lens assembly 502 from base assembly 510 and prevent the two parts from touching each other. In other embodiments, module 500 may have more than four balls, for example up to 7 balls per side or up to 14 balls in total. The size, material and other considerations related to balls 522 are similar to those of balls 520. Other considerations regarding grooves 712a-b and 624a-d are similar to those of grooves 542a-b and 642a-d as described above.

Module 500 further includes several ferromagnetic yokes 716 (FIG. 7) fixedly attached (e.g. glued) to base assembly 510 such that each yoke is positioned below (along Y direction) three of stepping magnets 626 and 628. In other embodiments, ferromagnetic yokes 716 may be a fixedly part of shield 107. In yet other embodiments, shield 107 by itself may be made from ferromagnetic material, or the bottom part of shield 107 may be made of ferromagnetic material, such that the yoke(s) is (are) part of the shield. Each ferromagnetic yoke 716 pulls some of stepping magnets 626 or 628 by magnetic force in the negative Y direction, and thus all yokes prevent both top actuated assembly 550 and bottom actuated assembly 560 from detaching from each other and from base 510 and shield 107. Balls 520 prevent top actuated assembly 550 from touching bottom actuated assembly 560 and balls 522 prevent bottom actuated assembly 560 from touching base assembly 510. Both top actuated assembly 550 and bottom actuated assembly 560 are thus confined along the Y-axis and do not move in the Y direction. The groove and ball structure further confines top actuated assembly 550 and bottom actuated assembly 560 to move only along lens optical axis 116 (Z-axis).

FIG. 7 shows details of base assembly 510 and stationary rails in module 500. Along the Z direction, top actuated assembly 550 is limited to move between mechanical stops 706 and 708, with a distance equal to the required stroke of G2 (about 1-3 mm) between them. Also, along the Z direction, bottom actuated assembly 560 is limited to move between mechanical stops 720a-b and 722a-b, and/or pull-stop magnets 702a-b and 704a-b.

FIG. 8 shows details of EM assembly 508 in module 500. EM assembly 508 includes second coil 818, two Hall bar elements ("Hall sensors") 834a and 834b and a PCB 822. Second Coil 818 and Hall bar elements 834a-b may be soldered (each one separately) to PCB 822. Second Coil 818 has exemplarily a rectangular shape and typically includes a few tens of coil windings (e.g. in a non-limiting range of 50-250), with a typical resistance of 10-40 ohms. PCB 822 allows sending input and output currents to second coil 818 and to Hall bar elements 834a-b, the currents carrying both power and electronic signals required for operation. PCB 822 may be connected electronically to the external camera by wires (not shown). In an example (FIG. 5E), EM assembly 508 is positioned next to second magnet 516. Second magnet 516 is a split magnet, separated by a split line 516a in the middle into two sides: in one side of split line 516a, magnet 516 has a north magnetic pole facing the positive X direction, and in the other side of split line 516a, magnet 516 has a south magnetic pole facing the positive X direction. Upon driving a current in second coil 818, a Lorentz force is created on second magnet 516. In an example, a current flow through second coil 818 in a clockwise direction will induce a Lorentz force in the positive Z direction on second magnet 516, while a current flow through second coil 818 in a counter clockwise direction will induce a Lorentz force in the negative Z direction on second magnet 516.

Hall bar elements 834a-b are designed to measure magnetic the field in the X direction (intensity and sign) in the center of each Hall bar element. Hall bar elements 834a-b can sense the intensity and direction of the magnetic field of second magnet 516. In an example, the positioning of Hall bar element 834a on PCB 822 is such that:

1. In the X direction, both Hall bar elements 834a and 834b are separated from magnet 516 by a distance (e.g. 0.1-0.5 mm), the distance being constant while magnet 516 is moving for zoom or focus needs.
2. When the system is in a first zoom state ($EFL_T=15$ mm), Hall bar element 834a is close to split line 516a along the Z direction. For example, for all focus positions in the first state zoom (infinity to 1 meter Macro continuously), Hall element 834a is distanced along the Z direction from split line 516a by up $R_{AF}$.
3. When the system is in a second zoom state ($EFL_T=30$ mm), Hall bar element 834b is close to split line 516a along the Z direction. For example, for all focus positions in the first state zoom (infinity to 1 meter Macro continuously), Hall element 834b is distanced along the Z direction from split line 516a by up $R_{AF}$.

In such a positioning scheme, Hall bar element 834a can measure the respective position of second magnet 516 along the Z direction when the system is in the first zoom state, since in the first zoom state the X direction magnetic field has measurable gradient on Hall bar 834a trajectory along $R_{AF}$ between focus positions of infinity to 1 meter focus, and X direction magnetic field may be correlated to position. In addition Hall bar element 834b can measure the respective position of second magnet 516 along the Z direction when the system is in the second zoom state, since in the second zoom state the X direction magnetic field has measurable gradient on Hall bar 834b trajectory along $R_{AF}$ between focus positions of infinity to 1 meter focus, and X direction magnetic field may be correlated to position. A control circuit (not shown) may be implemented in an integrated circuit (IC) to control in closed loop the position of second magnet 516 relative to EM assembly 508 (and to base assembly 510 to which EM assembly 508 is rigidly coupled) while operating in either zoom states, and in open loop while traveling between zoom state (see FIG. 10 and description below) In some cases, the IC may be combined with one or both Hall elements 834a-b. In other cases, the IC may be a separate chip, which can be located outside or inside module 500 (not shown). In exemplary embodiments, all electrical connections required by module 500 are connected to EM assembly 508, which is stationary relative to base assembly 510 and to the external world. As such, there is no need to transfer electrical current to any moving part.

Figure 10:
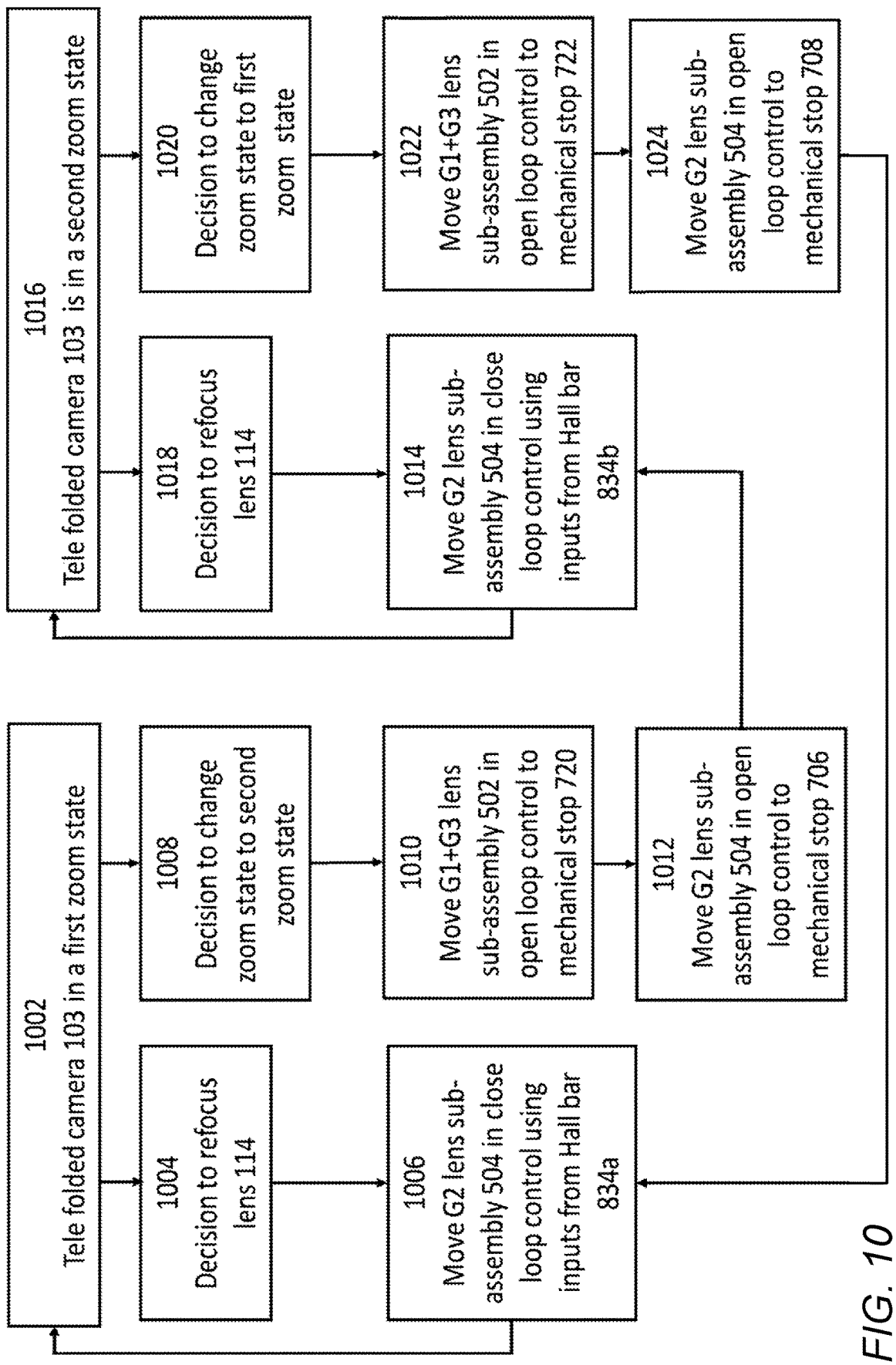
FIG. 10 illustrates in a flow chart an exemplary method for operating a zoom folded camera disclosed herein.

The magneto-electrical design of module 500 allows the following method of operation for operating folded Tele camera 103. FIG. 10 illustrates such an exemplary method in a flow chart. In step 1002, Tele camera 103 is positioned with lens 114 in one (e.g. a first) zoom state. A decision (by a user or an algorithm) to refocus Tele lens 114 is made in step 1004, and G2 assembly 504 is moved under closed loop control (by a controller—not shown) using inputs from Hall bar element 834a to bring Tele camera 103 into another focus position in the first zoom state. A decision (by a user or an algorithm) to change the zoom state of lens 114 of camera 103 to another (e.g. a second) zoom state is made in step 1008, and G1G3 assembly 502 is moved under open loop control to mechanical stop 720 in step 1010, followed by movement of G2 assembly 504 under open loop control to mechanical stop 706 in step 1012. G2 assembly 504 is then moved under closed loop control using inputs from Hall bar element 834b in step 1014 to bring Tele folded camera 103 into the second zoom state in yet another focus position in step 1016. A decision to refocus lens 114 is made in step 1018. The refocusing of lens 114 in the second zoom state is performed by moving G2 assembly under closed loop control using inputs from Hall bar element 834b. A decision (by a user or an algorithm) to change the second zoom state of lens 114 of camera 103 to the first zoom state is made in step 1020, and G1G3 assembly 502 is moved under open loop control to mechanical stop 722 in step 1022, followed by movement of G2 assembly 504 under open loop control to mechanical stop 708 in step 1024.

In some embodiments, the two surfaces $S_{2i-1}$, $S_{2i}$ of any lens element $L_i$ may have two apertures that include two cuts (facets). In such a case, lens element $L_i$ is referred to as a "cut lens element". The cuts enable the lens assembly to be lower and/or shorter. In an example, FIG. 9A shows a lens element 902 having axial symmetry and a height $H_{902}$, and FIG. 9B shows a cut lens element 904 with two cuts 906 and 908 and with height $H_{904}$. Lens elements 902 and 904 have the same diameter D. Evidently $H_{904}<H_{902}$. In an example shown in FIG. 5, the first two lens elements ($L_1$ and $L_2$) are cut lens elements.

As explained below, a clear height value $CH(S_k)$ can be defined for each surface $S_k$ for $1 \le k \le 2N$), and a clear aperture value $CA(S_k)$ can be defined for each surface $S_k$ for $1 \le k \le 2N$). $CA(S_k)$ and $CH(S_k)$ define optical properties of each surface $S_k$ of each lens element.

Figure 11A:
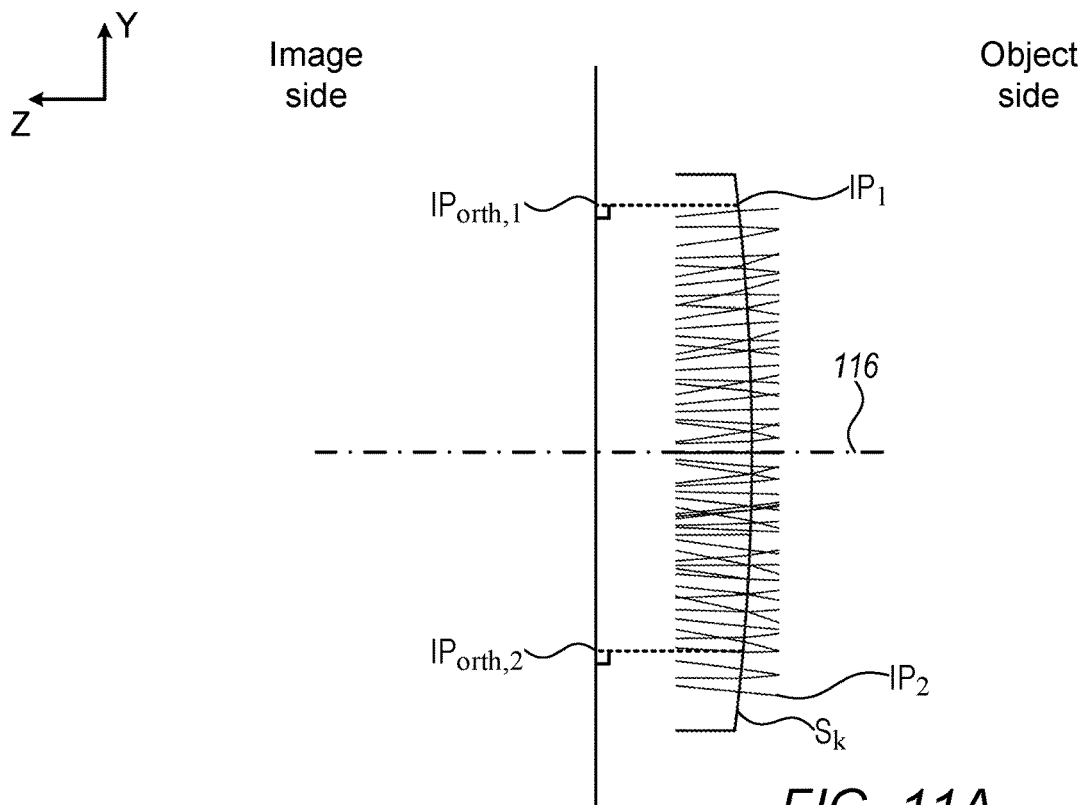
FIG. 11A is a schematic view of impact points of optical rays impinging a convex surface of a lens element, and a schematic view of the orthogonal projection of the impact points on a plane P, according to some examples of the presently disclosed subject matter.
Figure 11B:
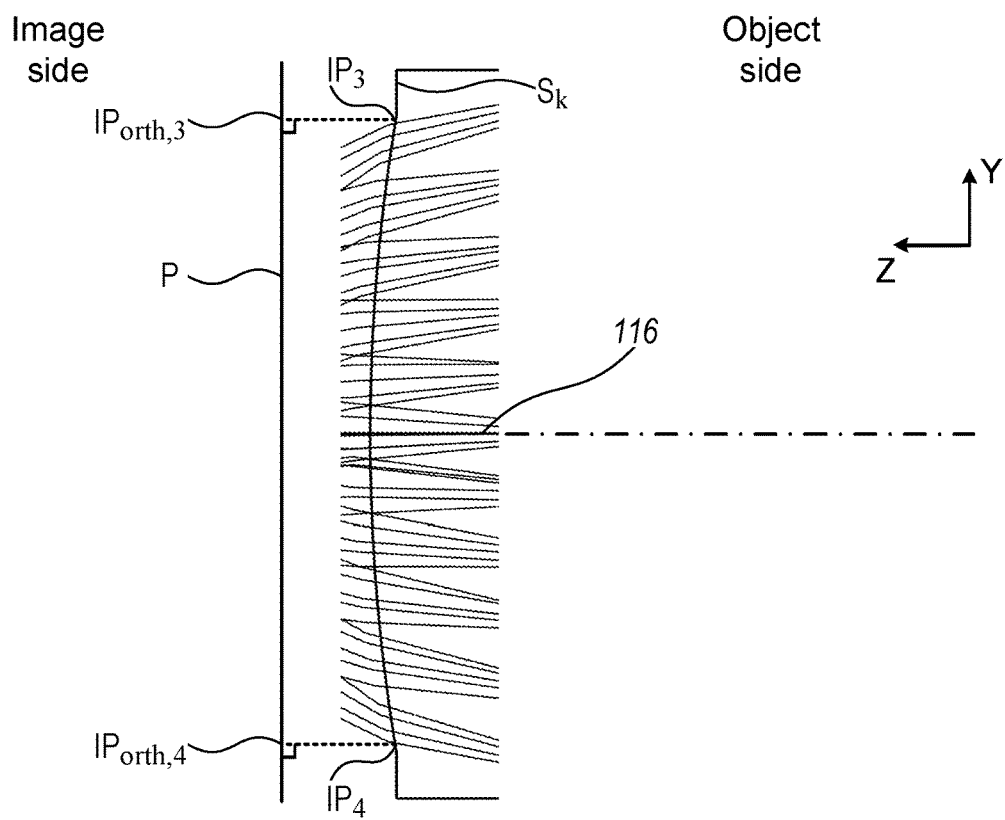
FIG. 11B is a schematic view of impact points of optical rays impinging a concave surface of a lens element, and a schematic view of the orthogonal projection of the impact points on a plane P, according to some examples of the presently disclosed subject matter.
Figure 12:
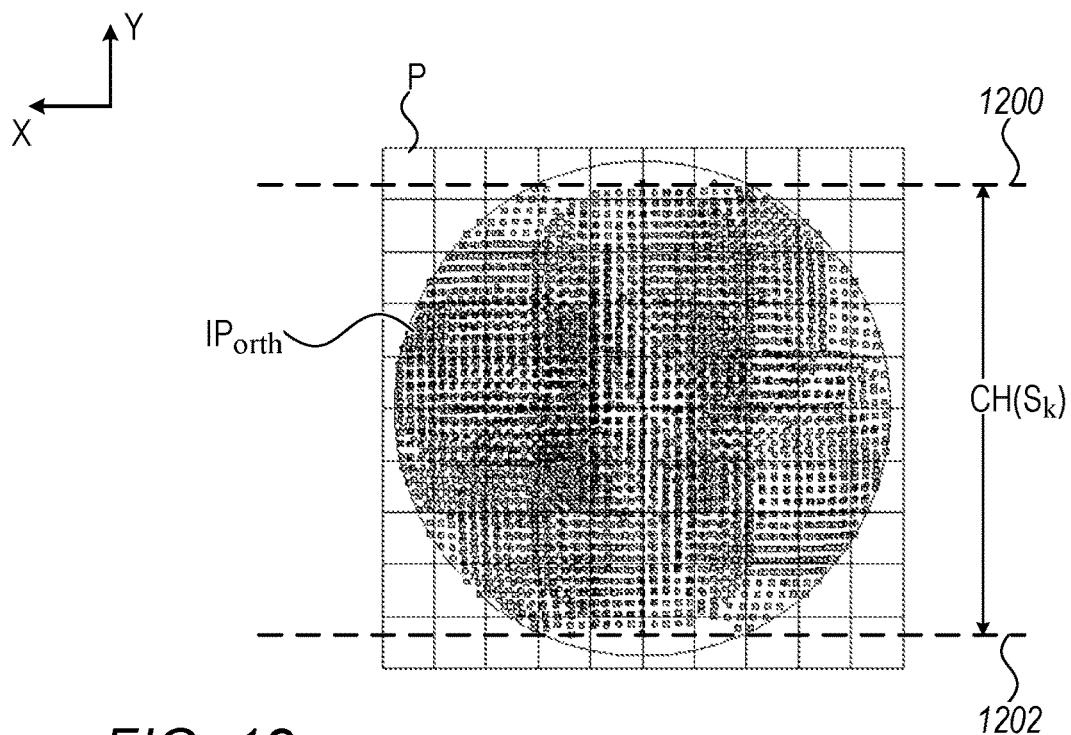
FIG. 12 is a schematic representation of the orthogonal projection of the impact points on a plane P, and of a clear height value ("CH"), according to some examples of the presently disclosed subject matter.

As shown in FIGS. 11A, 11B and 12, each optical ray that passes through a surface $S_k$ (for $1 \le k \le 2N$) impinges this surface on an impact point IP. Optical rays enter the lens module (e.g. 114', 114'', 114''') from surface $S_1$, and pass through surfaces $S_2$ to $S_{2N}$ consecutively. Some optical rays can impinge on any surface $S_k$ but cannot/will not reach image sensor 118. For a given surface $S_k$, only optical rays that can form an image on image sensor 118 are considered forming a plurality of impact points IP are obtained. $CH(S_k)$ is defined as the distance between two closest possible parallel lines (see lines 1200 and 1202 in FIG. 12 located on a plane P orthogonal to the optical axis of the lens elements (in the representation of FIGS. 11A and 11B, plane P is parallel to plane X-Y and is orthogonal to optical axis 116), such that the orthogonal projection $IP_{orth}$ of all impact points IP on plane P is located between the two parallel lines. $CH(S_k)$ can be defined for each surface $S_k$ (front and rear surfaces, with $1 \le k \le 2N$).

The definition of $CH(S_k)$ does not depend on the object currently imaged, since it refers to the optical rays that "can" form an image on the image sensor. Thus, even if the currently imaged object is located in a black background which does not produce light, the definition does not refer to this black background since it refers to any optical rays that "can" reach the image sensor to form an image (for example optical rays emitted by a background which would emit light, contrary to a black background).

For example, FIG. 11A illustrates the orthogonal projections $IP_{orth,1}$, $IP_{orth,2}$ of two impact points $IP_1$ and $IP_2$ on plane P which is orthogonal to optical axis 116. By way of example, in the representation of FIG. 11A, surface $S_k$ is convex.

FIG. 11B illustrates the orthogonal projections $IP_{orth,3}$, $IP_{orth,4}$ of two impact points $IP_3$ and $IP_4$ on plane P. By way of example, in the representation of FIG. 3B, surface $S_k$ is concave.

In FIG. 12, the orthogonal projection $IP_{orth}$ of all impact points IP of a surface $S_k$ on plane P is located between parallel lines 1200 and 1202. $CH(S_k)$ is thus the distance between lines 1200 and 1202.

Figure 13:
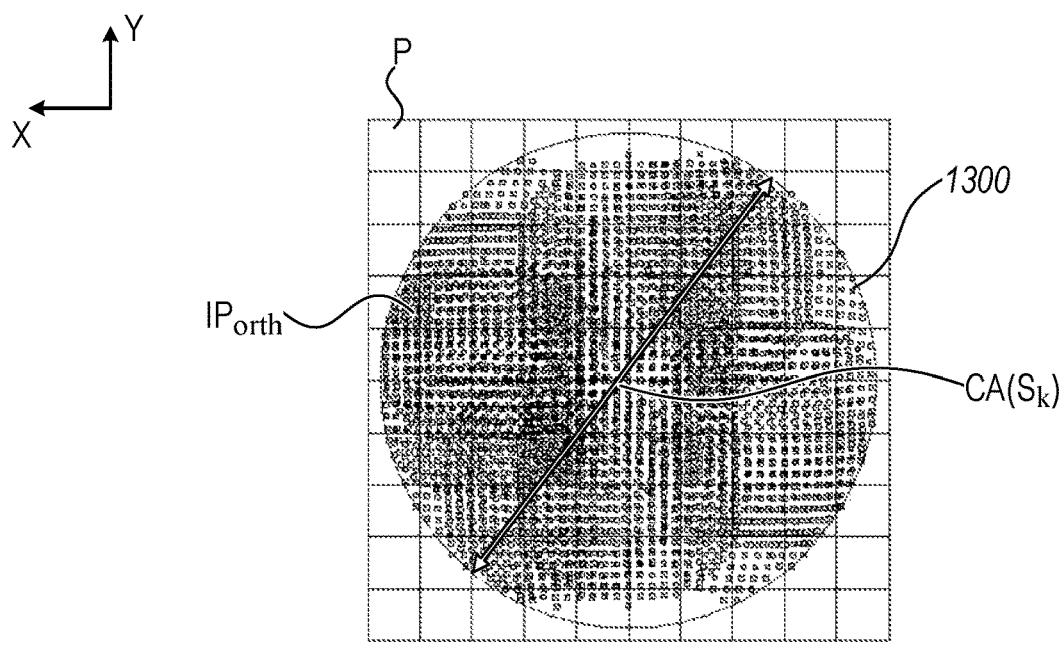
FIG. 13 is a schematic representation of the orthogonal projection of the impact points on a plane P, and of a clear aperture, according to some examples of the presently disclosed subject matter.

Attention is drawn to FIG. 13. According to the presently disclosed subject matter, a clear aperture $CA(S_k)$ is defined for each given surface $S_k$ (for $1 \le k \le 2N$), as the diameter of a circle, wherein the circle is the smallest possible circle located in a plane P orthogonal to the optical axis 116 and encircling all orthogonal projections $IP_{orth}$ of all impact points on plane P. As mentioned above with respect to $CH(S_k)$, it is noted that the definition of $CA(S_k)$ also does not depend on the object which is currently imaged.

As shown in FIG. 13, the circumscribed orthogonal projection $IP_{orth}$ of all impact points IP on plane P is circle 1300. The diameter of this circle 1300 defines $CA(S_k)$.

In conclusion, zoom cameras disclosed herein are designed to overcome certain optical challenges as follows:

A lens design where $EFL_{Tmax}>1.8 \times EFL_{Tmin}$ or $EFL_{Tmax}>1.5 \times EFL_{Tmin}$ ensures that by switching between the zoom states a user experiences a significant difference in optical zoom.

In some embodiments (e.g. Example 1), $TTL_{Tmax}<EFL_{Tmax}$. In some embodiments (e.g. Examples 2 and 3), $TTL_{Tmax}<0.9 \times EFL_{Tmax}$. Such a lens design may reduce camera length (along the Z axis).

In some embodiments (Examples 1-3), the first lens element has a clear aperture (diameter of S1) larger than that of all other lens element clear apertures. In some embodiments (module 500), the first lens has a first lens which is cut lens element, see FIG. 9. Advantageously such a lens design helps to achieve small camera height.

Change in zoom state is caused by no more than two actual amounts of lens group movements. That is, to change zoom state, some lens element groups move together in a first movement range, then some of the remaining lens group elements move together by in a second movement range while all other lens element groups do not move. This simplifies actuator control and design, since there is a need to move and control only two mechanical elements.

In some examples, F $\#_{Tmin}<1.5 \times F \#_{Tmax} \times EFL_{Tmin}/EFL_{Tmax}$. In some examples, F $\#_{Tmin}<1.2 \times F \#_{Tmax} \times EFL_{Tmin}/EFL_{max}$ Such a lens design may achieve low F # for the first state.

In some examples, for any lens element group, the movement from the first zoom state to the second zoom state has a stroke smaller than $0.75 \times (EFL_{Tmax}-EFL_{Tmin})$. In some examples, for any lens element group, the movement from the first zoom state to the second zoom state has a stroke smaller than $0.6 \times (EFL_{Tmax}-EFL_{Tmin})$. Such a lens design may limit lens elements movement and/or simplify actuation.

Focusing can be performed by further movement of one of the lens element groups that moves together for zoom state change, simplifying actuator design and improving control.

In terms of properties of lenses disclosed herein:

a lens design with 3 lens groups minimizes lens complexity.

a lens design with lens groups having (starting from the object side) positive, positive and negative power, may contribute to a small lens group movement for zoom state change.

In one example (Example 1) of a process to change zoom state, the first lens element group G1 moves by a first amount and the third lens element group G3 moves by a second amount, while the second lens element group G2 does not move. Farther movement of G3 can be used for focusing.

In another example (Example 2) of a process to change zoom state, G1 together with G3 move by a first amount and G2 moves by a second amount. Farther movement of G2 can be used for focusing.

In yet another example (Example 3) of a process to change zoom state, G1 moves by a first amount, G3 moves by a second amount and G2 does not move. Further movement of first G1 can be used for focusing.

In yet another example (Example 4) of a process to change zoom state, G1 together with G3 move and G2 does not move. Further movement of first G2 can be used for focusing.

In yet another example (Example 5) of a process to change zoom state, G1 together with G3 move and G2 does not move. Further movement of G1 together with G3 can be used for focusing.

In yet another example (Example 6) of a process to change zoom state, G1 together with G3 move by a first amount and G2 moves by a second amount. Further movement of all three lens groups together, so G1 and G2 and G3 moving together, can be used for focusing.

Table 25 summarizes the movements in each Example, with exemplary movement ("stroke") ranges:

TABLE 25

|  | Example 1 | Example 2 | Example 3 | Example 4 | Example 5 | Example 6 |
|---|---|---|---|---|---|---|
| G1 range [mm] | 11.272 | 7.52 | 10.18 | 7.065 | 7.697 | 5.641 |
| G2 range [mm] | Static | 1.575 | Static | Static | Static | 0.718 |
| G3 range [mm] | 5.02 | 7.52 | 6.0 | 7.065 | 7.697 | 5.641 |
| Group moving for focus | G3 | G2 | G1 | G2 | G1 + G3 | G1 + G2 + G3 |
| AF max range [mm] | 0.375 | 0.525 | 0.68 | 0.723 | 1.742 | 0.342 |

Examples presented in Table 25 where more than one lens group is indicated as moving for focus may refer to a design where the lens groups defined in the table move together as one unit for focus. In some embodiments (e.g. Examples 5 and 6), moving several lens groups together may be facilitated by coupling the respective lens groups rigidly.

The values given in G1 range, G2 range and G3 range refer to the maximal range of overall movement of the lens groups with respect to the image sensor.

The values given in row "AF max range" refer to the maximal range of movement of the lens groups with respect to the image sensor defined in row "Group moving for focus" required for focusing between infinity and 1 meter or 2 meter according to the respective relevant table of table 2, 6, 10, 14, 18, 22 see above. In most embodiments, the AF max range is given by the lens group movement for the higher zoom state, i.e. the state with $EFL_{Tmax}$.

In some embodiments, G1 and G3 may be in a stationary state, i.e. G1 and G3 do not move, whereas G2 may be moved in order to change zoom state.

Figure 14:
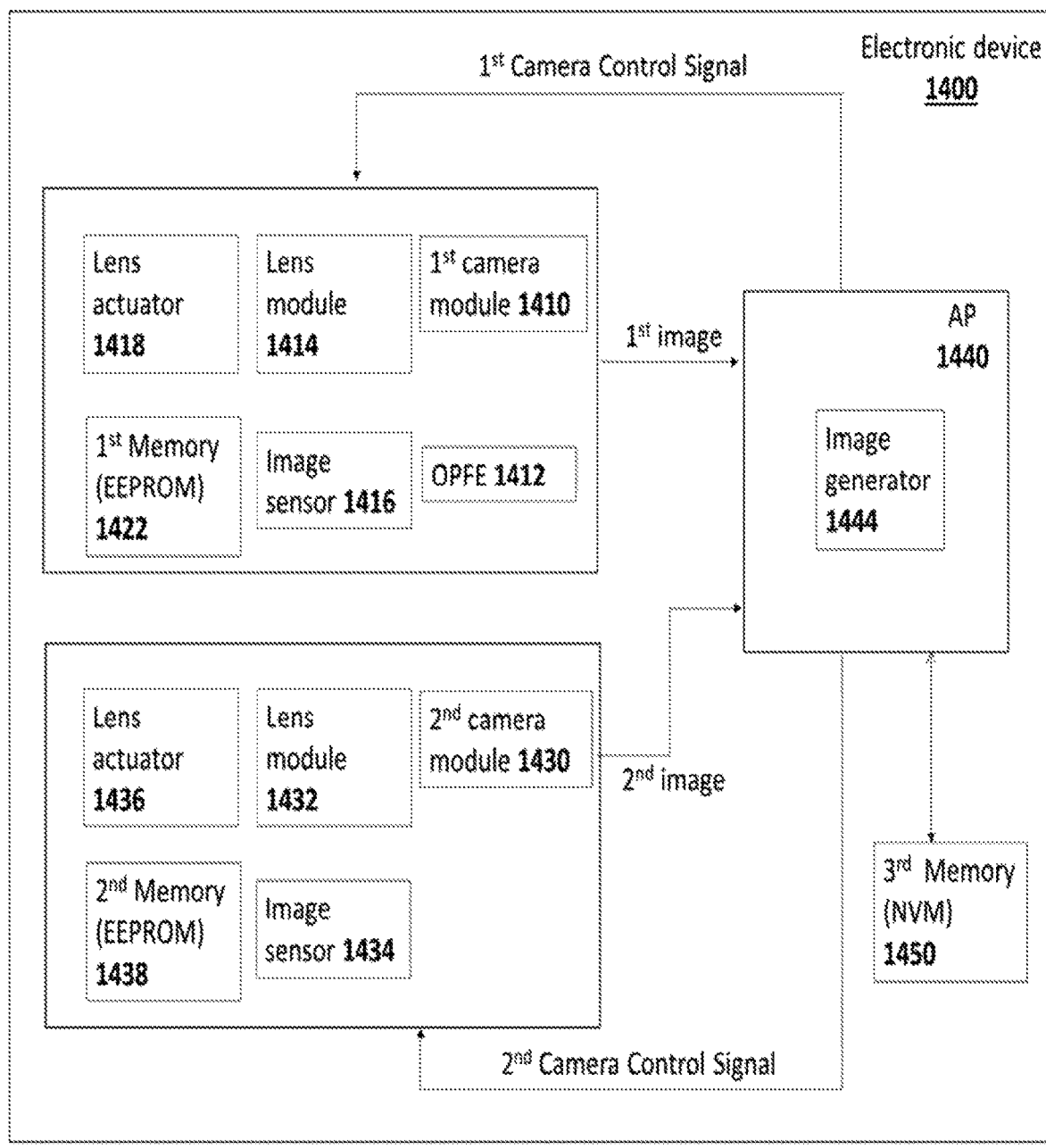
FIG. 14 shows schematically in a block diagram an embodiment of a system disclosed herein.

FIG. 14 shows schematically an embodiment of an electronic device numbered 1400 and including multi-aperture cameras with at least one multi-zoom state camera disclosed herein. Electronic device 1400 comprises a first camera module 1410 that includes an OPFE 1412, and a first lens module 1414 that forms a first image recorded by a first image sensor 1416. A first lens actuator 1418 may move lens module 1414 for focusing and/or optical image stabilization (OIS) and/or for changing between two different zoom states. In some embodiments, electronic device 1400 may further comprise an application processor (AP) 1440. In some embodiments, a first calibration data may be stored in a first memory 1422 of a camera module, e.g. in an EEPROM (electrically erasable programmable read only memory). In other embodiments, a first calibration data may be stored in a third memory 1450 such as a NVM (non-volatile memory) of the electronic device 1400. The first calibration data may include one or more subsets of calibration data, e.g. a first subset comprising calibration data between sensors of a Wide and a Tele camera in a first zoom state, and/or a second subset comprising calibration data between sensors of a Wide and a Tele camera in a second zoom state, and/or a third subset comprising calibration data between a sensor of a Tele camera in a first zoom state and the same sensor in a second zoom state. Electronic device 1400 further comprises a second camera module 1430 that includes a second lens module 1432 that forms an image recorded by a second image sensor 1434. A second lens actuator 1436 may move lens module 1432 for focusing and/or OIS and/or for changing between two different zoom states. In some embodiments, second calibration data may be stored at a second memory 1438 of a camera module. In other embodiments, the second calibration data may be stored in a third memory 1450 of the electronic device 1400. The second calibration data may include one or more subsets of calibration data, e.g. as described above.

In use, a processing unit such as AP 1440 may receive respective first and second image data from camera modules 1410 and 1430 and supply camera control signals to the camera modules 1410 and 1430. In some embodiments, AP 1440 may receive calibration data from a third memory 1450. In other embodiments, an AP 1440 may receive calibration data stored respective in a first memory located on camera module 1410 and in a second memory located on camera module 1430. In yet another embodiment, AP 1440 may receive calibration data stored respective in a first memory located on camera module 1410 and in a second memory located on camera module 1430, as well as from a third memory 1450 of an electronic device 1400. In some embodiments, an electronic device like device 1400 may comprise more than one camera module realized in a folded lens design and with an OPFE. In other embodiments, two or more camera modules may be realized without an OPFE and not with a folded lens design structure, but with another lens design structure. AP 1440 may have access to data stored in third memory 1450. This data may comprise a third calibration data. An image generator 1444 may be a processor configured to output images based on calibration data and-image data. Image generator 1444 may process a calibration data and an image data in order to output an output image.

Camera Calibration Data May Comprise:

Stereo calibration data between camera modules 1410 and 1430, specifically for all possible combinations of different lenses and different lens zoom states, e.g. of two different zoom states of a Tele camera. The stereo calibration data may include 6 degrees of freedom, e.g. pitch, yaw and roll angles, and decenter in x, y and z axes.

Stereo calibration data between camera modules 1410 and 1430, specifically for all possible combinations of different zoom states, e.g. of two different zoom states of a Tele camera. These data may include 6 degrees of freedom.

Intrinsic camera parameters, such as focal length and distortion profile for each camera module and for each of the different zoom states, e.g. of two different zoom states of a Tele camera.

Hall-sensor position values that may correspond to different focus positions in each of the different zoom states (e.g. infinity, 1 m and closest focus).

Lens shading profiles of the lens modules for each of the different zoom states.

Figure 15A:
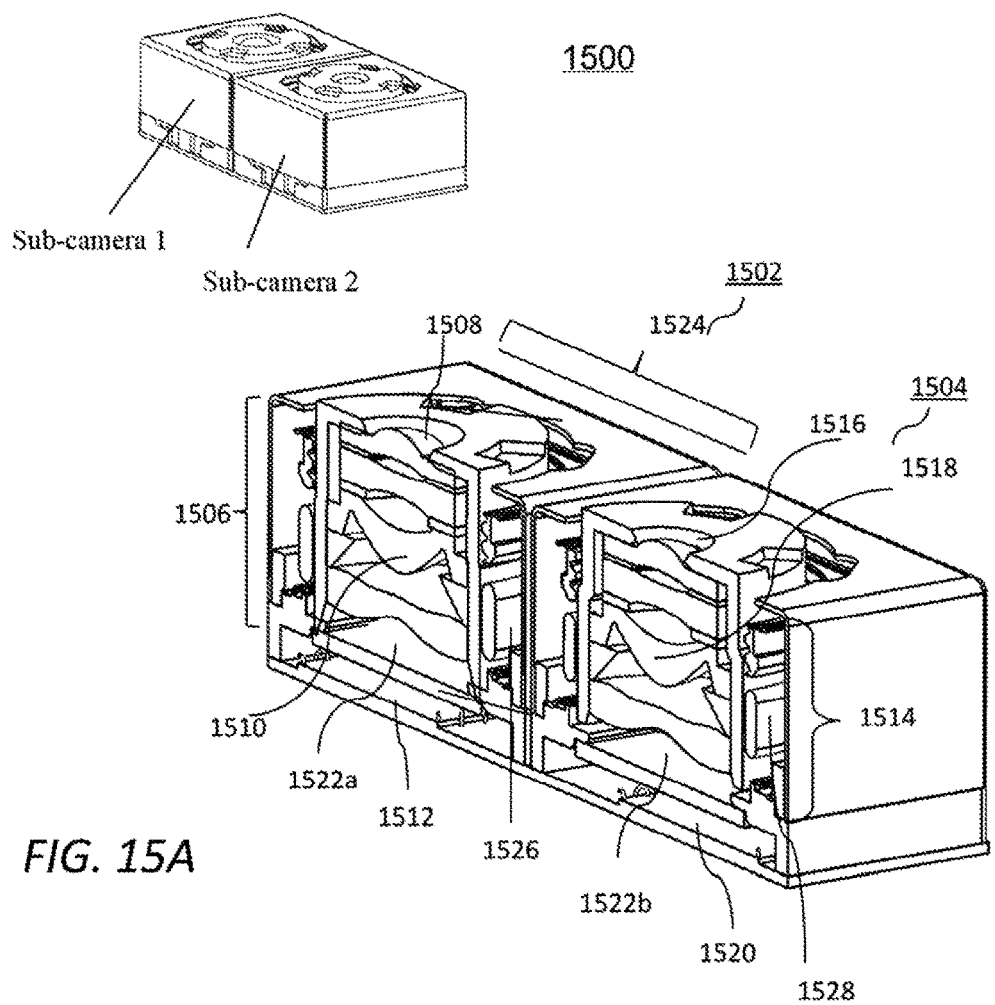
FIG. 15 shows schematically designs of dual-aperture cameras and triple-aperture cameras comprising folded and non-folded lens designs.

FIG. 15A shows schematically an embodiment of a dual-aperture zoom camera with auto-focus and numbered 1500, in a general isometric view, and a sectioned isometric view. Camera 1500 comprises two camera modules, labeled 1502 and 1504, each camera modules having its own optics. Thus, camera modules 1502 includes an optics bloc 1506 with an aperture 1508 and an optical lens module 1510, as well as a sensor 1512. Similarly, camera modules 1504 includes an optics bloc 1514 with an aperture 1516 and an optical lens module 1518, as well as a sensor 1520. Each optical lens module may include several lens elements as well as an Infra-Red (IR) filter 1522a and 1522b. Optionally, some or all of the lens elements belonging to different apertures may be formed on the same substrate. The two camera modules are positioned next to each other, with a baseline 1524 between the center of the two apertures 1508 and 1516. Each camera modules can further include an AF mechanism and/or a mechanism for optical image stabilization (OIS), respectively 1526 and 1528, controlled by a controller (not shown).

Figure 15B:
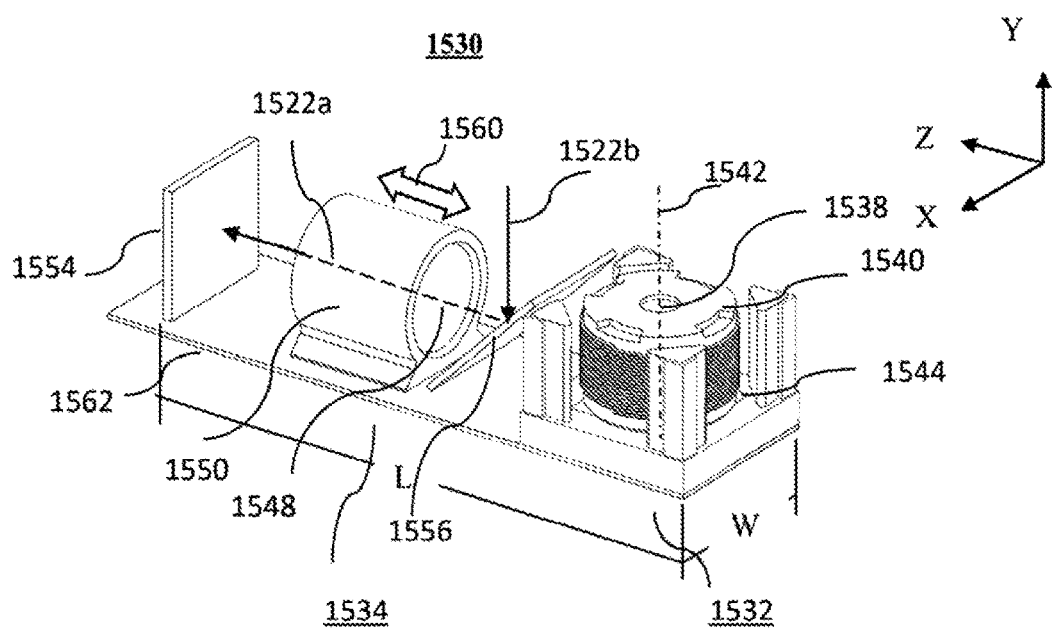

FIG. 15B shows schematically an embodiment of a zoom and auto-focus dual-aperture camera 1530 with a folded Tele lens in a sectioned isometric view related to a XYZ coordinate system. Camera 1530 comprises two camera modules, a Wide camera module 1532 and a Tele camera module 1534. Wide camera module 1532 includes a Wide optics bloc with a respective aperture 1538 and a lens module 1540 with a symmetry (and optical) axis 1542 in the Y direction, as well as a Wide image sensor 1544. Tele camera module 1534 includes a Tele optics bloc with a respective aperture 1548 and an optical lens module 1550 with a Tele lens symmetry (and optical) axis 1552a, as well as a Tele image sensor 1554. Camera 1530 further comprises an OPFE 1556. The Tele optical path is extended from an object (not shown) through the Tele lens to the Tele sensor and marked by arrows 1552b and 1552a. Various camera elements may be mounted on a substrate 1562 as shown here, e.g. a printed circuit board (PCB), or on different substrates (not shown).

Figure 15C:
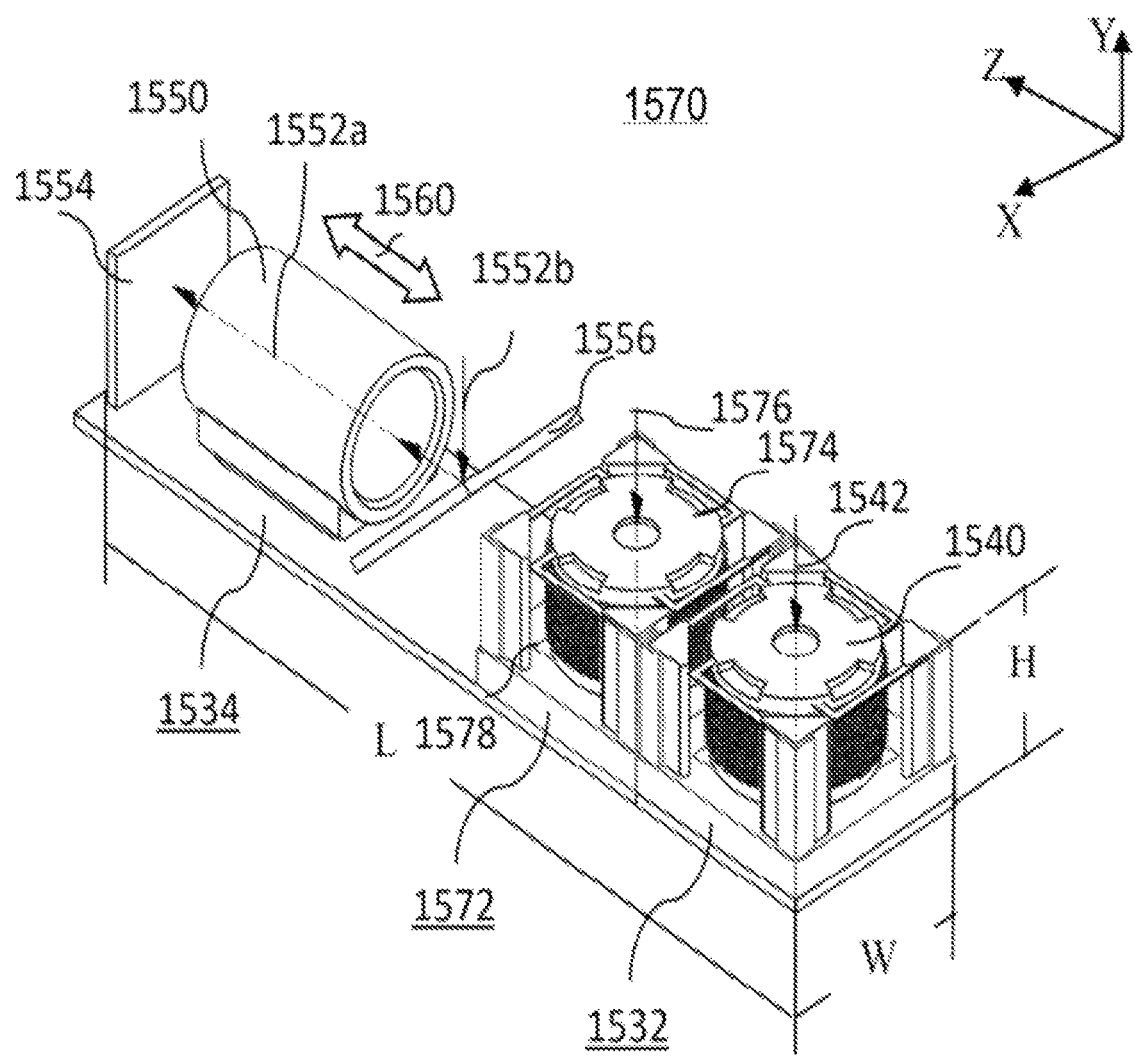

FIG. 15C shows schematically an embodiment in a general isometric view of a zoom and auto-focus triple-aperture camera 1570 with one folded Tele camera module 1534. Camera 1570 includes for example elements and functionalities of camera 1530. That is, camera 1570 includes a Wide camera module 1532, a Tele camera module 1534 with an OPFE 1556. Camera 1570 further includes a third camera module 1572 that may be an Ultra-Wide camera with an Ultra-Wide lens 1574 and an image sensor 1578. In other embodiments, third camera module 1572 may have an $EFL_M$ and a $FOV_M$ intermediate to those of the Wide and Tele camera modules. A symmetry (and optical) axis 1576 of the third camera module is substantially parallel to axis 1542 camera module 1532. Note that while the first and the third camera modules are shown in a particular arrangement (with third camera modules 1572 closer to Tele camera module 1534), this order may be changed such that the Wide and the Ultra-Wide camera module may exchange places.

Figure 16A:
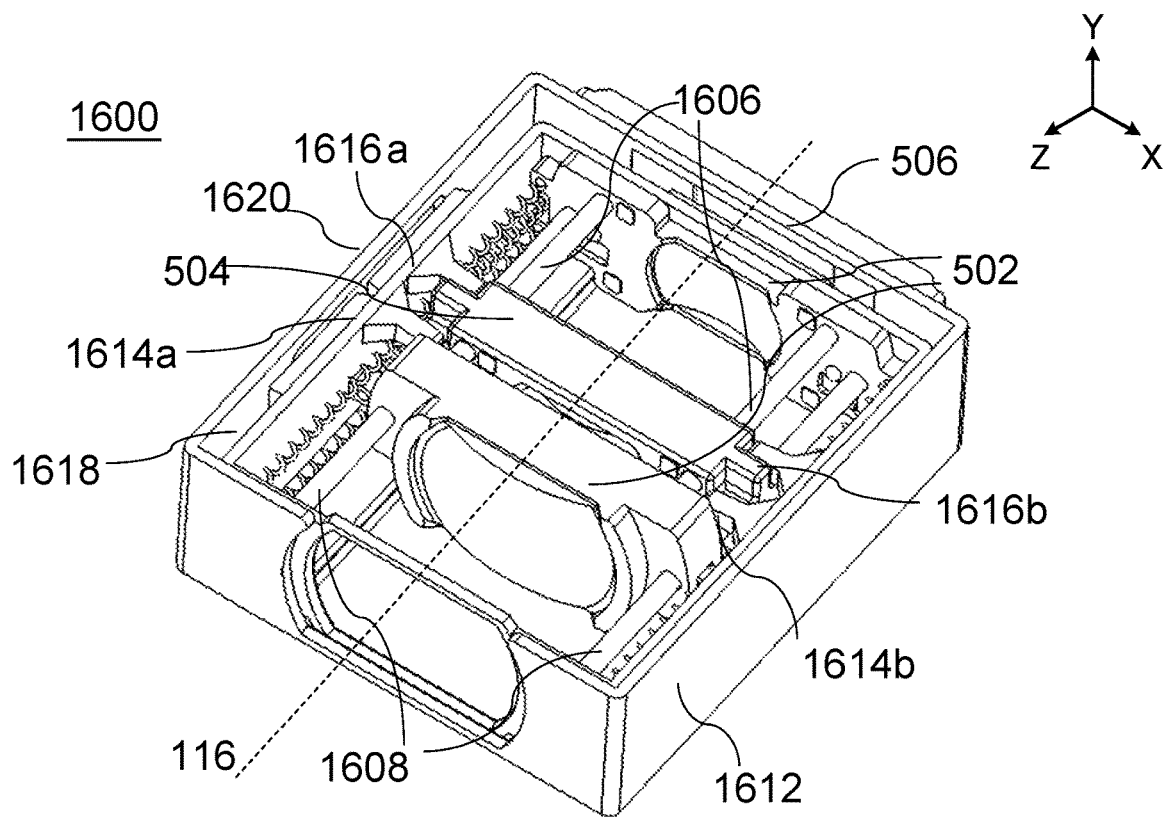
FIG. 16A shows schematically a second embodiment of a Tele lens and sensor module with a lens having the optical design of the sixth example in an $EFL_{Tmin}$ state from a top perspective view.
Figure 16B:
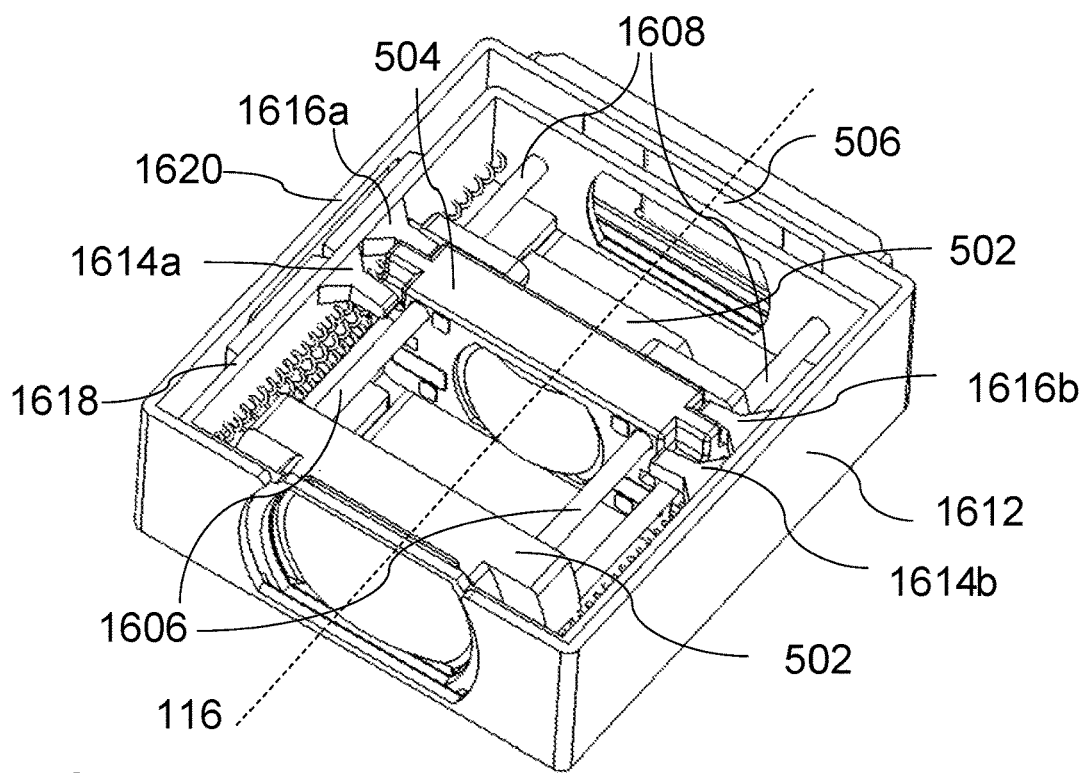
FIG. 16B shows schematically the module of FIG. 16A in an $EFL_{Tmax}$ state from a top perspective view.
Figure 16C:
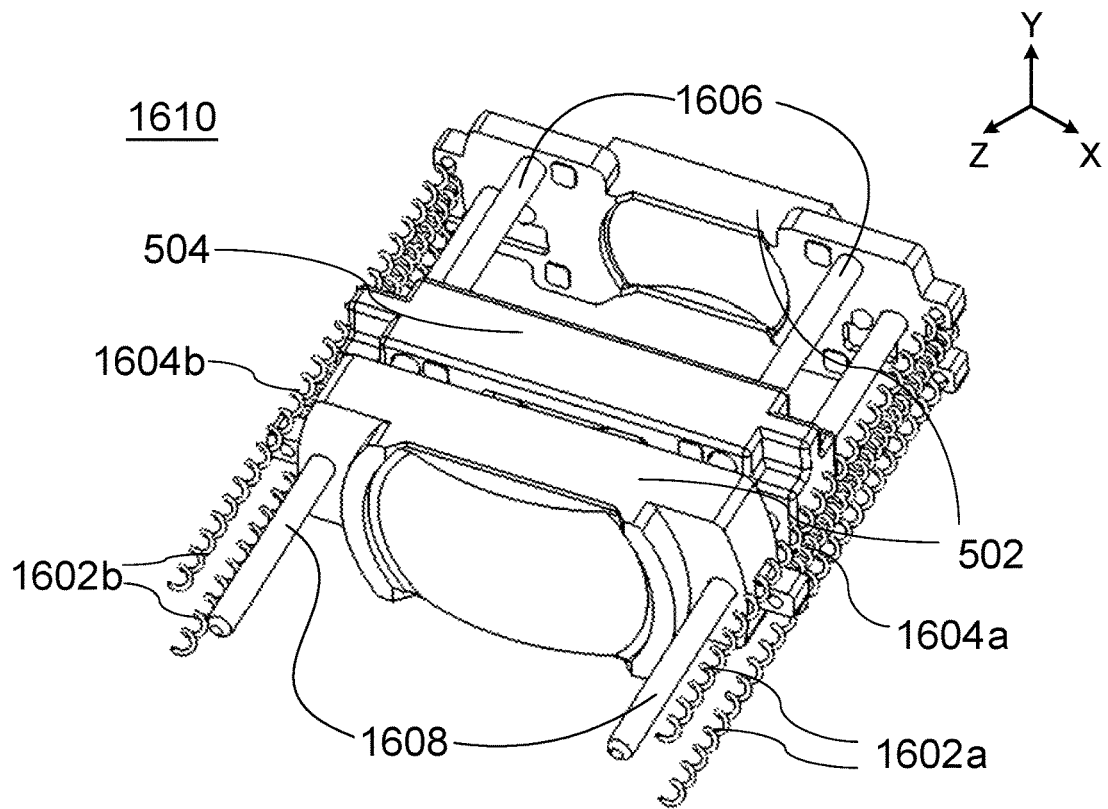
FIG. 16C shows schematically details of parts of the module of FIG. 16A.
Figure 16D:
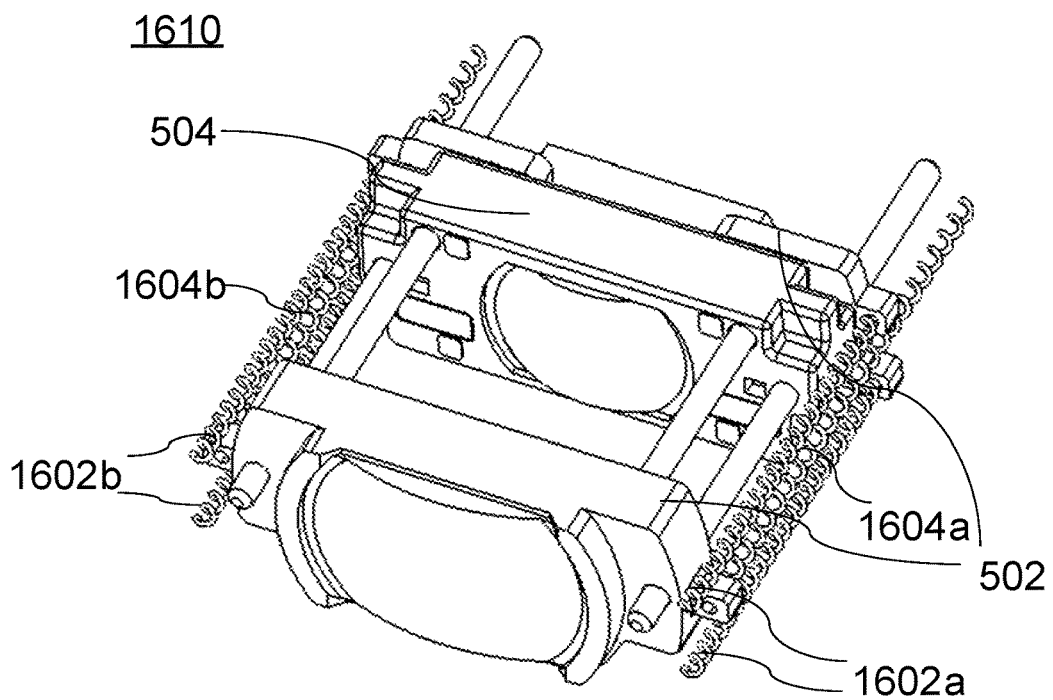
FIG. 16D shows schematically details of parts of the module of FIG. 16B.
Figure 16E:
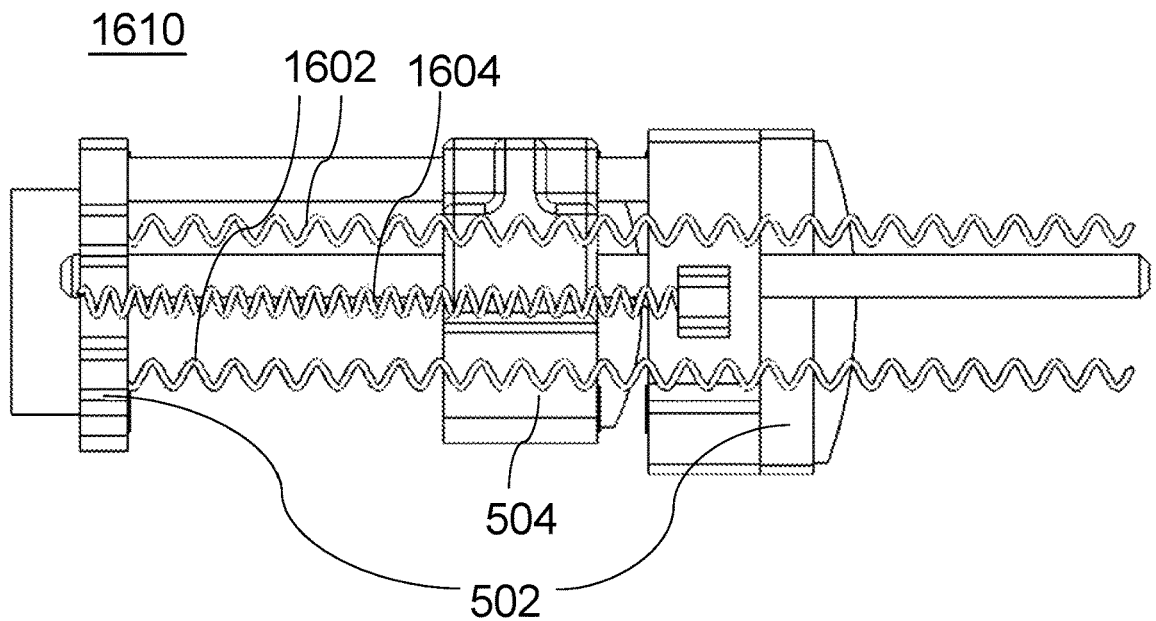
FIG. 16E shows schematically details of parts of the module of FIG. 16A in a side view.
Figure 16F:
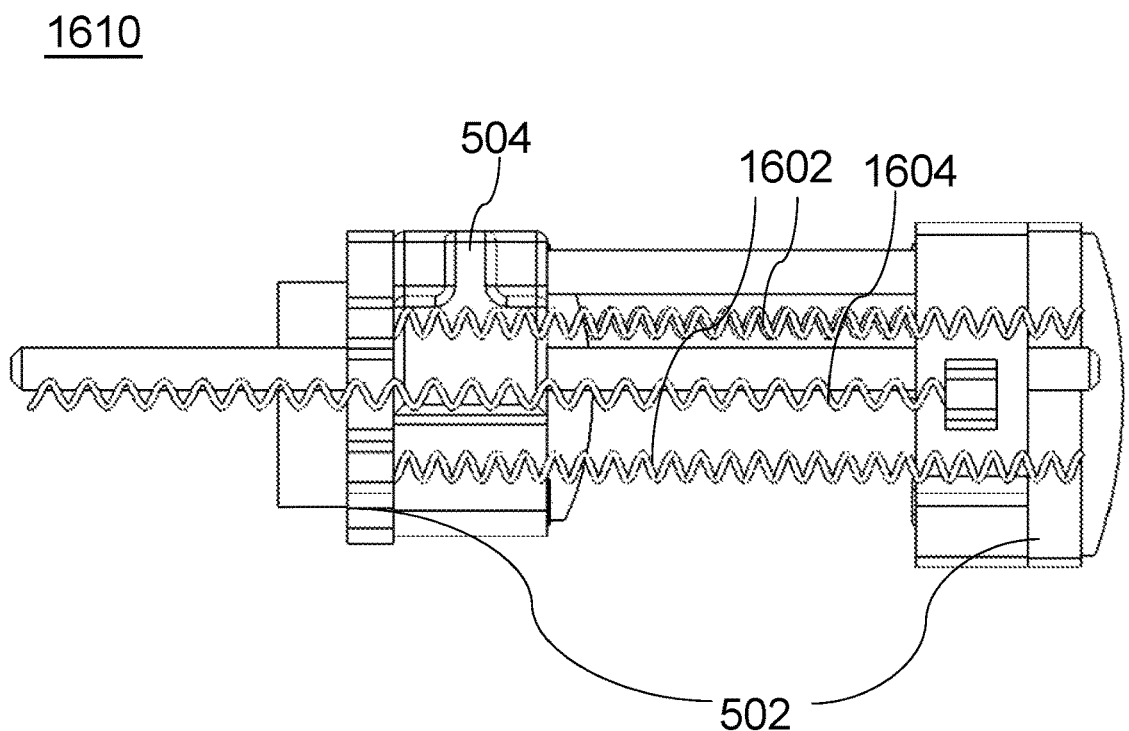
FIG. 16F shows schematically details of parts of the module of FIG. 16B in a side view.
Figure 16G:
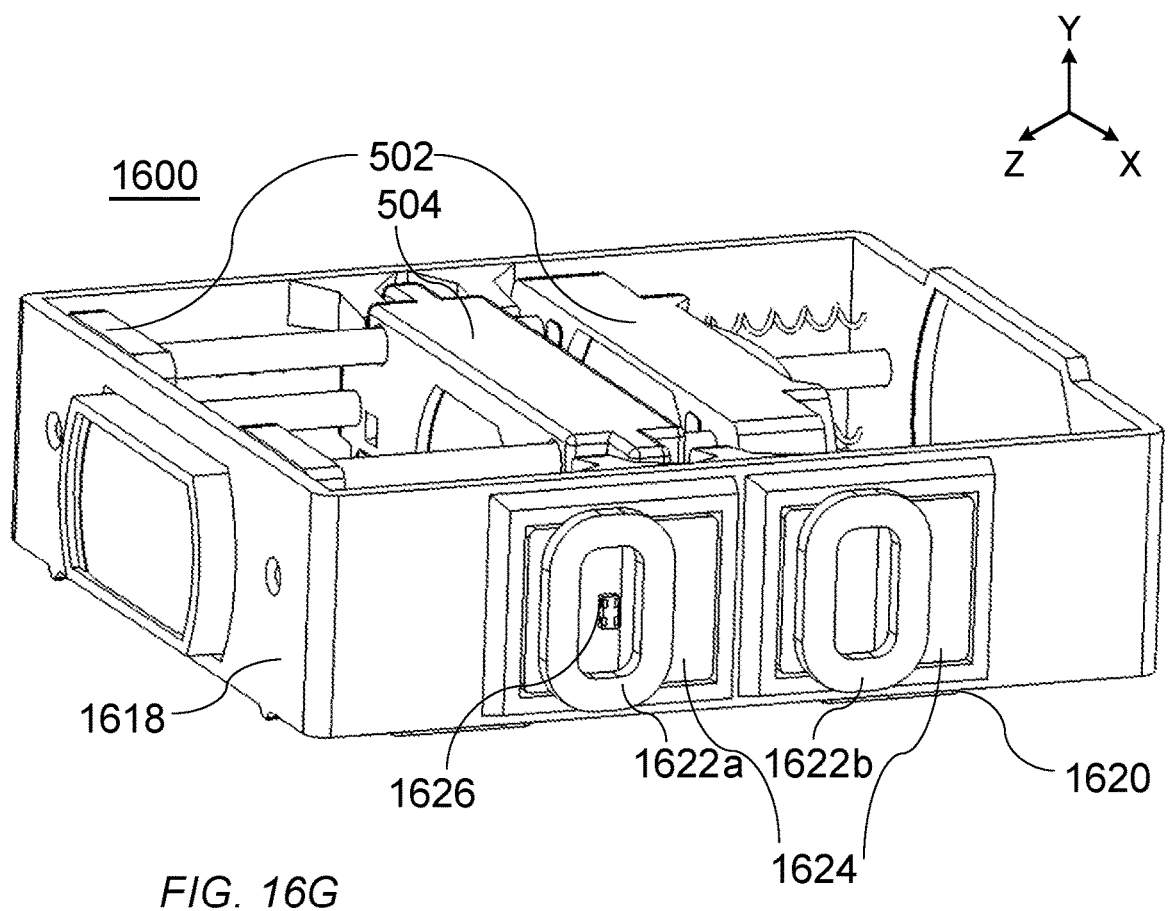
FIG. 16G shows schematically details of parts of the module of FIG. 16A in the $EFL_{Tmin}$ state in a first top perspective view.
Figure 16H:
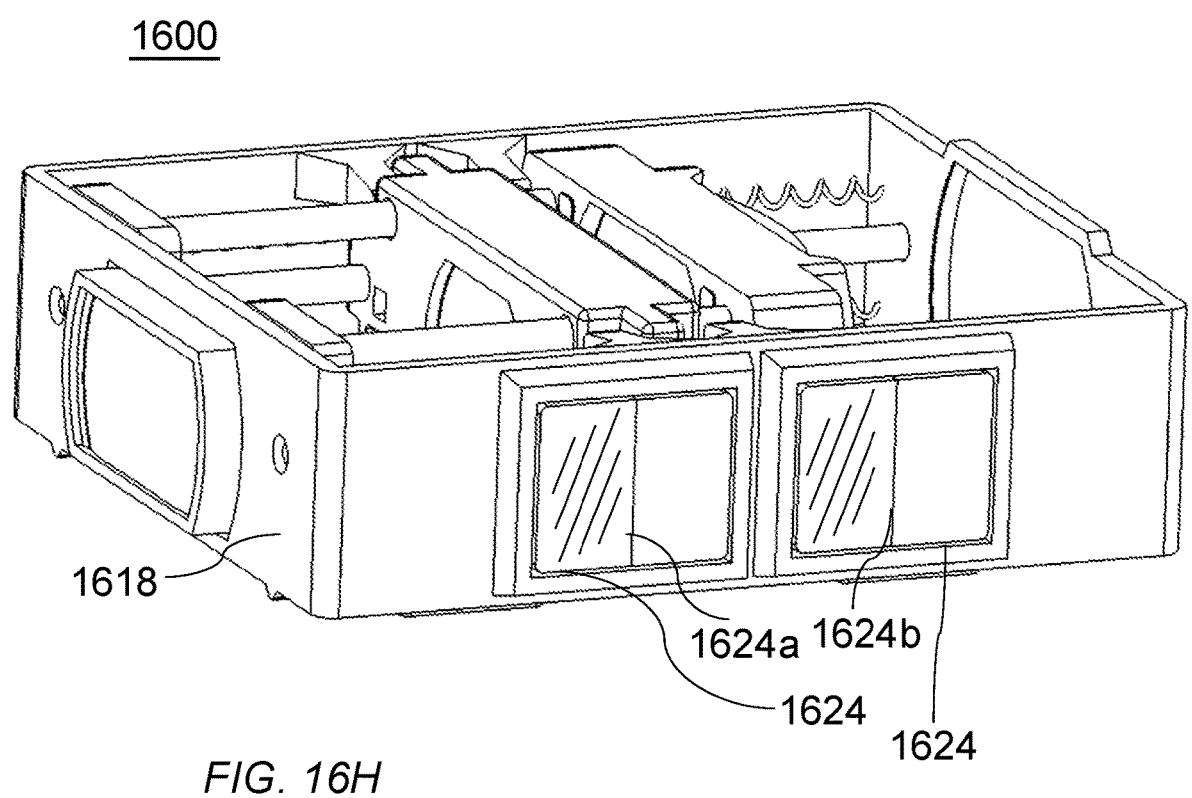
FIG. 16H shows schematically details of parts of the module of FIG. 16A in the $EFL_{Tmin}$ state in a second top perspective view.

FIG. 16A-H show schematically a second embodiment of a Tele lens and sensor module disclosed herein and numbered 1600. Module 1600 has the optical design of Example 6 in Table 25. Module 1600 includes an actuator 1610 for changing between zoom states of lenses 114', 114", 114''', 114'''', 114''''' and 114'''''' (also referred to as "EFL switching"). FIG. 16A shows schematically module 1600 in a minimal EFL ($EFL_{Tmin}$) state from a top perspective view, and FIG. 16B shows schematically module 1600 in a maximal EFL ($EFL_{Tmax}$) state from top perspective view. FIG. 16C shows schematically parts of module 1600 in an $EFL_{Tmin}$ state from top perspective view, and FIG. 16D shows schematically parts of module 1600 in the $EFL_{Tmax}$ state from top perspective view. FIG. 16E shows schematically parts of module 1600 in an $EFL_{Tmin}$ state in a side view, and FIG. 16F shows schematically parts of module 1600 in the $EFL_{Tmax}$ state in a side view. 16G and FIG. 16H shows schematically parts of module 1600 in the $EFL_{Tmin}$ state from top perspective view.

Module 1600 comprises G1G3 assembly 502, G2 assembly 504, sensor assembly 506, a module housing 1612, a lens frame 1618, four pairs shape memory alloy (SMA) springs arranged in two pairs 1602a and 1602b, two mechanical (regular) springs 1604a,b, G2 stops 1614a, 1614b and 1616a, 1616b and an AF actuation mechanism 1620. G2 lens stops 1614a, b and 1616a, b may limit the displacement of lens group G2 toward the object (image sensor 506) side of module 1600. Actuator 1610 comprises SMA springs 1602 and mechanical (regular) springs 1604. Exemplary values for the dimensions of a SMA spring 1602 include a spring diameter of 0.5 mm, a wire diameter of 0.05 mm and a few tens of coils turns. The forces that such a spring can produce are on the order of several grams. Considering module 1600 in a top view (e.g. in FIG. 16C and FIG. 16D), a pair of SMA springs (1602a) and one mechanical spring 1604a are located at the right hand side of the lens assemblies, and a pair of SMA springs (1602b) and one mechanical spring 1604b are located at the left hand side of the lens. Springs 1602a (1604a) and 1602b (1604b) are located on both side of the module in a symmetrical manner with respect to optical axis 116. Springs 1602a (1604a) and 1602b (1604b) may have identical properties. G1G3 assembly 502 and G3 504 share lens optical axis 116. Module 1600 may comprise a top cover, which is not shown here for reasons of visibility.

The two lens groups of the G1G3 assembly are rigidly connected to one another via two pins or rods 1606 (FIG.

16B), such that the distance between them along optical axis 116 is constant. The assembly comprising G1, G3 and rods 1606 is referred to herein as a "G13 assembly". Rods 1608 are parallel to the optical axis 116 and range along the entire lens frame 1618. Rods 1608 guide the movement of the lens groups G1+G3 and G2, which move by sliding on rods 1608. G2 can "float" on rods 1608 between G2 stops 1614a and 1616a on one side and 1614b and 1616b on the other side of module 1600. The G13 assembly is movable relative to module housing 1612 and image sensor 506 to provide two effective focal lengths, $EFL_{Tmin}$ and $EFL_{Tmax}$. The displacement of the G13 assembly along optical axis 116 towards and away from image sensor 506 is performed via the SMA and mechanical springs. The two SMA springs in each spring pair 1602 may be parallel to each other and to optical axis 116, and may be connected such that their one end is fixed to G3 and the other end is fixed to lens frame 1618. One end of mechanical springs 1604 (which are parallel to optical axis 116 as well) may be fixed to G1, and the other end may be fixed to lens frame 1618.

Based on known SMA properties and effects, a displacement of G13 assembly towards and away from image sensor 506 can be induced in the following manner: when heated, SMA springs 1602 contract, and their internal stress significantly increases, resulting in a high compression force. Conversely, when cooled, their internal stress significantly decreases, resulting in a low compression force. Therefore, upon heating SMA springs 1602, e.g. by driving an electric current through them, their compression force can be controlled in order to overcome the counter compression force of mechanical springs 1604, resulting in a displacement of the G13 assembly away from image sensor 506. Contrarily, upon relaxing the SMA springs back to the environmental temperature (e.g., 60° C.), typically by turning off the electric current supply, the compression force of mechanical springs 1604 overcomes the force of SMA springs 1602, resulting in a displacement of G13 assembly towards image sensor 506.

FIG. 16G and FIG. 16H show details of AF actuation mechanism 1620. Mechanism 1620 is used for focusing a camera like camera 103 and comprises two coils 1622a and 1622b, a magnet assembly 1624 rigidly coupled to frame 1618 and a Hall sensor 1626 that may be soldered to a PCB (not shown in FIG. 16G and FIG. 16H). The coils have flat bottom and top surfaces lying substantially in Y-Z planes, with the coils arranged relative to each other along the Z direction (parallel to the lens optical axis and the direction of movement of G1, G2 and G3). The coupling allows sending input and output currents to coils 1622a and 1622b, the currents carrying both power and electronic signals required for operation. Hall sensor 1626 may be rigidly coupled to module housing 1612 (the latter not shown in FIG. 16G and FIG. 16H) and is used for determining the position of lens frame 1618 relative to module housing 1612 and image sensor 506. Magnet assembly 1624 comprises two split magnets 1624a and 1624b that have two polarizations each, wherein the polarizations are orthogonal to each other and in normal (anti-normal) direction with respect to the magnet surface. Details on split magnets (and their function in VCMs) as in magnet assembly 1624 are described above for magnet 512 in FIGS. 5A-E. The polarization is indicated by hatching of relevant regions of 1624a and 1624b respectively. Focusing is achieved by driving a current through coils 1622a and 1622b.

Figure 17A:
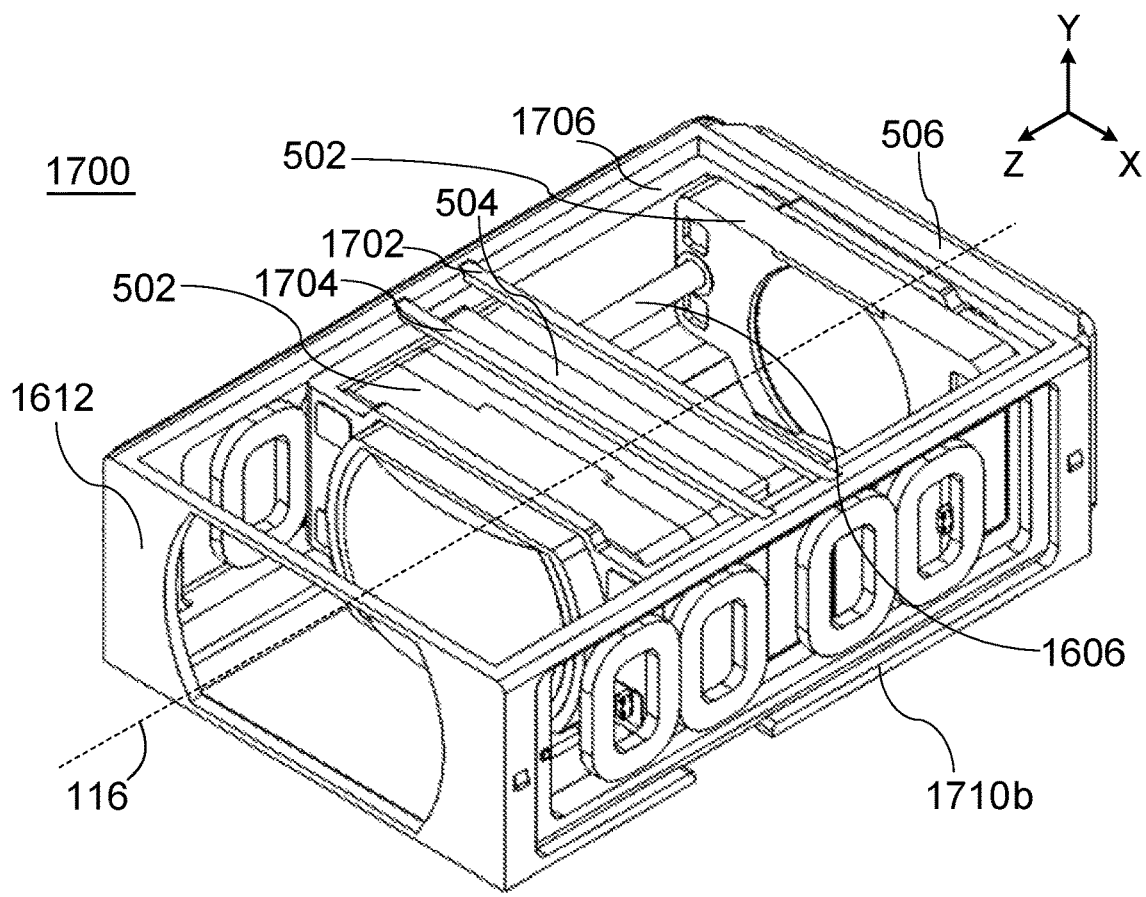
FIG. 17A shows schematically a third embodiment of a Tele lens and sensor module with a lens having the optical design of the sixth example in an $EFL_{Tmin}$ state from a top perspective view.
Figure 17B:
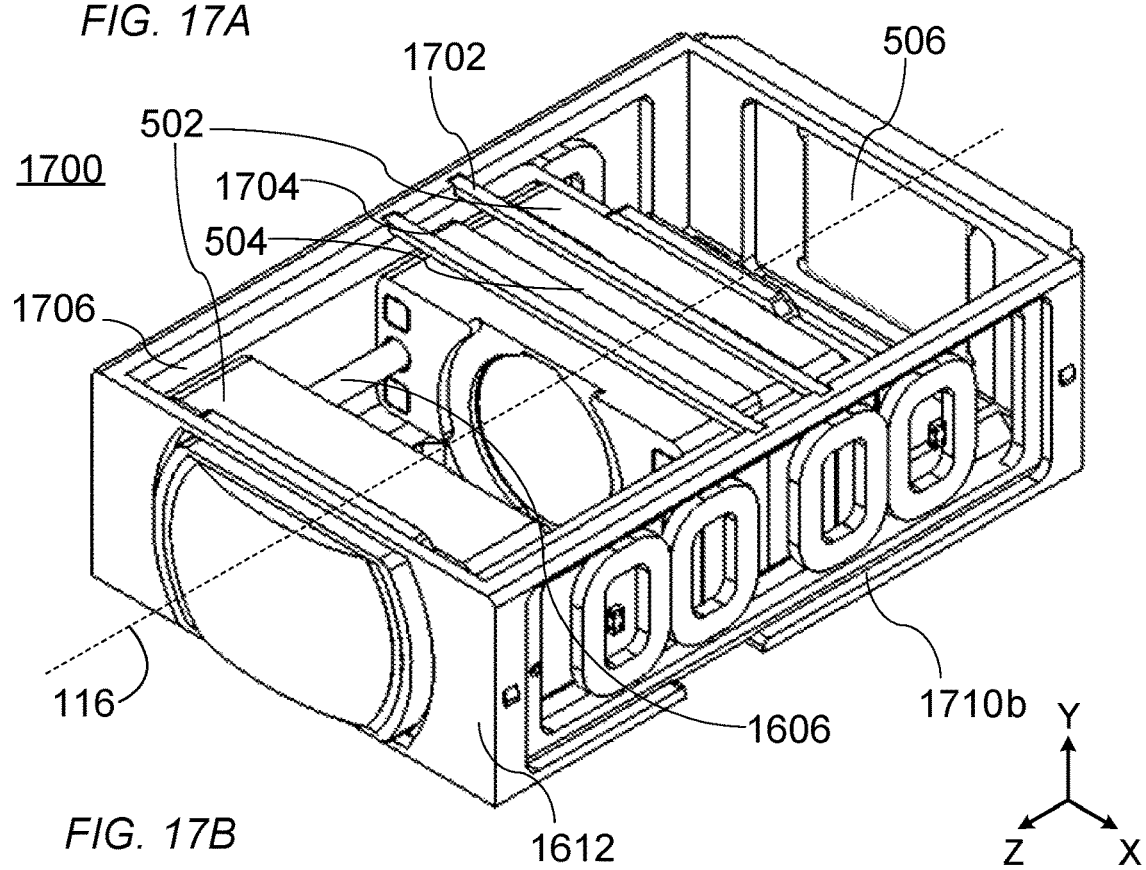
FIG. 17B shows schematically the module of FIG. 17A in an $EFL_{Tmax}$ state.
Figure 17C:
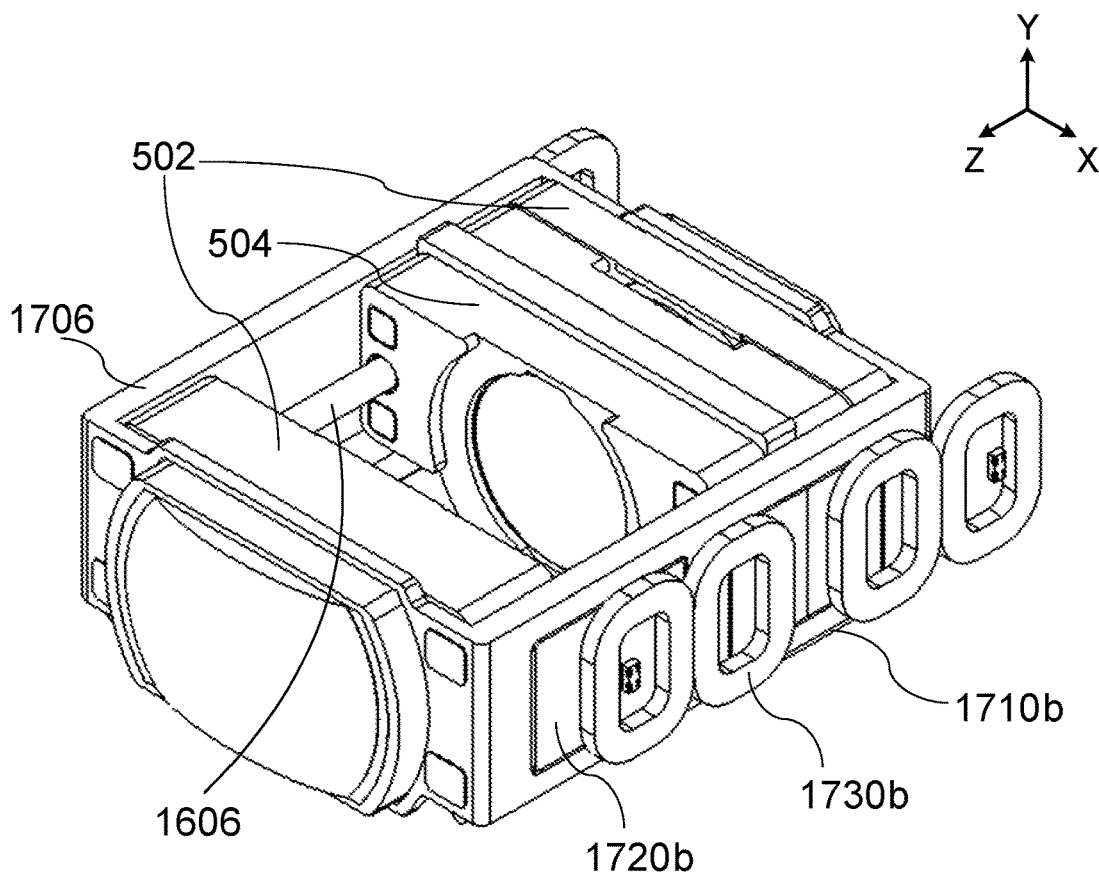
FIG. 17C shows schematically details of parts of the module of FIG. 17B.
Figure 17D:
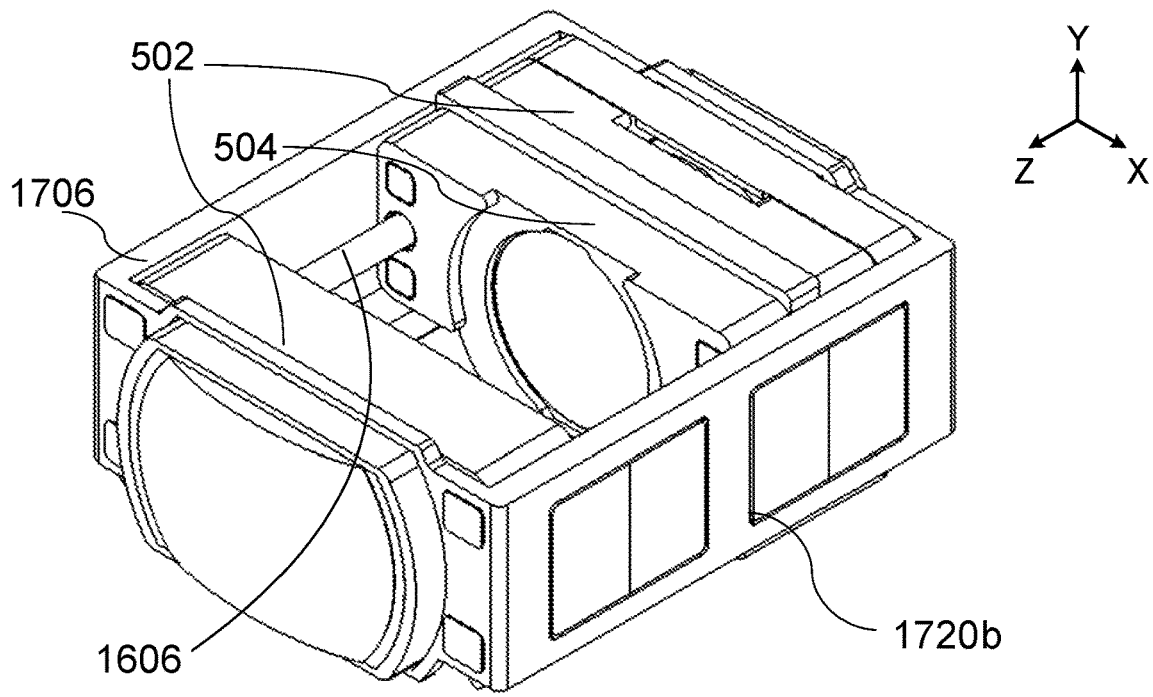
FIG. 17D shows schematically other details of parts of the module of FIG. 17B.

FIG. 17A-D show schematically a third embodiment of a Tele lens and sensor module disclosed herein and numbered 1700. Like module 1600, module 1700 has the optical design of Example 6 in Table 25. FIG. 17A shows schematically module 1700 in an $EFL_{Tmin}$ state from a top perspective view, and FIG. 17B shows schematically module 1700 in an $EFL_{Tmax}$ state from top perspective view. FIG. 17C shows schematically parts of module 1700 in an $EFL_{Tmax}$ state from top perspective view, and FIG. 17D shows schematically parts of module 1700.

Module 1700 comprises a VCM mechanism 1710 for changing between zoom states and focus states of lenses 114', 114'', 114''', 114'''', 114''''' and 114''''''. Module 1700 further comprises G1G3 assembly 502, G2 assembly 504, sensor assembly 506, module housing 1612 and a lens frame 1706. VCM mechanism 1710 comprises two VCMs 1710a and 1710b at each side of the module and two G2 lens stops 1702 and 1704. Lens stops 1702 and 1704 may limit the displacement of G2 toward the object (image sensor 506) side of module 1700. Considering module 1700 in a top view (shown e.g. in FIG. 17C and FIG. 17D from two opposite sides), VCMs 1710a and 1710b may have identical structures and properties. Lens assemblies 502 and 504 share lens optical axis 116. Module 1700 may comprise a top cover that is not shown here for reasons of visibility.

VCM mechanism 1710 comprises two coil assemblies 1730a and 1730b and two magnet assemblies 1720a and 1720b, which are components of, respectively, VCMs 1710a and 1710b. The coil assemblies and the magnet assemblies 1720a and 1720b are located on both side of the module in a symmetrical manner with respect to optical axis 116. However, VCMs 1710a and 1710b differ from each other with respect to number and locations of Hall sensors as described below. Exemplarily, in the embodiment shown in FIGS. 17A-17D, coil assemblies 1730a and 1730b include four coils 1730c, 1730d, 1730e and 1730f (see also FIG. 17C) each, and magnet assemblies 1720a and 1720b include two magnets 1720c,d each whereas each magnet has 2 polarizations (see also FIG. 17D). Magnet assembly 1720a is positioned on one side of the module (e.g. the side directed away from an observer), while magnet assembly 1720b is positioned on the other side of the module (i.e. the side that is directed towards the observer).

In FIG. 17A and FIG. 17B, the specific part of the housing 1612 (i.e. the exterior wall) that would otherwise cover the VCM mechanism 1710 is not shown for clarity and visibility reasons. FIG. 17C shows module 1700 without housing 1612 in order to highlight VCM mechanism 1710. FIG. 17D shows module 1700 without housing 1612 and without coil assembly 1730 in order to highlight a magnet assembly 1720 of VCM mechanism 1710. Coil assembly 1730 may be fixed (e.g. soldered) to a PCB (not shown in FIG. 17C) which allows sending input and output currents to the coils in coil assembly 1730, the currents carrying both power and electronic signals required for operation. The PCB may be rigidly coupled (e.g., glued) to housing 1612 and magnet assembly 1720 is rigidly coupled to lens frame 1706.

Figure 17E:
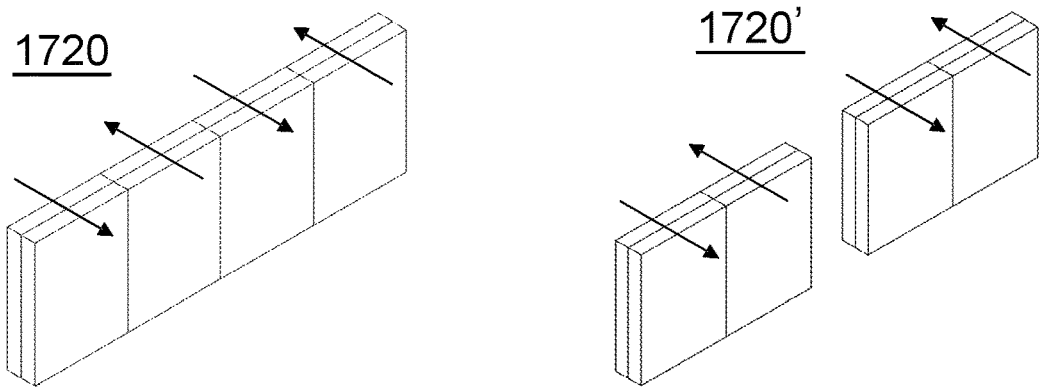
FIG. 17E shows a magnet assembly in the module of FIG. 17A and FIG. 17B.

FIG. 17E shows magnet assembly 1720. Magnet assembly 1720 may comprise a single magnet with four alternating polarizations indicated by the arrows of different directions, which polarizations are directed normal (or anti-normal) to the magnets' surface. Alternatively, e.g. in order to reduce manufacturing complexity, the single magnet with four polarizations may be replaced with a magnet sub-assembly 1720' comprising two magnets with two polarizations, as indicated by the arrows.

Figure 17F:
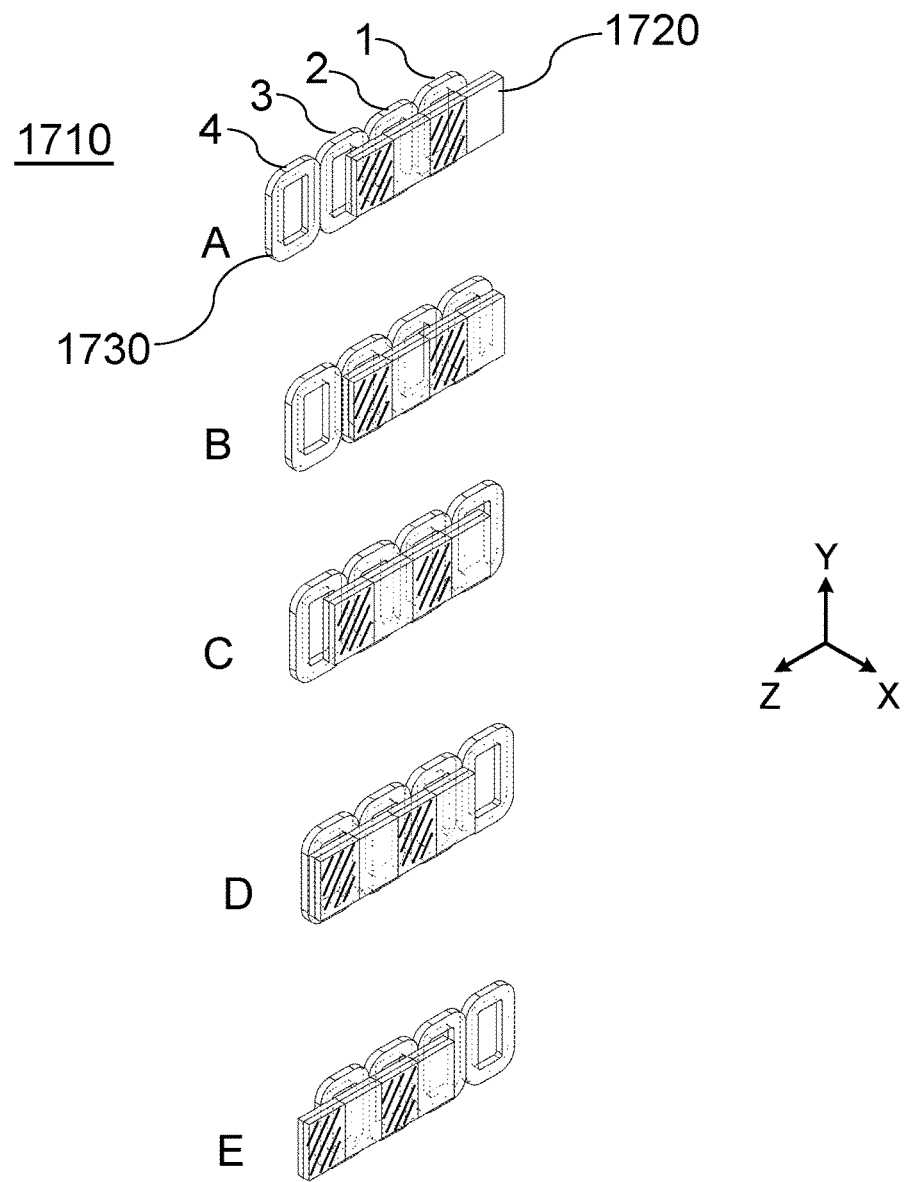
FIG. 17F shows schematically a method of actuation by VCMs in the module of FIG. 17A between an $EFL_{Tmin}$ state and an $EFL_{Tmax}$ state.

FIG. 17F shows schematically a method of actuation by VCMs 1710a and 1710b between an $EFL_{Tmin}$ state and an $EFL_{Tmax}$ state. The magnetization of sub-regions within a magnet as shown in FIG. 17E is indicated by the hatching.

VCMs 1710a and 1710b operate by driving a current through the different coils in a known and pre-defined sequence. For instance, to propagate the magnet along the z axis (in direction of larger z values), the following sequence may be executed (see FIG. 17F for coil number notation 1-4):

| COILS | DISPLACEMENT |
|---|---|
| Turn coil 1 ON | From A to B |
| Turn coil 1 OFF, Turn coil 3 ON | From B to C |
| Turn coil 3 OFF, Turn coil 2 ON | From C to D |
| Turn coil 2 OFF, Turn coil 4 ON | From D to E |
| Turn coil 4 OFF | End of stroke |

VCMs 1710a and 1710b represent large-stroke VCMs. The size of the stroke (see Table 25) is determined by the number of coils, while the magnet's size remains the same. Moreover, the stroke size has no upper bound. That is, for a given magnet, larger stroke can be achieved by simply adding more coils to the VCM, unlike current VCM configurations, in which the magnet's size must be increased to increase the stroke. Theoretically, an infinite stroke can be achieved by adding an infinite number of coils.

In VCMs, usually, the magnets are part of the dynamic mechanism while the coils are static. Typically, the magnets constitute a major part of the mechanism's mass. Consequently, achieving fast settling times and maintaining low magnets volume are of great interest. Therefore, the VCM configuration shown in FIG. 17A-FIG. 17J suggests a solution that keeps a low magnet mass while introducing large strokes. For example, using this configuration, a stroke of ~7 mm can be achieved by using one ~11 mm long magnet. For comparison, to achieve a stroke of 7 mm using one magnet and one coil (and not four as in our description), the magnet's length must be ~17 mm.

Figure 17G:
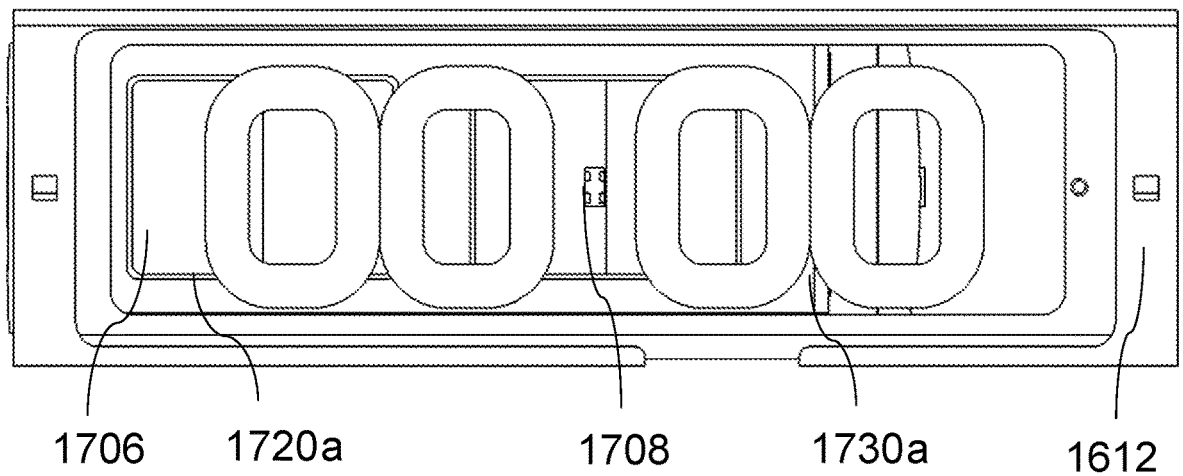
FIG. 17G shows a method of actuation for performing zoom state switching of the VCMs of FIG. 17F in the $EFL_{Tmin}$ state in a first side view.
Figure 17H:
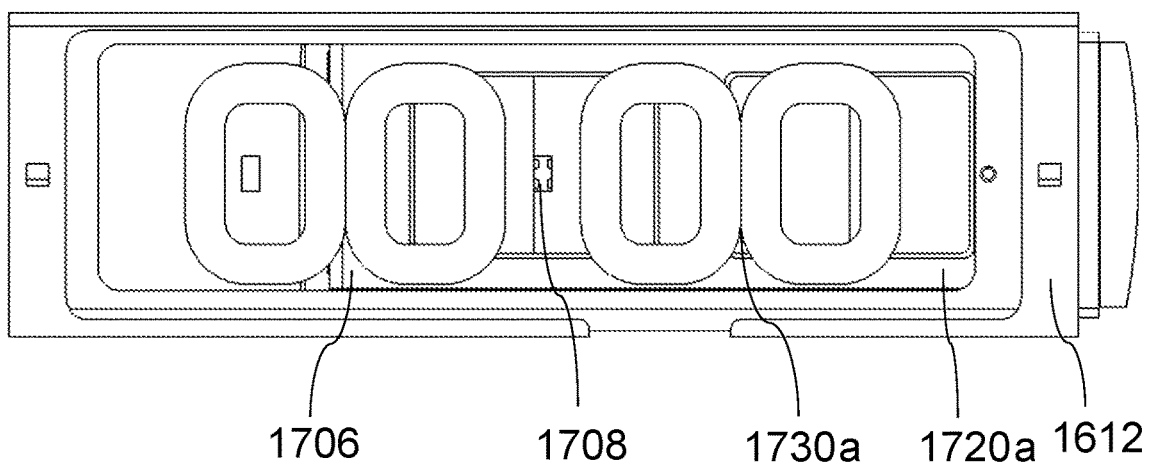
FIG. 17H shows the method of actuation for performing zoom state switching of the VCMs of FIG. 17F in the $EFL_{Tmax}$ in a second side view.

FIG. 17G and FIG. 17H show in side views a method of actuation for performing zoom state switching of VCMs 1710a and 1710b in, respectively, the $EFL_{Tmin}$ and $EFL_{Tmax}$ states. A Hall sensor 1708 rigidly coupled to the module housing 1612 (partly removed here to expose the actuator 1710) determines the position of module frame 1706 relative to the module housing 1612 for controlled switching between the $EFL_{Tmin}$ and $EFL_{Tmax}$ states.

Figure 17I:
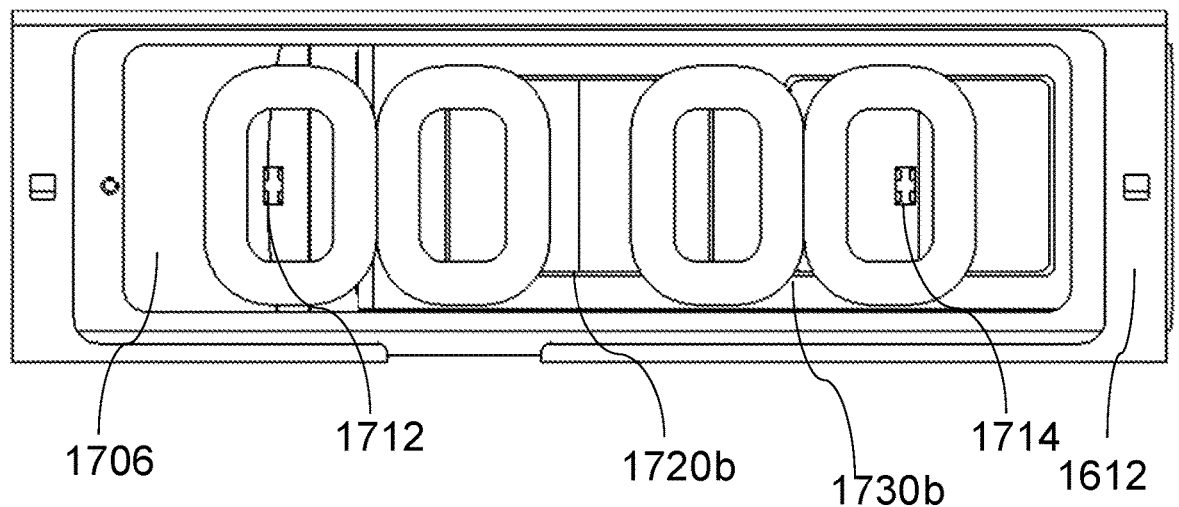
FIG. 17I shows a method of actuation for focusing in the $EFL_{Tmin}$ state in a side view opposite to that in FIG. 7G and in FIG. 17H.
Figure 17J:
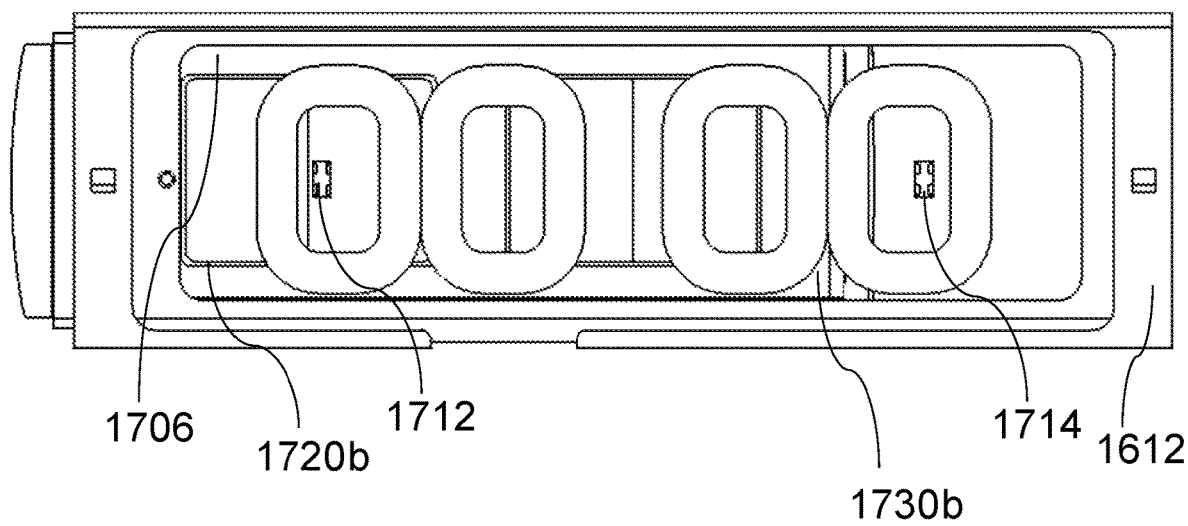
FIG. 17J shows the method of actuation for focusing in the $EFL_{Tmax}$ state in a side view opposite to that in FIG. 7H and in FIG. 17H.

FIG. 17I and FIG. 17J show the actuator mode of the VCMs 1710a and 1710b in side views opposite to those in FIG. 17G and FIG. 17H, in, respectively, the $EFL_{Tmin}$ and $EFL_{Tmax}$ states. Hall sensors 1712 and 1714 are rigidly coupled to module housing 1612 and determine the position of module frame 1706 relative to module housing 1612 for focusing camera 103. In the $EFL_{Tmin}$ state as shown in FIG. 17I, the position of module frame 1706 relative to module housing 1612 is determined by Hall sensor 1714. In the $EFL_{Tmax}$ state shown in FIG. 17J, the position of module frame 1706 relative to module housing 1612 is determined by Hall sensor 1712.

For controlling the stroke for zoom state switching, one may use one Hall sensor on one side of the housing (see FIGS. 17G and 17H). For controlling the stroke for focusing, one may use Hall sensor 1714 when in the $EFL_{Tmin}$ state and Hall sensor 1712 when in the $EFL_{Tmax}$ state (FIGS. 17I and 17J).

Figure 18A:
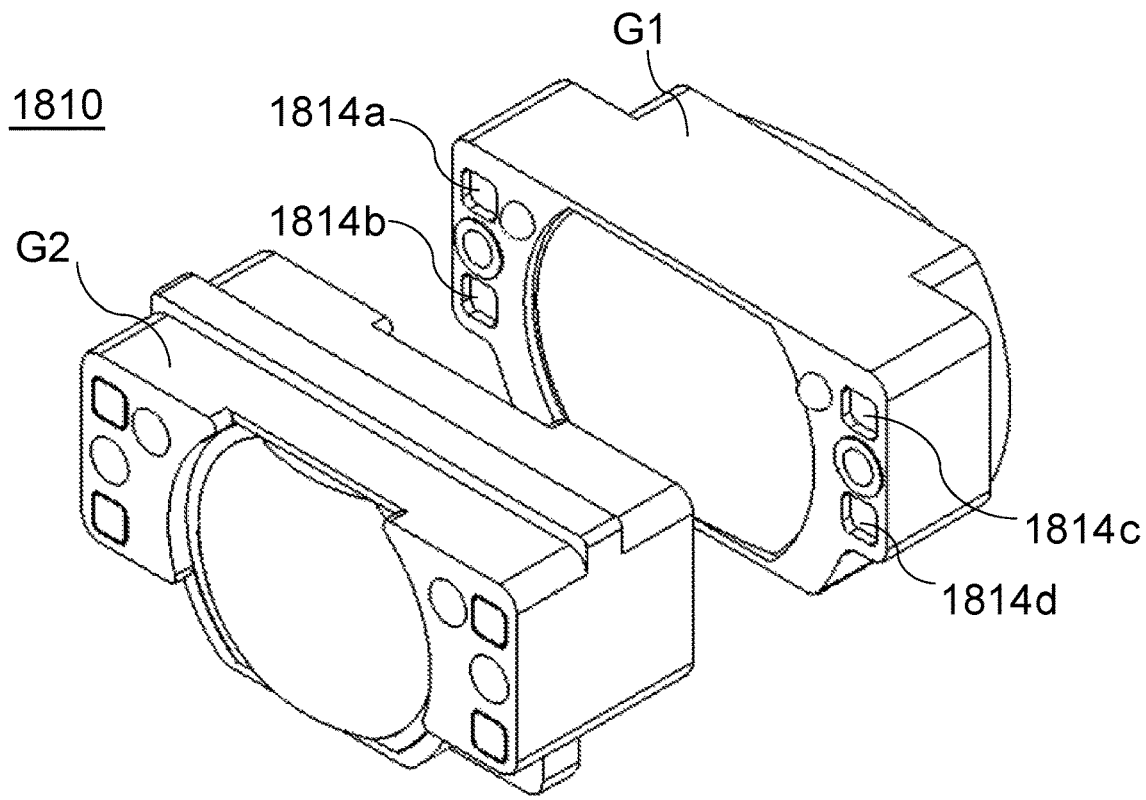
FIG. 18A shows an embodiment of a sticking sub-system for sticking lens group G2 to lens group G1 in a perspective view.
Figure 18B:
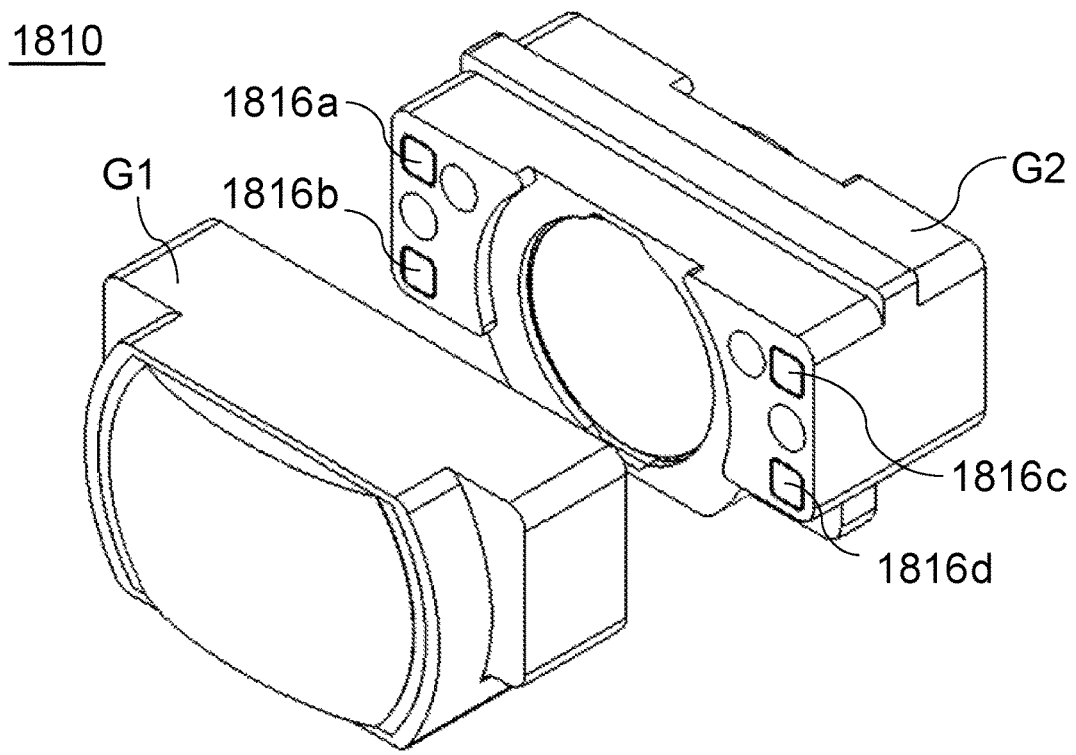
FIG. 18B shows the embodiment of the sticking sub-system of FIG. 18A in another perspective view.

FIG. 18A and FIG. 18B show an embodiment of a sticking sub-system 1810 for sticking (magnetically coupling) G2 to G1 in a zoom state with $EFL_{Tmin}$ in a perspective view. Sticking sub-system 1810 may comprise four yokes 1814a, 1814b, 1814c and 1814d and four magnets 1816a, 1816b, 1816c and 1816d. The sticking of G2 to G1 is achieved without a designated actuator, e.g. a VCM, solely by sticking sub-system 1810.

Figure 18C:
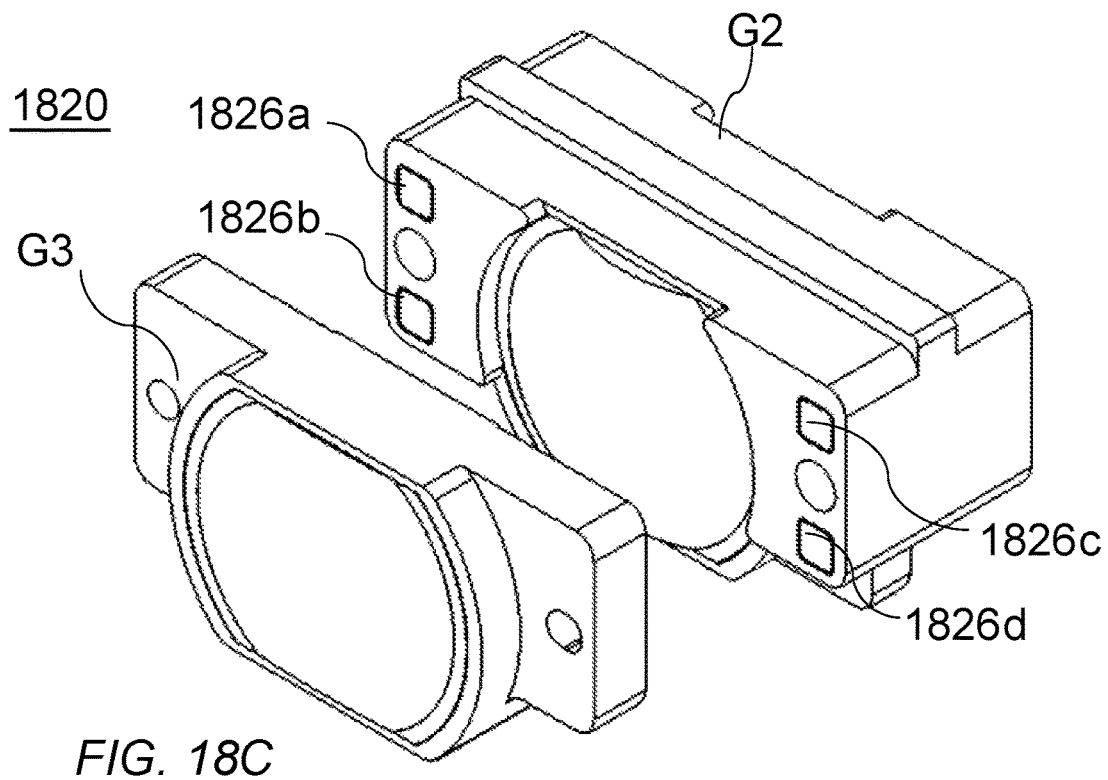
FIG. 18C shows another embodiment of a sticking sub-system for sticking lens group G2 to lens group G3 in a zoom state with $EFL_{Tmax}$ in a perspective view.
Figure 18D:
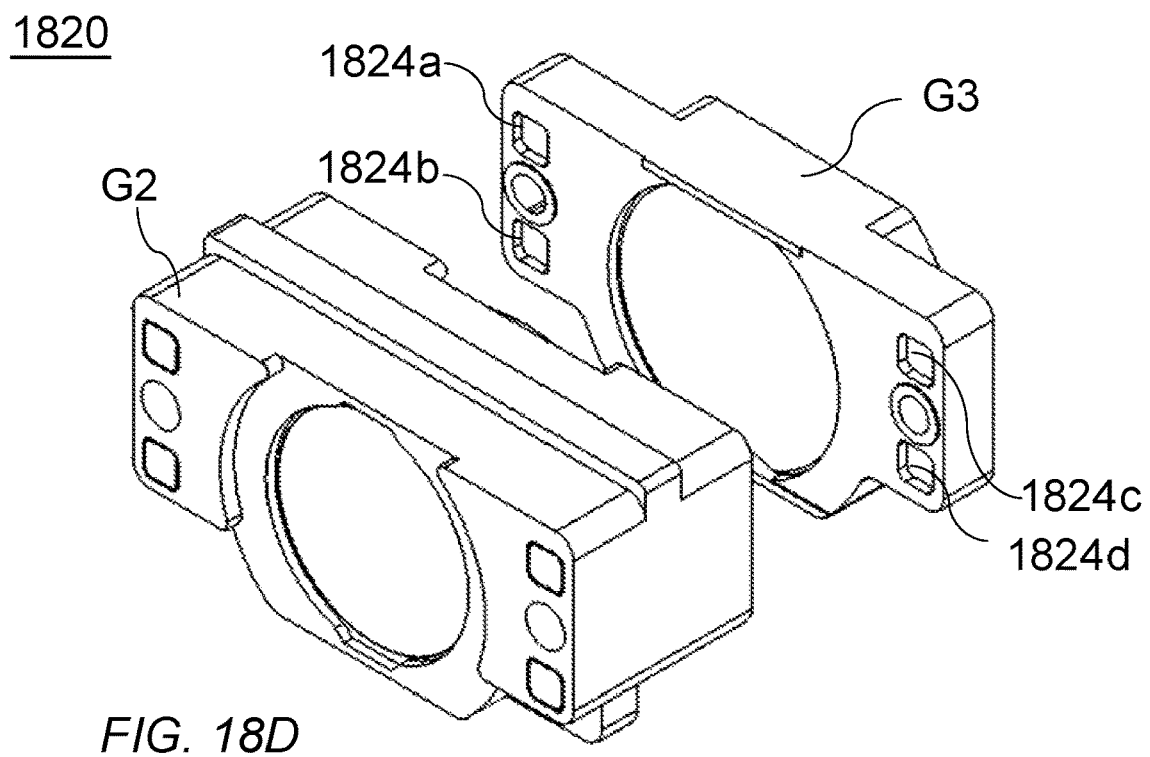
FIG. 18D shows the embodiment of a sticking sub-system of FIG. 18C in another perspective view.

FIG. 18C and FIG. 18D show another embodiment of a sticking sub-system 1820 for sticking G2 to G3 in a zoom state with $EFL_{Tmax}$ in a perspective view. Sticking sub-system 1820 may comprise four yokes 1824a, 1824b, 1824c and 1824d and four magnets 1826a, 1826b, 1826c and 1826d. The sticking of G2 to G3 is achieved without a designated actuator, e.g. without a VCM, solely by sticking sub-system 1820.

Sticking sub-systems 1810 and 1820 are based on attraction forces between magnets and yokes, making a dedicated VCM and a sensor system for determining the position of G2, which may be necessary to perform the auto-focus, redundant.

FIG. 19A to FIG. 19D show a G2 stop removal mechanism 1900. The G2 removal mechanism may be included in module 1600 or module 1700 in order to allow for a Macro photography mode (or "Macro mode") as described above. G2 stop removal mechanism 1900 comprises a G2 stop 1906, a mechanical spring 1902b and a SMA spring 1904b, a mechanical spring 1902a (not visible here) and a SMA spring 1904a (not visible here). Springs 1904a (1902a) and 1904b (1902b) are located on both sides of the module in a symmetrical manner with respect to optical axis 116.

Figure 19A:
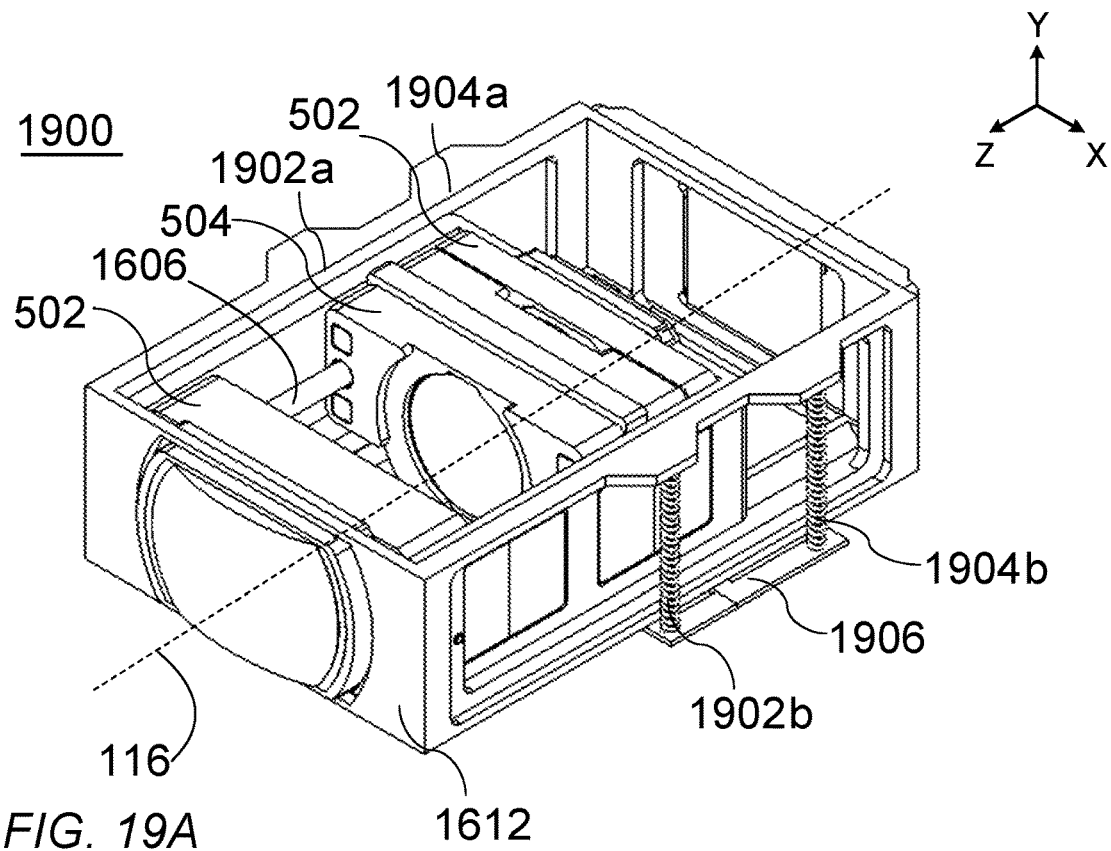
FIG. 19A shows a G2 stop removal mechanism with a G2 stop activated in the $EFL_{Tmax}$ state in a perspective view.

FIG. 19A shows G2 stop removal mechanism 1900 with G2 stop 1906 activated in the $EFL_{Tmax}$ state in a perspective view. "Activated" means that a mechanical element or member 1908 (also referred to as "tongue", see below) is engaged (by a spring configuration described next) and prevents G2 from moving together with G1 or G3. G2 assembly 504 is magnetically coupled to G1-G3 assembly 502, with G2 magnetically coupled to G3. This configuration may allow for Tele photography.

Figure 19B:
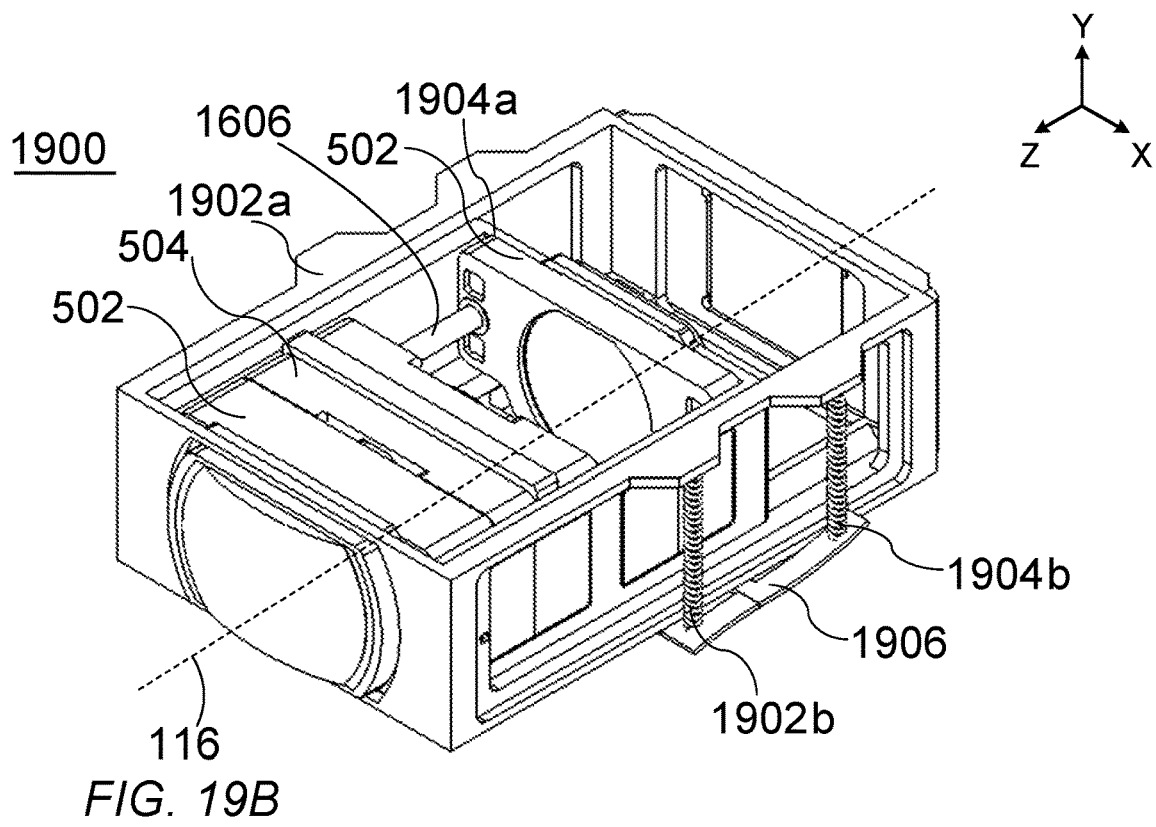
FIG. 19B shows the G2 stop removal mechanism of FIG. 19A with the G2 stop de-activated in Macro photography mode.

FIG. 19B shows G2 stop removal mechanism 1900 with a de-activated G2 stop 1906 in the Macro mode state in a perspective view. "De-activated" means that the mechanical element or member is disengaged and does not prevent G2 movement. Here, G2 assembly 504 is magnetically coupled to G1G3 assembly 502, with G2 magnetically coupled to G1. This state may be used for Macro photography. In order to de-activate the G2 stop, a current is driven through SMA springs 1904a and 1904b so that they are heated up and compress. Because of the compression force being higher than the retraction force of mechanical springs 1902a and 1902b, G2 stop 1906 executes a movement away (is removed) from housing 1612 at the side of SMA springs 1904a and 1904b.

Figure 19C:
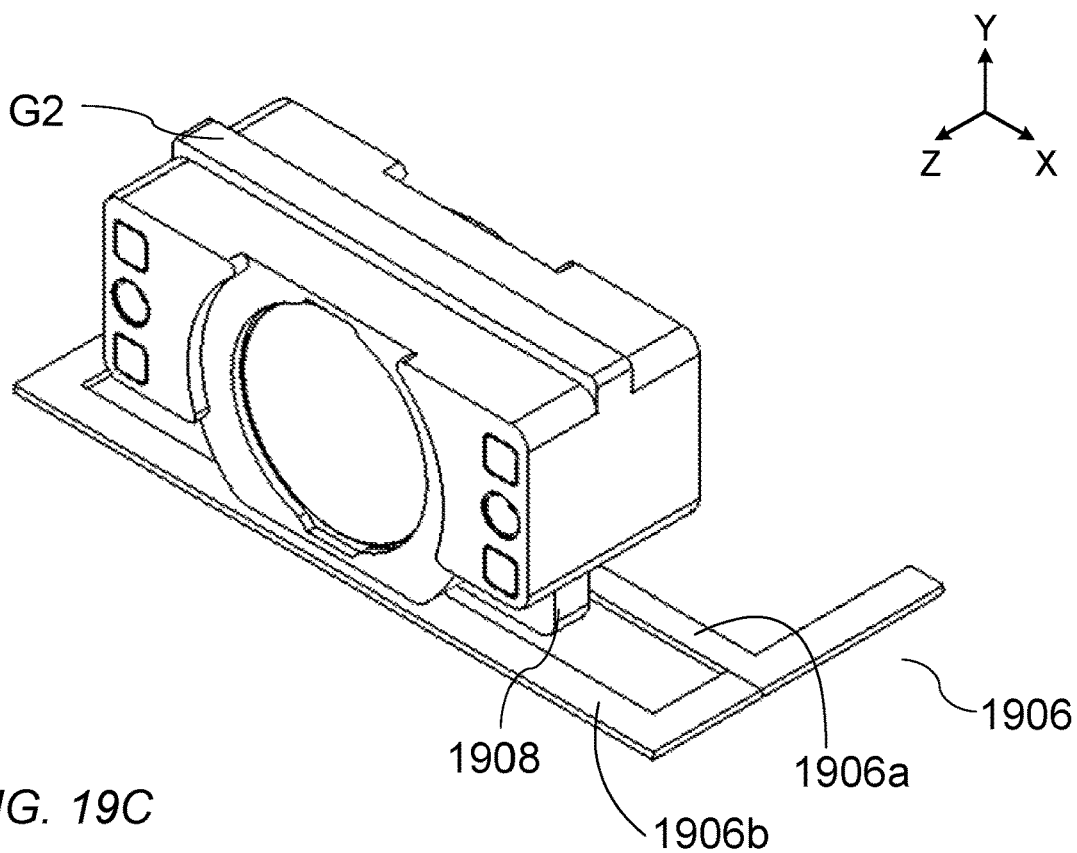
FIG. 19C shows parts of the G2 stop removal mechanism in in an $EFL_{Tmin}$ or $EFL_{Tmax}$ state with the G2 stop activated.
Figure 19D:
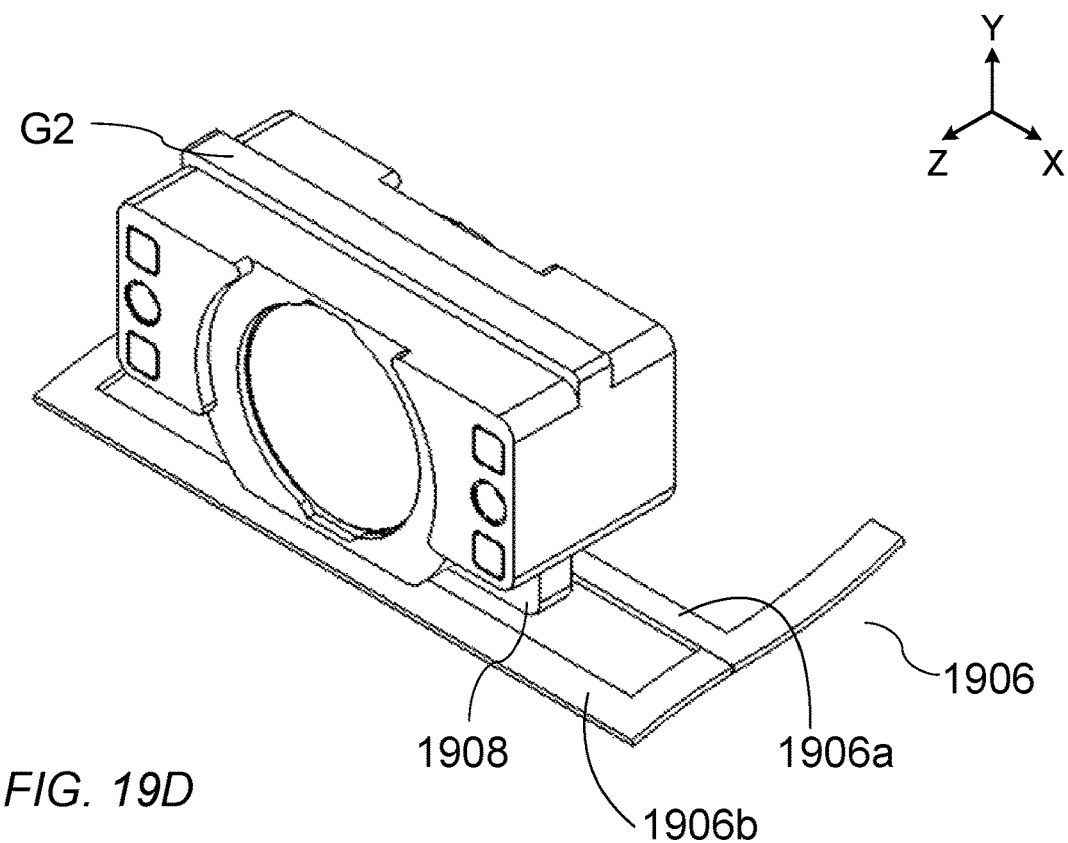
FIG. 19D shows parts of the G2 stop removal mechanism of FIG. 19C in an $EFL_{Tmin}$ or $EFL_{Tmax}$ state with the G2 stop de-activated.

FIG. 19C shows parts of the G2 stop removal mechanism 1900 in a state with stop 1906 activated in an $EFL_{Tmin}$ or $EFL_{Tmax}$ state. FIG. 19D shows parts of the G2 stop removal mechanism 1900 in a state with G2 stop 1906 de-activated. Tongue 1908, which is part of assembly 504 stops the movement of G2 assembly 504 in case G2 stop 1906 is activated, so that in case of zoom state switching from the $EFL_{Tmin}$ state to the $EFL_{Tmax}$ state, G2 disconnects from G1 and connects to G3 towards the end of the zoom switching process, e.g. via a magnet based mechanism as described in FIG. 18A-D. Tongue 1908 does not stop the movement of G2 if G2 stop 1906 is activated, so G2 remains connected to G1. If no further current is driven through the SMA springs 1904a and 1904b, G2 stop 1906 is activated again.

In another example, module 1600 or module 1700 or module 1900 may have the optical design of Example 6 in Table 25, and may be useable for Macro photography in a Macro mode. For entering the Macro mode, lens 114', 114",

114''', 114'''', 114''''' and 114'''''' must be in an $EFL_{Tmin}$ state. When entering the Macro mode, the lens must be in $EFL_{Tmin}$ state where G2 stop 1906 is de-activated, and then the lens is switched to $EFL_{Tmax}$ with G2 stop 1906 de-activated. As shown in FIG. 19B, because of the removal of the G2 lens stops, G2 remains attached to G1.

With the optical design of Example 6 in Table 25, a maximum Macro mode magnification M of e.g. M=0.44 is achieved, wherein M refers to ratio of the size of an image of an object on the image sensor plane and the actual object size. This according to thin lens approximation $$\frac{1}{EFL} = \frac{1}{u} + \frac{1}{v}$$

and for an EFL=13 mm and a lens-image distance v=19 mm, resulting in an object-lens distance of u=42 mm and thus a magnification of M=19/43=0.44. This maximum magnification is achieved with the lens configuration as shown in FIG. 19B, where G1+G2+G3 are moved together as far as possible towards the object (i.e. away from the sensor).

A smaller magnification M of down to zero magnification (for objects in infinity) can be selected continuously. For smaller magnifications, the lens groups must be in a Macro mode configuration (defined by G2 being attached to G1) and G1+G2+G3 must be moved together towards the image sensor.

For example, a magnification M=0.23 may be desired. To switch from a $M_{max}$ state to M=0.23, the lenses must be in the Macro mode configuration and G1+G2+G3 together must be moved 3 mm towards the image sensor. According to the thin lens approximation above, an EFL=13 mm and a lens-image distance v=16 mm result in an object-lens distance of u=69 mm and thus a magnification of M=16/69=0.23.

To switch from the $M_{max}$ state to a $M_{min}$ state with zero magnification (i.e. M=0), G1+G2+G3 together in the Macro mode configuration must be moved by 6 mm towards the image sensor, so that EFL=13 mm and a lens-image distance v=13 mm translates to M=0.

While this disclosure describes a limited number of embodiments, it will be appreciated that many variations, modifications and other applications of such embodiments may be made. In general, the disclosure is to be understood as not limited by the specific embodiments described herein, but only by the scope of the appended claims.

All references mentioned in this specification are herein incorporated in their entirety by reference into the specification, to the same extent as if each individual reference was specifically and individually indicated to be incorporated herein by reference. In addition, citation or identification of any reference in this application shall not be construed as an admission that such reference is available as prior art to the present application.

What is claimed is:

1. A folded camera, comprising:
   a) a lens that includes a lens element group G1, a lens element group G2 and a lens element group G3 along a lens optical axis;
   b) an image sensor;
   c) an optical path folding element (OPFE); and
   d) an actuator for moving G1 and G3 together relative to the image sensor in a direction parallel to the lens optical axis to bring the lens to two zoom states, wherein G1 and G3 are fixedly attached to each other, wherein G2 is floating between two stops, and wherein the movement of G1 and G3 together enables attachment of G2 to G1 in one zoom state and to G3 in another zoom state.

2. The camera of claim 1, wherein the fixed attachment between G1 and G3 is enabled by a plurality of rods connecting G1 and G3, and wherein G2 is guided by the plurality of rods and able to move along the direction parallel to the lens axis relative to the plurality of rods.

3. The camera of claim 1, wherein the attachment of G2 to G1 or G3 is by magnetic force.

4. The camera of claim 1, wherein the movement of G1 and G3 together is over a stroke larger than 2 mm and smaller than 20 mm, and wherein a stroke of the movement of G2 between the two stops is smaller than half of the stroke of G1 and G3.

5. The camera of claim 1, wherein the lens has an effective focal length EFL, wherein EFL is changed from a minimal value $EFL_{,min}$ in the first zoom state to a maximal value $EFL_{max}$ in the second zoom state and wherein a ratio $EFL_{max}/EFL_{,min}$ is >1.5.

6. The camera of claim 1, wherein the actuator includes a shape memory alloy (SMA) actuator having a plurality of SMA springs and a plurality of mechanical springs.

7. The camera of claim 6, wherein the plurality of SMA springs includes four springs and wherein the plurality of mechanical springs includes two springs.

8. The camera of claim 6, further comprising a voice coil motor (VCM) mechanism for focusing the lens.

9. The camera of claim 8, wherein the focusing of the lens is performed by moving G1+G2+G3 together.

10. The camera of claim 9, wherein the lens is included in a lens and sensor module that also includes a G2 stop mechanism with a first G2 stop and a second G2 stop, and wherein one of the first or second G2 stops is removable to allow movement of G1+G2+G3 to be over a large stroke of not less than 2 mm for Macro-photography.

11. The camera of claim 1, wherein the actuator includes at least three coils coupled to a plurality of respective magnets and or to magnet polarizations.

12. The camera of claim 11, wherein a position of the at least three coils relative to the magnets is measured by at least one Hall bar sensor for position sensing.

13. The camera of claim 12, wherein the at least three coils are driven by respective driving currents to provide movement relative to the magnets and wherein the driving currents depend on the position of the coils relative to the magnets.

14. A folded camera, comprising:
   a) a lens that includes a lens element group G1, a lens element group G2 and a lens element group G3 along a lens optical axis;
   b) an image sensor;
   c) an optical path folding element (OPFE); and
   d) a voice coil motor (VCM) mechanism for focusing the lens by moving G1+G2+G3 together in a direction parallel to the lens optical axis, and for moving G1 and G3 together relative to the image sensor for zoom in the direction parallel to the lens optical axis to bring the lens to two zoom states, wherein G1 and G3 are fixedly attached to each other, wherein G2 is floating between two stops, and wherein the movement of G1 and G3 together enables attachment of G2 to G1 in one zoom state and to G3 in another zoom state.

15. The camera of claim 14, further including a first G2 stop and a second G2 stop, and wherein one of the first or second G2 stops is removable to allow movement of G1+G2+G3 to be over a large stroke of not less than 2 mm for Macro-photography.

16. The camera of claim 14, wherein the VCM mechanism includes at least three coils coupled to a plurality of respective magnets and or to magnet polarizations.

17. The camera of claim 16, wherein a position of the at least three coils relative to the magnets is measured by at least two Hall bar sensors for position sensing.

18. The camera of claim 17, wherein the at least three coils are driven by respective driving currents to provide movement of the magnets relative to the coils and wherein the driving currents depend on the position of the coils relative to the magnets.

* * * * *